(12) United States Patent
Richards

(10) Patent No.: US 11,762,043 B2
(45) Date of Patent: Sep. 19, 2023

(54) HIGH RESOLUTION MAGNETIC FIELD SENSORS

(71) Applicant: Allegro MicroSystems, LLC, Manchester, NH (US)

(72) Inventor: Zachary Richards, Epsom, NH (US)

(73) Assignee: Allegro MicroSystems, LLC, Manchester, NH (US)

( * ) Notice: Subject to any disclaimer, the term of this patent is extended or adjusted under 35 U.S.C. 154(b) by 45 days.

(21) Appl. No.: 17/653,240

(22) Filed: Mar. 2, 2022

(65) Prior Publication Data

US 2022/0291304 A1 Sep. 15, 2022

Related U.S. Application Data

(60) Provisional application No. 63/159,530, filed on Mar. 11, 2021.

(51) Int. Cl.
*G01R 33/00* (2006.01)
*G01R 33/09* (2006.01)
*G01R 33/07* (2006.01)

(52) U.S. Cl.
CPC .......... *G01R 33/09* (2013.01); *G01R 33/072* (2013.01)

(58) Field of Classification Search
CPC .............................. G01R 33/09; G01R 33/072
See application file for complete search history.

(56) References Cited

U.S. PATENT DOCUMENTS

| | | | |
|---|---|---|---|
| 4,322,682 A | 3/1982 | Shadwill | |
| 5,329,692 A | 7/1994 | Kashiwagi | |
| 5,430,292 A | 7/1995 | Honjo et al. | |
| 5,506,510 A | 4/1996 | Blumenau | |
| 6,738,205 B1 * | 5/2004 | Moran | G11B 5/865 360/75 |
| 7,129,734 B2 | 10/2006 | Geiger et al. | |
| 7,219,563 B2 | 5/2007 | Saito | |
| 7,365,530 B2 | 4/2008 | Bailey et al. | |
| 7,592,801 B2 | 9/2009 | Bailey et al. | |
| 7,622,914 B2 | 11/2009 | Bailey et al. | |
| 7,772,838 B2 | 8/2010 | Bailey et al. | |
| 8,022,692 B2 | 9/2011 | Fernandez et al. | |
| 8,446,146 B2 | 5/2013 | Foletto et al. | |
| 8,450,996 B2 | 5/2013 | Foletto et al. | |

(Continued)

OTHER PUBLICATIONS

Allegro MicroSystems, LLC Datasheet; "ATS605LSG; Dual Output Differential Speed and Direction Sensor IC;" Rev.2; Jun. 15, 2017; 17 pages.

(Continued)

*Primary Examiner* — Alesa Allgood

(74) *Attorney, Agent, or Firm* — DALY CROWLEY MOFFORD & DURKEE, LLP

(57) ABSTRACT

Methods and apparatus for determining and transmitting speed and/or direction information for a rotating target by a magnetic field sensor. A reference channel signal is generated for a target from at least one magnetic field sensing element and a virtual channel signal in quadrature with the reference channel signal is generated. A tangent signal is generated. A slope of an arctangent of the tangent signal is determined, wherein the slope corresponds to rotational speed of the target. The speed and/or direction of the target can be transmitted by a sensor IC.

16 Claims, 29 Drawing Sheets

(56) References Cited

U.S. PATENT DOCUMENTS

| | | |
|---|---|---|
| 8,680,848 B2 | 3/2014 | Foletto et al. |
| 8,686,720 B2 | 4/2014 | Foletto et al. |
| 9,007,054 B2 | 4/2015 | Friedrich et al. |
| 9,170,128 B2 | 10/2015 | Foletto et al. |
| 9,175,981 B2 | 11/2015 | Foletto et al. |
| 9,182,456 B2 | 11/2015 | Shoemaker et al. |
| 9,329,057 B2 | 5/2016 | Foletto et al. |
| 9,417,295 B2 | 8/2016 | Friedrich et al. |
| 9,739,637 B2 | 8/2017 | Feucht et al. |
| 9,778,326 B2 | 10/2017 | Chen et al. |
| 9,970,996 B2 | 5/2018 | Fernandez et al. |
| 10,481,220 B2 | 11/2019 | Alpago et al. |
| 10,495,485 B2 | 12/2019 | Burdette et al. |
| 10,578,679 B2 | 3/2020 | Sitorus et al. |
| 10,598,739 B2 | 3/2020 | Shoemaker et al. |
| 10,866,118 B2 | 12/2020 | Foletto et al. |
| 10,908,229 B2 * | 2/2021 | Richards .............. G01R 33/072 |
| 2006/0076503 A1 | 4/2006 | Tsao |
| 2006/0273263 A1 | 12/2006 | Raymond et al. |
| 2014/0139218 A1 | 5/2014 | Findeklee et al. |
| 2014/0210472 A1 | 7/2014 | Homann et al. |
| 2014/0210475 A1 | 7/2014 | Li et al. |
| 2014/0253122 A1 | 9/2014 | Leussler et al. |
| 2016/0047858 A1 | 2/2016 | Goh et al. |
| 2016/0061883 A1 | 3/2016 | Engberg et al. |
| 2016/0377669 A1 | 12/2016 | Manipatruni et al. |
| 2017/0219662 A1 | 8/2017 | Prentice et al. |

OTHER PUBLICATIONS

Office Action dated Oct. 11, 2019 for U.S. Appl. No. 16/010,969; 8 pages.
Terminal Disclaimer dated Dec. 10, 2019 for U.S. Appl. No. 16/010,969; 2 pages.
Response to Office Action dated Dec. 11, 2019 for U.S. Appl. No. 16/010,969; 7 pages.
Notice of Allowance dated Jan. 8, 2020 for U.S. Appl. No. 16/010,969; 10 pages.
Office Action dated Oct. 11, 2019 for U.S. Appl. No. 16/290,017; 8 pages.
Terminal Disclaimer dated Dec. 10, 2019 for U.S. Appl. No. 16/290,017; 2 pages.
Response to Office Action dated Dec. 11, 2019 for U.S. Appl. No. 16/290,017, 11 pages.
Notice of Allowance dated Jan. 15, 2020 for U.S. Appl. No. 16/290,017; 10 pages.
Office Action dated Sep. 18, 2020 for U.S. Appl. No. 16/686,439; 9 pages.
Response to Office Action filed on Oct. 19, 2020 for U.S. Appl. No. 16/686,439; 9 pages.
Notice of Allowance dated Nov. 2, 2020 for U.S. Appl. No. 16/686,439, 10 pages.
Office Action dated Sep. 18, 2020 for U.S. Appl. No. 16/686,419; 9 pages.
Response to Office Action filed on Oct. 19, 2020 for U.S. Appl. No. 16/686,419; 9 pages.
U.S. Notice of Allowance dated Nov. 30, 2020 for U.S. Appl. No. 16/686,419; 9 Pages.

* cited by examiner

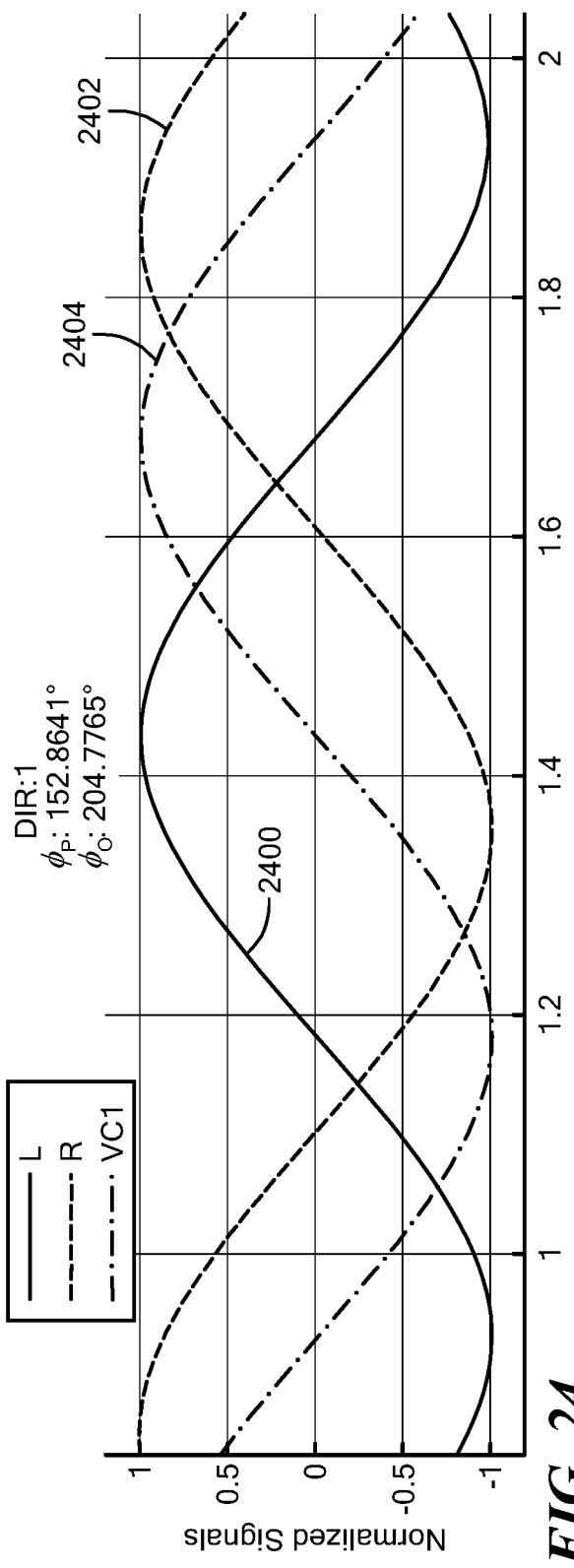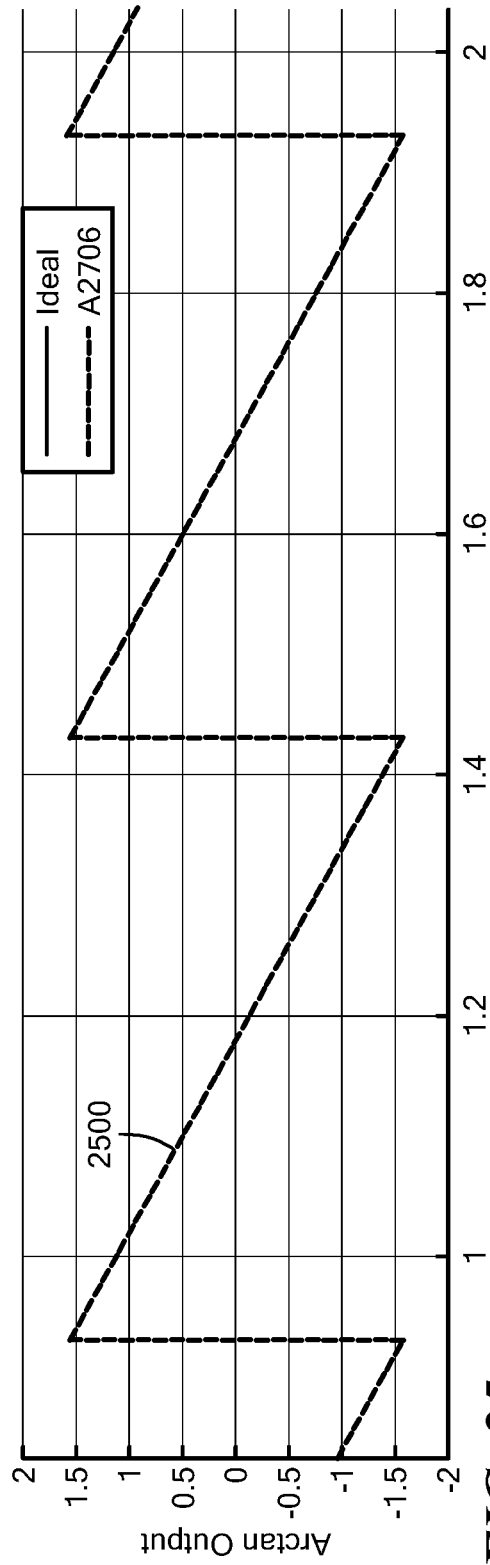
FIG. 24
FIG. 25 ured to determine
HIGH RESOLUTION MAGNETIC FIELD SENSORS

CROSS REFERENCE TO RELATED APPLICATIONS

The present application claims the benefit of U.S. Provisional Patent Application No. 63/159,530 filed on Mar. 11, 2021, which is incorporated herein by reference.

BACKGROUND

As is known, sensors are used in various types of devices to measure and monitor properties of systems in a wide variety of applications. For example, sensors have become common in products that rely on electronics in their operation, such as automotive and motor control systems.

Some sensors monitor properties by detecting a magnetic field associated with proximity or movement of a target object with respect to one or more magnetic field sensing elements. In magnetic field sensors including multiple magnetic field sensing elements, magnetic field signals from the sensing elements can be processed by separate processing channels to generate respective phase separated signals. One such magnetic field sensor is the Allegro MicroSystems, LLC ATS605LSG Dual Output Differential Speed and Direction Sensor IC, in which the output signal from each of the two processing channels is provided at a respective output pin of the sensor integrated circuit (IC). The channel output, or speed signals can be provided in the form of two-state binary signals having a frequency indicative of the speed of rotation of the target object. Additional output signals can include a direction signal indicative of a direction of rotation of a target object and/or an exclusive OR (XOR) speed signal that provides a signal resulting from an XOR logic operation based on the speed signals.

There are applications for which it is desirable that a magnetic field sensor provide a higher resolution of angular detection of the target object than can be accomplished with two speed signals or the XOR speed signal, for example to permit tighter control and better reactivity to change in position. While angular resolution can be increased by using additional sensors in different physical locations and/or by using more complex targets, these solutions can require more physical size for the sensor installation, higher costs for more sensing components, and/or more manufacturing complexity.

SUMMARY

In one aspect, a method comprises: generating a reference channel signal for a target from at least one magnetic field sensing element; generating a virtual channel signal in quadrature with the reference channel signal; generating a tangent signal from the virtual channel signal; determining a slope of an arctangent of the tangent signal, wherein the slope of the arctangent of the tangent signal corresponds to rotational speed of the target; and transmitting the speed of the target.

A method can further include one or more of the following features: determining whether rotation of the target is forward rotation or reverse rotation based on the slope of the arctangent of the tangent signal, determining the forward or reverse rotation of target comprises examining a sign of the slope of the arctangent of the tangent signal, determining whether vibration is present based on a number of sign changes over a selected amount of time in the slope of the arctangent of the tangent signal, transmitting information for the vibration, determining whether rotation of the target is forward rotation or reverse rotation based on the slope of the arctangent of the tangent signal and transmitting the direction of target rotation information, the slope of the arctangent corresponds to $2\pi f$, where f is a frequency that corresponds to a radial velocity of the target, and/or the target comprises a diameter and pole-pair count.

In another aspect, a sensor comprises: a plurality of magnetic field sensing elements configured to generate a reference channel signal for a target from at least one magnetic field sensing element; and a controller configured to: generate a virtual channel signal in quadrature with the reference channel signal; generate a tangent signal from the virtual channel signal; determine a slope of an arctangent of the tangent signal, wherein the slope of the arctangent of the tangent signal corresponds to rotational speed of the target; and transmit the speed of the target.

A sensor can further include one or more of the following features: the controller is further configured to determine whether rotation of the target is forward rotation or reverse rotation based on the slope of the arctangent of the tangent signal, determining the forward or reverse rotation of target comprises examining a sign of the slope of the arctangent of the tangent signal, the controller is further configured to determine whether vibration is present based on a number of sign changes over a selected amount of time in the slope of the arctangent of the tangent signal, the sensor is configured to transmit information for the vibration, the controller is further configured to determining whether rotation of the target is forward rotation or reverse rotation based on the slope of the arctangent of the tangent signal and transmitting the direction of target rotation information, the slope of the arctangent corresponds to $2\pi f$, where f is a frequency that corresponds to a radial velocity of the target, and/or the target comprises a diameter and pole-pair count.

In a further aspect, a sensor comprises: sensing means for generating a reference channel signal for a target from at least one magnetic field sensing element; and a processing means for generating a virtual channel signal in quadrature with the reference channel signal, generating a tangent signal from the virtual channel signal; and determining a slope of an arctangent of the tangent signal, wherein the slope of the arctangent of the tangent signal corresponds to rotational speed of the target, the processing means is configured for determining whether rotation of the target is forward rotation or reverse rotation based on the slope of the arctangent of the tangent signal, determining the forward or reverse rotation of target comprises examining a sign of the slope of the arctangent of the tangent signal, the processing means is configured for determining whether vibration is present based on a number of sign changes over a selected amount of time in the slope of the arctangent of the tangent signal, the sensor is configured for transmitting information for the vibration, the processing means is configured for determining whether rotation of the target is forward rotation or reverse rotation based on the slope of the arctangent of the tangent signal and transmitting the direction of target rotation information, the slope of the arctangent corresponds to $2\pi f$, where f is a frequency that corresponds to a radial velocity of the target, and/or the target comprises a diameter and pole-pair count.

BRIEF DESCRIPTION OF THE DRAWINGS

The foregoing features of the disclosure, as well as the disclosure itself may be more fully understood from the following detailed description of the drawings. The drawings aid in explaining and understanding the disclosed technology. Since it is often impractical or impossible to illustrate and describe every possible embodiment, the provided figures depict one or more exemplary embodiments. Accordingly, the figures are not intended to limit the scope of the invention. Like numbers in the figures denote like elements.

FIG. 24 shows example waveforms for a normalized signal for a left channel, a right channel, and a first virtual channel over pole period number for forward target rotation;

FIG. 25 shows an example arctan signal over pole-period number for the waveforms of FIG. 24;

DETAILED DESCRIPTION

Figure 1:
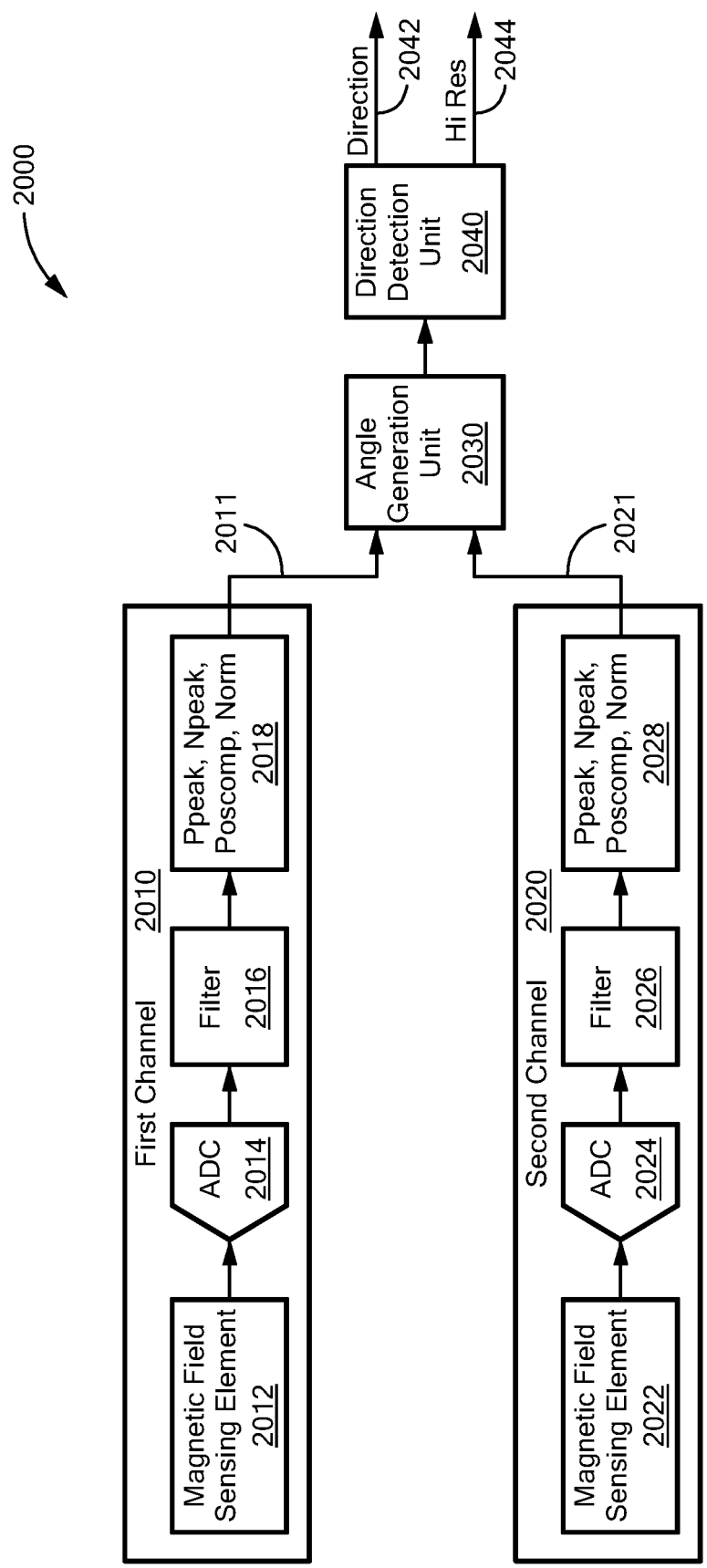
FIG. 1 shows a block diagram of a dual-channel magnetic field sensor using an arbitrary number of thresholds to provide output transitions representative of a speed and/or a direction of rotation of an object, according to the present disclosure.

Before describing the present invention, some introductory concepts and terminology are explained. As used herein, the term "rotation detector" is used to describe a circuit that includes at least one "magnetic field sensing element" which detects a magnetic field. The rotation detector can sense movement, e.g., rotation, of a ferromagnetic object, for example, advance and retreat of magnetic domains of a ring magnet or advance and retreat of gear teeth of a ferromagnetic gear. Similarly, the term "movement detector" can be used to describe either a rotation detector or a magnetic field sensor that can sense different movement, e.g., linear movement, of a ferromagnetic object, for example, linear movement of magnetic domains of a ring magnet or linear movement of gear teeth of a ferromagnetic gear.

As used herein, the term "magnetic field sensing element" is used to describe a variety of electronic elements that can sense a magnetic field. The magnetic field sensing element can be, but is not limited to, a Hall effect element, a magnetoresistance element, or a magnetotransistor. As is known, there are different types of Hall effect elements, for example, a planar Hall element, a vertical Hall element, and a Circular Vertical Hall (CVH) element. As is also known, there are different types of magnetoresistance elements, for example, a semiconductor magnetoresistance element such as Indium Antimonide (InSb), a giant magnetoresistance (GMR) element, for example, a spin valve, an anisotropic magnetoresistance element (AMR), a tunneling magnetoresistance (TMR) element, and a magnetic tunnel junction (MTJ). The magnetic field sensing element may be a single element or, alternatively, may include two or more magnetic field sensing elements arranged in various configurations, e.g., a half bridge or full (Wheatstone) bridge. Depending on the device type and other application requirements, the magnetic field sensing element may be a device made of a type IV semiconductor material such as Silicon (Si) or Germanium (Ge), or a type III-V semiconductor material like Gallium-Arsenide (GaAs) or an Indium compound, e.g., Indium-Antimonide (InSb).

As is known, some of the above-described magnetic field sensing elements tend to have an axis of maximum sensitivity parallel to a substrate that supports the magnetic field sensing element, and others of the above-described magnetic field sensing elements tend to have an axis of maximum sensitivity perpendicular to a substrate that supports the magnetic field sensing element. In particular, planar Hall elements tend to have axes of sensitivity perpendicular to a substrate, while metal based or metallic magnetoresistance elements (e.g., GMR, TMR, AMR) and vertical Hall elements tend to have axes of sensitivity parallel to a substrate.

As used herein, the term "magnetic field sensor" or simply "sensor" is used to describe a circuit that uses one or more magnetic field sensing elements, generally in combination with other circuits. The magnetic field sensor can be, for example, a rotation detector, a movement detector, a current sensor, or a proximity detector.

Magnetic field sensors are used in a variety of applications, including, but not limited to an angle sensor that senses an angle of a direction of a magnetic field, a current sensor that senses a magnetic field generated by a current carried by a current-carrying conductor, a magnetic switch that senses the proximity of a ferromagnetic object, a rotation detector (or movement detector) that senses passing ferromagnetic articles, for example, magnetic domains of a ring magnet or a ferromagnetic target (e.g., gear teeth) where the magnetic field sensor is used in combination with a back-bias or other magnet, and a magnetic field sensor that senses a magnetic field density of a magnetic field.

As used herein, the terms "processor" and "controller" are used to describe electronic circuitry that performs a function, an operation, or a sequence of operations. The function, operation, or sequence of operations can be hard coded into the electronic circuit or soft coded by way of instructions held in a memory device. The function, operation, or sequence of operations can be performed using digital values or using analog signals. In some embodiments, the processor or controller can be embodied in an application specific integrated circuit (ASIC), which can be an analog ASIC or a digital ASIC, in a microprocessor with associated program memory and/or in a discrete electronic circuit, which can be analog or digital. A processor or controller can contain internal processors or modules that perform portions of the function, operation, or sequence of operations. Similarly, a module can contain internal processors or internal modules that perform portions of the function, operation, or sequence of operations of the module.

While electronic circuits shown in figures herein may be shown in the form of analog blocks or digital blocks, it will be understood that the analog blocks can be replaced by digital blocks that perform the same or similar functions and the digital blocks can be replaced by analog blocks that perform the same or similar functions. Analog-to-digital or digital-to-analog conversions may not be explicitly shown in the figures but should be understood.

It should be understood that a so-called "comparator" can be comprised of an analog comparator having a two state output signal indicative of an input signal being above or below a threshold level (or indicative of one input signal being above or below another input signal). However, the comparator can also be comprised of a digital circuit having an output signal with at least two states indicative of an input signal being above or below a threshold level (or indicative of one input signal being above or below another input signal), respectively, or a digital value above or below a digital threshold value (or another digital value), respectively.

As used herein, the term "predetermined," when referring to a value or signal, is used to refer to a value or signal that is set, or fixed, in the factory at the time of manufacture, or by external means, e.g., programming, thereafter. As used herein, the term "determined," when referring to a value or signal, is used to refer to a value or signal that is identified by a circuit during operation, after manufacture.

Ferromagnetic objects described herein can have a variety of forms, including, but not limited to a ring magnet having one or more pole pair or a gear having two or more gear teeth. Ferromagnetic gears are used in some examples below to show a rotating ferromagnetic object having ferromagnetic features, i.e., teeth. However, in other embodiments, the gear can be replaced with a ring magnet having at least one pole pair. Also, linear arrangements of ferromagnetic objects that move linearly are possible.

FIG. 1 shows a block diagram of a dual-channel magnetic field sensor 2000 using an arbitrary number of angle signal thresholds to provide output transitions representative of a speed and/or a direction of rotation of an object, according to the present disclosure. The sensor 2000 may be the same as or substantially similar to the sensor 10 shown in FIG. 10, sensor 10' shown in FIG. 10A, sensor 100 shown in FIG. 10B, or sensor 170 shown in FIG. 10C, or may include some but not all of the components of the sensor 10, 10', 100, or 170, or may include additional features not shown in sensor 10, 10', 100, or 170.

The sensor 2000 includes a first channel 2010 and a second channel 2020 that provide respective outputs 2011, 2021 to an angle generation unit 2030, which is coupled to a direction detection unit 2040 that provides a direction output 2042 and a high resolution "Hi Res" output 2044.

The first channel 2010 includes a first magnetic field sensing element 2012 coupled to an analog-to-digital (ADC) 2014 that digitizes the analog magnetic field signal. The output of the ADC 2014 is provided to a filter 2016 which is coupled to a controller 2018 that determines (e.g., using detectors or other circuitry) the positive peak (ppeak) value, the negative peak (npeak) value, the poscomp value and the normalized value, all of which can be provided to the angle generation unit 2030. The magnetic field sensing element 2012 can be a Hall effect element, GMR, or other appropriate sensing element.

The second channel 2020 includes a second magnetic field sensing element 2022 coupled to an analog-to-digital (ADC) 2024 that digitizes the analog magnetic field signal. The output of the ADC 2024 is provided to a filter 2026 which is coupled to a controller 2028 that determines (e.g., using detectors or other circuitry) the positive peak (ppeak) value, the negative peak (npeak) value, the poscomp value and the normalized value, all of which can be provided to the angle generation unit 2030. The magnetic field sensing element 2022 can be a Hall effect element, GMR, or other appropriate sensing element. It will be appreciated that the second channel 2020 can be a so-called "real" second channel or can be one or more virtual channel(s) generated according to the techniques of the present disclosure, as described in greater detail hereinbelow. The poscomp value can represent samples of a signal generated by comparing the digitized magnetic field signal to a threshold (referred to herein as a poscomp threshold).

The angle generation unit 2030 is configured to generate an angle signal from the first and second magnetic field signals generated by the first and second magnetic field sensing elements 2012, 2022 or from a magnetic field signal as may be generated by the first magnetic field sensing element and a virtual signal as may be generated based on the first and second magnetic field signals generated by the first and second magnetic field sensing elements, respectively. This can be accomplished, for example, by calculating the arctangent of the magnetic field signals or by using a look-up table using values to determine the corresponding angle of the object.

The arctangent of the magnetic field signal divided by the other quadrature (real or virtual) magnetic field signal can be used to generate the angle signal. As will be appreciated in light of the present disclosure, the quotient of the two magnetic field signals (or one magnetic field signal and one virtual signal) at 90-degrees with respect to each other provides what can be referred to as the "virtual tangent", as illustrated according to Equations 1-11 below.

Since a virtual channel can be generated at any arbitrary phase over a wide range of targets provided that the specific target (and therefore its diameter and pole-pair count) is known, a virtual channel at −90° from the reference channel, L or CH1, can be generated as described in Equations 1 and 2, and as outlined hereinbelow regarding virtual channel signal generation techniques:

$$L = A_L \cdot \cos(2\pi ft) + O_L \quad \text{Equation 1}$$

$$VC_1 = A_1 \cdot \cos\left(2\pi ft - \frac{\pi}{2}\right) + O_1 \quad \text{Equation 2}$$

Note that the phase shift is negative as it will lag the reference channel for forward motion. Notice that $VC_1$ can be simplified trigonometrically as in Equation 3.

$$VC_1 = A_1 \cdot \sin(2\pi ft) + O_1 \quad \text{Equation 3}$$

Removing the offset (zeroing) and normalizing Equations 1 and 3 yields Equations 4 and 5.

$$X_0 = \frac{L - O_L}{A_L} = \cos(2\pi ft) \quad \text{Equation 4}$$

$$X_1 = \frac{VC_1 - O_1}{A_1} = \sin(2\pi ft) \quad \text{Equation 5}$$

Equations 4 and 5 provide two possible quotients as illustrated in Equations 6 and 7.

$$\frac{X_0}{X_1} = \frac{\cos(2\pi ft)}{\sin(2\pi ft)} = \frac{1}{\tan(2\pi ft)} \quad \text{Equation 6}$$

$$\frac{X_1}{X_0} = \frac{\sin(2\pi ft)}{\cos(2\pi ft)} = \tan(2\pi ft) \quad \text{Equation 7}$$

Equations 6 and 7 are ultimately related as follows in Equations 8 and 9.

$$-\tan\left(\theta + \frac{\pi}{2}\right) = -\left(\frac{\sin\left(\theta + \frac{\pi}{2}\right)}{\cos\left(\theta + \frac{\pi}{2}\right)}\right) = -\left(\frac{\cos(\theta)}{-\sin(\theta)}\right) = \frac{1}{\tan(\theta)} \quad \text{Equation 8}$$

$$-\tan\left(\theta - \frac{\pi}{2}\right) = -\left(\frac{\sin\left(\theta - \frac{\pi}{2}\right)}{\cos\left(\theta - \frac{\pi}{2}\right)}\right) = -\left(\frac{-\cos(\theta)}{\sin(\theta)}\right) = \frac{1}{\tan(\theta)} \quad \text{Equation 9}$$

As will be appreciated, a simple sign change and phase shift of ±90° will translate the two. In either case, then, the division of the normalized and zeroed reference channel and virtual channel will yield what can be called the "virtual tangent" of the target angle.

Having established the tangent of the target angle as described above, the target angle itself can be extracted by calculating (in real-time) the arctangent of it (see FIGS. 6-9, for example). Consider the arctangent of Equations 6 and 7 as resolved in Equations 10 and 11.

$$\arctan\left(\frac{X_1}{X_0}\right) = \arctan(\tan(2\pi ft)) = 2\pi ft \quad \text{Equation 10}$$

$$\arctan\left(\frac{X_0}{X_1}\right) = \arctan\left(\frac{1}{\tan(2\pi ft)}\right) = -2\pi ft \mp \frac{\pi}{2} \quad \text{Equation 11}$$

It is important to note that Equations 10 and 11 are more similar than might appear at first glance as the arctangent output exists on the wrapped interval $$\left[-\frac{\pi}{2}, \frac{\pi}{2}\right].$$

Figure 3:
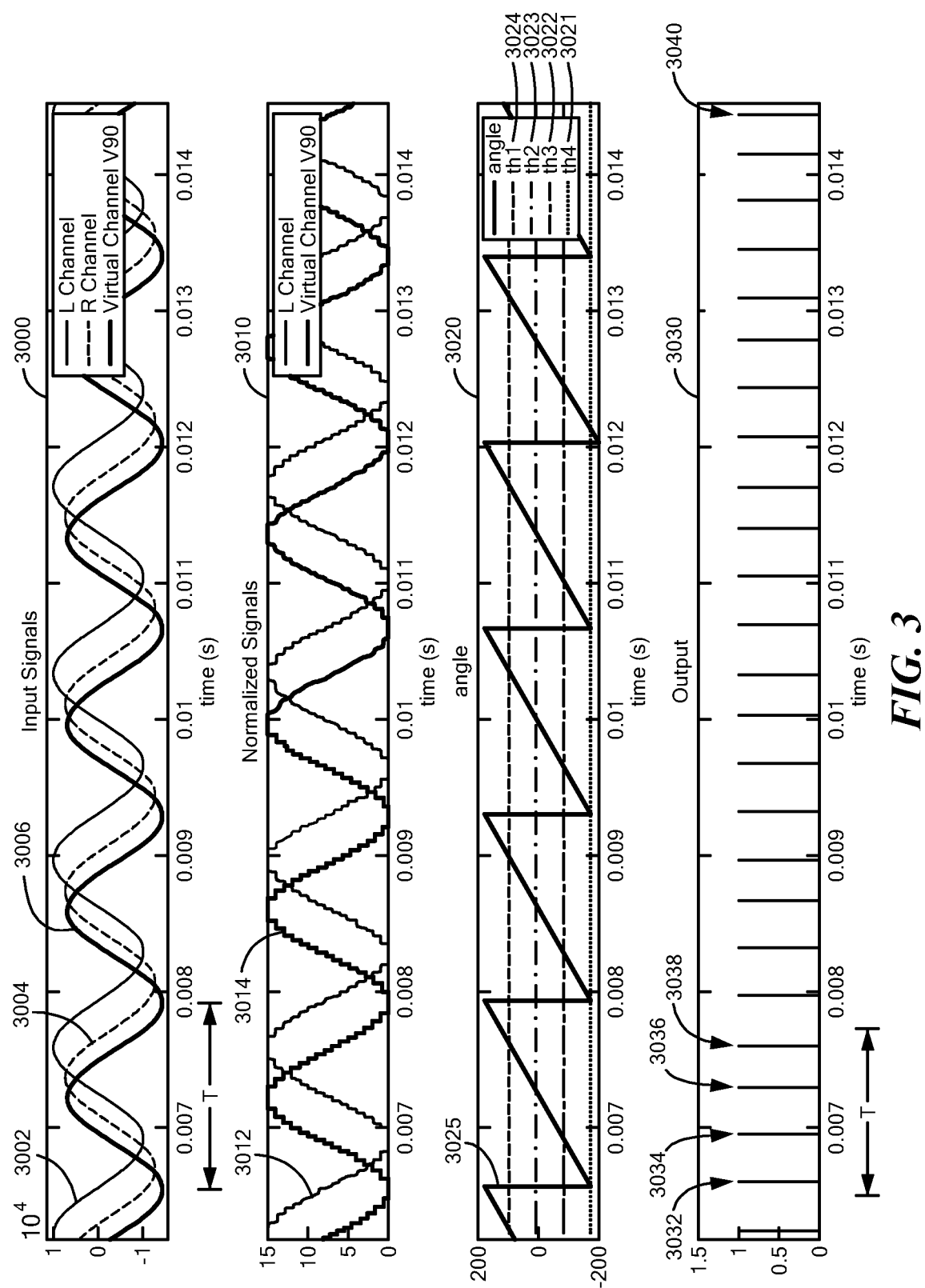
FIG. 3 shows a graph of example waveforms including input magnetic field signals, normalized signals, an angle signal, and associated output signals according to the present disclosure as may be generated by any of the sensors of FIG. 1-2 or 10-10C.

The angle generation unit 2030 can further be configured to compare the angle signal to one or more angle signal thresholds to generate a corresponding plurality of output transitions, as described in greater detail herein. Each output transition can be indicative of the angle signal crossing the corresponding angle signal threshold, and thus for each period of the magnetic field signal, multiple output transitions can be provided, improving the resolution and accuracy of the sensor. Refer, for example, to FIG. 3 showing an angle signal 3025 and four corresponding angle signal thresholds 3021, 3022, 3023, 3024.

The direction detection unit 2040 is configured to determine a direction of rotation of the object based on the angle signal generated by angle generation unit 2030. For example, the direction of rotation of the object can be determined based on a polarity of a slope of the angle signal. As another example, the direction of rotation can be determined using a plurality of comparators, where each magnetic field signal is compared to a poscomp threshold to generate a respective square wave signal, and the direction of rotation is determined by whether the first square wave signal leads or lags the second square wave signal.

Figure 2:
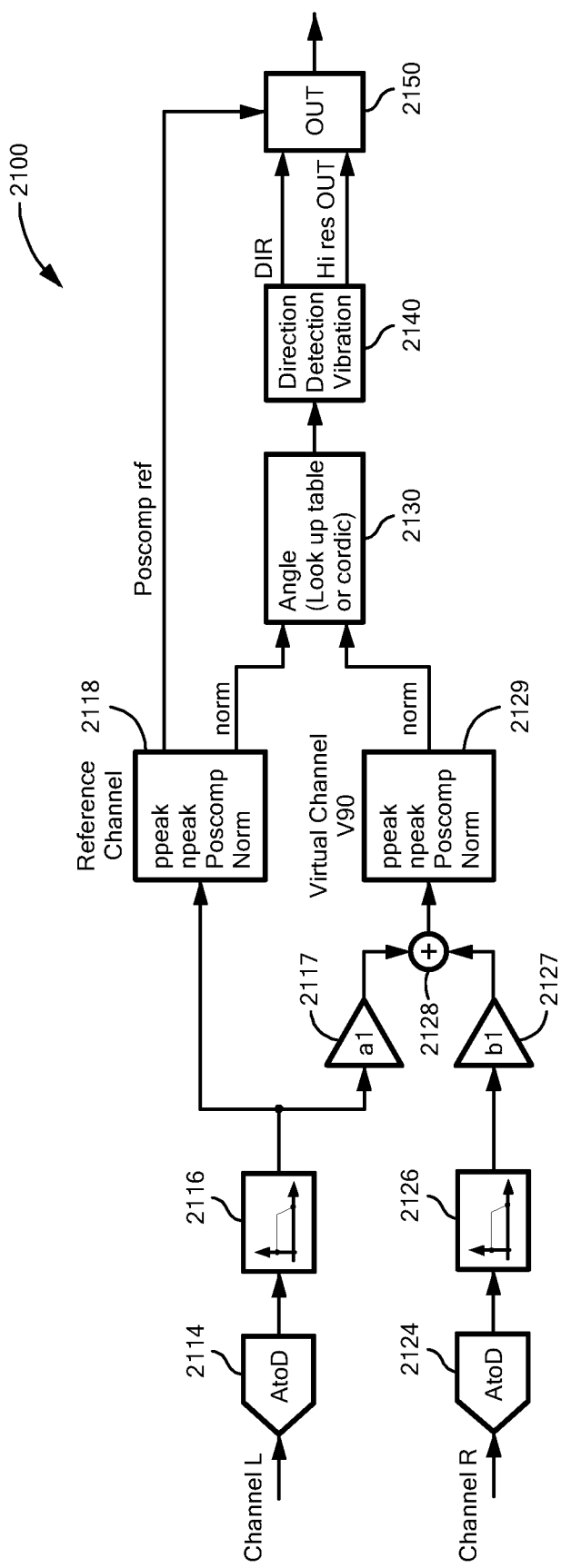
FIG. 2 shows a more detailed diagram of a dual-channel magnetic field sensor using an arbitrary number of thresholds, according to the present disclosure.

FIG. 2 shows a more detailed diagram of a dual-channel magnetic field sensor 2100 using an arbitrary number of switchpoints, according to the present disclosure. The sensor 2100 includes a first ADC 2114 that receives a magnetic field signal from a first (left, "L") channel, which is filtered by filter 2116 and provided to an amplifier 2117 so that it can be used to generate a virtual channel. The output of the filter 2116 is also provided to the reference channel controller 2118 which may include a plurality of detectors for detecting the ppeak and npeak values, as well as processors or processing circuitry to determine the poscomp and norm values. The sensor 2100 also includes a second ADC 2124 that receives a magnetic field signal from a second (right, "R") channel, which is filtered by filter 2126 and provided to an amplifier 2127 so that it can be combined with the output of the amplifier 2117 at combiner 2128 and provided to virtual channel controller 2129. The controller 2129 may include a plurality of detectors for detecting the ppeak and npeak values, as well as processors or processing circuitry to determine the poscomp and norm values. The output of amplifier 2117 and amplifier 2127 can be combined by combiner 2128 according to any of the appropriate techniques disclosed herein for generating virtual magnetic field signals. For example, refer to Equations 49 and 50 hereinbelow which may be used to determine coefficients that are used in generating the virtual channels. By calculating and solving for the coefficients in Equations 49 and 50, any number of arbitrary virtual signals can be generated in accordance with the present disclosure. Thus, the virtual channel, rather than or in addition to, the real reference channel can be used to determine the speed and/or direction of rotation of the object.

The normalized ("norm") values from the reference channel controller 2118 and the virtual channel controller 2129 can be provided to the angle generation unit 2130 to determine the angle of the object proximate the sensor 2100. The angle can be determined, for example, using a CORDIC processor to compute the arctangent or a look-up table. The angle signal can be provided to the direction detection unit 2140 to determine the direction of rotation and, in some cases, any vibration of the object. The direction "DIR" and high-resolution output "Hi res OUT" are provided to an output controller 2150, which may combine the information with poscomp ref from the reference channel 2118.

It will be appreciated that although a virtual channel that is at the desired predetermined phase difference (e.g., quadrature at 90-degrees) with respect to the real, reference channel may be used as illustrated, if the magnetic field signals from the L and R channels are (or are close to) 90-degrees phase separated with respect to each other, the virtual channel could be eliminated and the real L and R channels could be used to perform the angle signal processing techniques according to the present disclosure. It will likewise be appreciated that although only one virtual channel is shown in FIG. 2, any number of virtual channels can be implemented to further enhance the accuracy of the system, particularly when combined with the multiple angle signal thresholds applied to the angle signal, to provide a still further improved accuracy of the system.

Although FIG. 2 illustrates one particular technique for generating a virtual signal that is quadrature, or substantially 90-degrees, with respect to the real, reference signal, other techniques may be implemented to generate two magnetic field signals that are substantially in quadrature with respect to each other. As such, two signals could be used to generate the angle signal which can have a single threshold or multiple thresholds applied thereto in order to provide output transitions according to the present disclosure.

FIG. 3 shows example waveforms including input magnetic field signals in graph 3000, normalized signals in graph 3010, an angle signal in graph 3020, and associated output signal transitions in graph 3030 according to the present disclosure as may be generated by any of the sensors of FIG. 1-2 or 10-10C. In particular, graph 3000 shows magnetic field signals from the first or "left" channel 3002, the second or "right" channel 3004, and the virtual channel signal 3006, which is at 90-degrees with respect to the first channel. These input signals 3002, 3004 may be the signals generated by magnetic field sensing elements 2012, 2022 in FIG. 1 for example. The virtual channel signal 3006 can be generated from magnetic field signal 3002 and/or magnetic field signal 3004, according to any of the various virtual channel signal generation techniques disclosed herein.

Graph 3010 shows normalized signals with signal 3012 being a normalized version of the left channel signal 3002 and signal 3014 being a normalized version of the virtual channel signal 3006. The normalized signals shown in graph 3010 may correspond to the output of the controller for each channel, such as controller 2018, 2028 in FIG. 1, or the output of controllers 2118, 2129 in FIG. 2. The normalized signals can be made to have the same amplitude as each other or both can be made equal to some other predetermined value.

Graph 3020 shows the angle signal 3025 that is generated from the normalized signals 3012, 3014. The angle signal 3025 can be generated by computing the arctangent of the signals 3012, 3014 or with a look-up table. The arctangent of the signals can be determined according to a standard CORDIC processing or according to arctangent calculator disclosed herein (refer, for example, to FIGS. 6-9). In this example, there are four thresholds, including first threshold 3021, second threshold 3022, third threshold 3023, and fourth threshold 3024 which are applied to the angle signal 3025. Note that by applying a plurality of thresholds to the angle signal (which may be an arbitrary number of thresholds), a greater number of output transitions can be provided for each period ("T") of the incoming magnetic field signal. For example, applying four thresholds results in four output pulses 3032, 3034, 3036, and 3038 during a single period T of the magnetic field signal as shown. Applying a greater number of thresholds to the angle signal 3025 allows for a greater number of output pulses to be generated during a single period, thereby increasing the resolution and accuracy of the system without significantly increasing the complexity of the system. Note that FIG. 5 shows example graphs with 1, 2, 3, 4, or 5 thresholds applied, while FIG. 4 illustrates a method used to arrive at either the waveform 3030 in FIG. 3 or waveform 5030 in FIG. 5.

Graph 3030 shows the output signal as a plurality of output transitions 3032 through to 3040. Note that an output pulse is provided each time that the angle signal 3025 crosses an angle signal threshold, with the output pulse 3032 corresponding to the angle signal 3025 crossing the first threshold 3021, the output pulse 3034 corresponding to the angle signal 3025 crossing the second threshold 3022, the output pulse 3036 corresponding to the angle signal 3025 crossing the third threshold 3023, and the output pulse 3038 corresponding to the angle signal 3025 crossing the fourth threshold 3024. As such, a greater number of pulses is output by applying multiple thresholds to the angle signal. Due to the angle signal 3025 being saw-toothed in shape, it lends itself to allowing multiple thresholds to be applied, or a single threshold at a precise location, for example as discussed in connection with FIG. 5.

Figure 4:
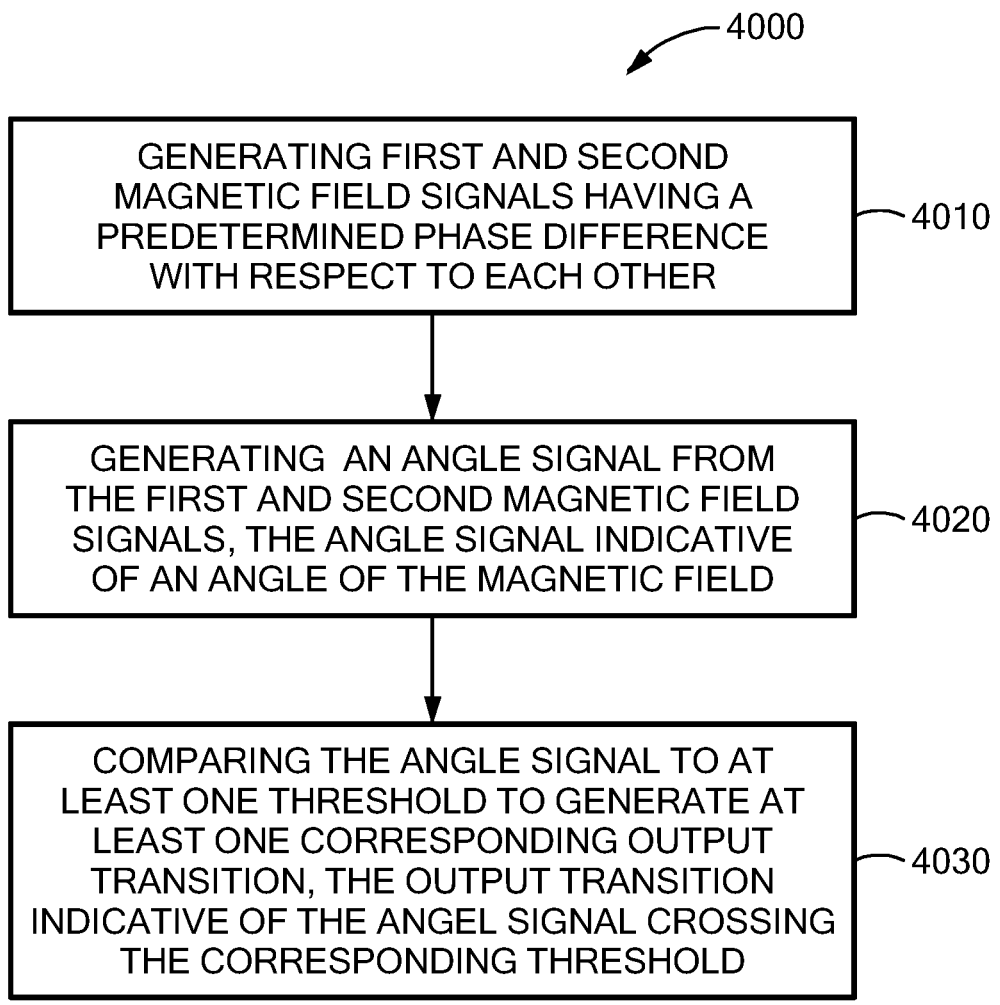
FIG. 4 is a flow diagram illustrating a method of generating at least one output transition from an angle signal, according to the present disclosure.
Figure 5:
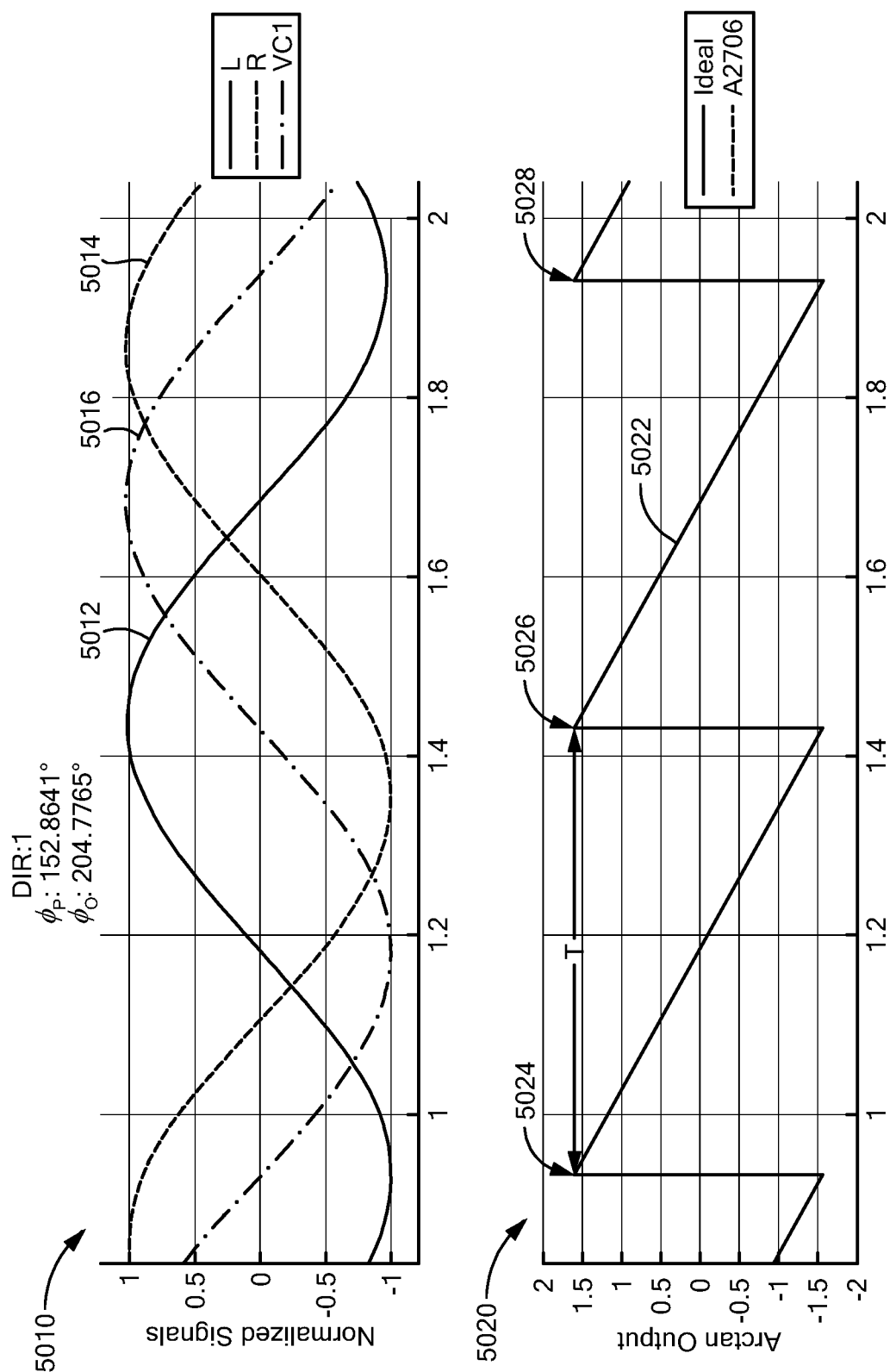
FIG. 5 is a graph of example waveforms including input magnetic field signals, an angle signal, and various associated output signals generated by angle signal thresholds placed dependent upon a desired number of output commutations per pole-pair of the magnetic field signals, according to the present disclosure as may be generated by any of the sensors of FIG. 1, 2, or 10-10C.
Figure 5:
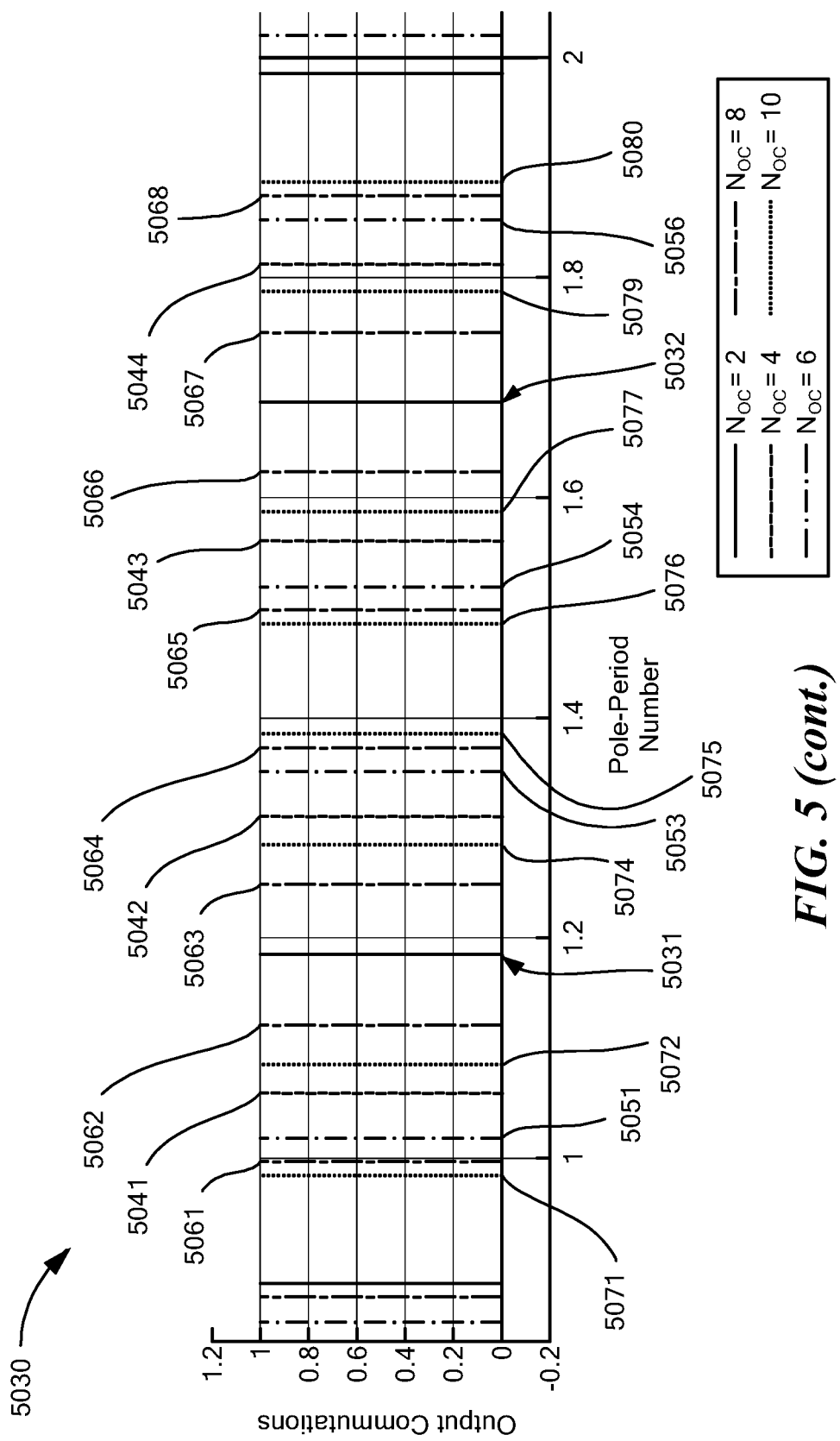

FIG. 4 is a flow diagram illustrating a method 4000 of generating a plurality of output transitions from applying a threshold to an angle signal. At least one threshold, up to any arbitrary number of thresholds, can be applied to the angle signal to achieve output commutations as desired, according to the present disclosure. The method 4000 starts at 4010 by generating first and second magnetic field signals having a predetermined phase difference with respect to each other. These magnetic field signals may be real, measured magnetic field signals or may be virtual magnetic field signals generated according to any of the various virtual magnetic field signal generation techniques disclosed herein (refer, for example, to FIGS. 10-23 showing various systems and methods for generating virtual magnetic field signals). The first and second magnetic field signals are indicative of a magnetic field affected by an object. The first and second magnetic field signals may have a first predetermined phase difference with respect to each other. The first and second magnetic field signals may be generated as virtual magnetic field signals having a second predetermined phase difference with respect to each other, which may be 90-degrees for example. The virtual magnetic field signals may be generated according to a mathematical function that characterizes a relationship between the second predetermined phase difference between the virtual magnetic field signals and the two measured magnetic field signals. Refer, for example, to equations 39-50 showing various mathematical functions that can be used to generate virtual magnetic field signals. The mathematical function used to generate the virtual magnetic field signal(s) can be based on a cosine of the second predetermined phase difference between the virtual magnetic field signals and a sine of the second predetermined phase difference between the virtual magnetic field signals (see. e.g., Equation 39 or Equations 49-50).

At block 4020, an angle signal is generated from the first and second magnetic field signals (which may be virtual magnetic field signals), the angle signal indicative of an angle of the magnetic field. Refer, for example, to graph 3020 in FIG. 3 showing angle signal 3025.

At block 4030, the angle signal is compared to at least one threshold to generate a corresponding at least one output transition. Each output transition is indicative of the angle signal crossing a corresponding threshold. Refer, for example, to graph 3030 in FIG. 3 showing angle signal 3025 having a plurality of thresholds 3021, 3022, 3023, 3024 and an output signal is shown in graph 3040 having a plurality of output transitions 3032 through to 3040.

According to an angle signal threshold placement technique, in some applications, it may be desirable to precisely locate the position of the angle signal threshold(s), which for example may depend upon a desired number of output transitions (or "output commutations" as interchangeably referred to herein). The desired number of output commutations can be predetermined in some implementations, where a desired number of output commutations per pole-pair of the magnetic field signal is determined prior to processing the magnetic field signals, or the desired number of output commutations can be determined after the magnetic field signals have been acquired and processed, as will be appreciated.

FIG. 5 shows example waveforms including input magnetic field signals in graph 5010, an angle signal in graph 5020, and associated output signal transitions in graph 5030 according to the present disclosure as may be generated by any of the sensors of FIG. 1-2 or 10-10C. In particular, graph 5010 shows magnetic field signals from the first or "left" channel 5012, the second or "right" channel 5014, and the virtual channel signal 5016, which is at 90-degrees with respect to the first channel. These input signals 5012, 5014 may be the signals generated by magnetic field sensing elements 2012, 2022 in FIG. 1 for example. The virtual channel signal 5016 can be generated from magnetic field signal 5012 and/or magnetic field signal 5014, according to any of the various virtual channel signal generation techniques disclosed herein.

Graph 5020 shows the angle signal 5022 generated from the magnetic field signals 5012, 5014. The angle signal 5022 can be generated by computing the arctangent of the signals 5012, 5014 or with a look-up table. The arctangent of the signals can be determined according to a standard CORDIC processing or according to arctangent calculator disclosed herein (refer, for example, to FIGS. 6-9).

Graph 5030 shows the output signal as a plurality of output transitions, or commutations. Note that an output pulse is provided each time that the angle signal 5022 crosses an angle signal threshold with the number of thresholds and placement of the threshold(s) depending upon a desired number of output commutations per pole-pair of the magnetic field signal. Due to the angle signal 5022 being saw-toothed in shape, it lends itself to allowing multiple thresholds to be applied to the angle signal 5022, as may be positioned at precise locations.

Note that the angle signal 5022 has wrapping points 5024, 5026, and 5028 at the beginning and/or end of each period T of the angle signal. It may be desirable to position the angle signal threshold(s) at some buffer distance from the wrapping points in order to prevent output commutations near the wrapping points. Thus, a buffer region around the wrapping points of the angle signal can be maintained where no switching occurs (i.e., where no thresholds are placed). The position of the angle signal threshold(s) can take into account various factors alone or in combination, including (1) the threshold(s) being equidistant and (2) the distance from any threshold(s) to a wrapping point of the angle signal being maximized. Further, the number of output commutations per pole-pair, $N_{OC}$ as referred to herein, should be an even integer due to the natural arctangent wrapping of the angle signal. Each pole-pair of the angle signal, as will be appreciated, comprises two consecutive poles (e.g., a pole-pair) of the rotating object, or two periods of the angle signal (with one period "T" as shown).

As described herein, with reference to Equations 10 and 11 copied below, the angle itself can be extracted by calculating the arctangent of the tangent, which is $$\frac{X_0}{X_1} \text{ or } \frac{X_1}{X_0},$$

the first, real channel divided by the second, virtual channel, or vice versa, where $X_0$ and $X_1$ are the normalized and zeroed (zero meaned) versions of the real and virtual channels. As noted herein, the arctangent output exists in the wrapped interval $$\left[-\frac{\pi}{2}, \frac{\pi}{2}\right].$$

Thus, it is desirable to ensure a buffer region at $$\left[-\frac{\pi}{2}, \frac{\pi}{2}\right],$$

and multiples thereof. Given these constraints, the optimal threshold values, T, are defined in Equations 12 and 13 below.

$$k = \frac{N_{OC}}{2} - 1, N_{OC} = 2, 4, 6, \ldots \quad \text{Equation 12}$$

$$T(N_{OC}) = \left(\frac{\pi}{N_{OC}}\right) \cdot \{\tau_0 \ldots \tau_k\}, \tau_i = 2 \cdot i - k \quad \text{Equation 13}$$

where τ is the threshold number, k is the total number of thresholds, $N_{OC}$ is the desired number of output transitions per pole-pair, and T is the value of each threshold number that is to be applied to the angle signal. For example, if the desired number of output transitions per pole-pair of the angle signal is 2, then k will be 2/2−1=0. Thus, there will be only one threshold, with $\tau_0$ being 2·0−0=0 and the threshold value T will be $$\left(\frac{\pi}{2}\right) \cdot \{0\} = 0.$$

Thus, for two output transitions per pole-pair, there will be one threshold applied to the angle signal at zero, as shown in FIG. 5 and further articulated in the following equations.

Equations 12 and 13 can be used to derive several example terms for determining placement of the angle signal thresholds as demonstrated in Equations 14-18.

$$T(2) = \left(\frac{\pi}{2}\right) \cdot \{0\} = 0 \quad \text{Equation 14}$$

$$T(4) = \left(\frac{\pi}{4}\right) \cdot \{-1, 1\} \quad \text{Equation 15}$$

$$T(6) = \left(\frac{\pi}{6}\right) \cdot \{-2, 0, 2\} \quad \text{Equation 16}$$

$$T(8) = \left(\frac{\pi}{8}\right) \cdot \{-3, -1, 1, 3\} \quad \text{Equation 17}$$

$$T(10) = \left(\frac{\pi}{10}\right) \cdot \{-4, -2, 0, 2, 4\} \quad \text{Equation 18}$$

As shown in FIG. 5 and with reference to the Equations above, in Equation 14, when the desired number of output commutations ($N_{OC}$) is equal to two (2), using Equation 12, k will be 0 (2/2−1=0). Thus, there will be one threshold for $\tau_0$=0 (2×0−0). The threshold for $\tau_0$ which using equation 13 provides T (2)=2×0−0=0. Thus, when $N_{OC}$ equals two (2), one threshold is applied at zero, which results in two output commutations (at 5031 and 5032).

Likewise, Equation 15 represents 4 output commutations ($N_{OC}$). As such, k will be 1 (4/2−1=1). Thus, there will be two thresholds, with $\tau_0$ being −1 and $\tau_1$ being 1. As such, the thresholds for Equation 15 are provided at $$-\frac{\pi}{4} \text{ and } \frac{\pi}{4},$$

which results in four output commutations at 5041, 5042, 5043, and 5044.

Equation 16 represents six (6) output commutations ($N_{OC}$). As such, k will be 2 (6/2−1=2). Thus, there will be three (3) thresholds, with $\tau_0$ being −2, $\tau_1$ being 0, and $\tau_2$ being 2. As such, the thresholds for Equation 16 are provided at $$-\frac{\pi}{3}, 0, \text{ and } \frac{\pi}{3},$$

resulting in six total output commutations at 5051, 5031, 5053, 5054, 5032, and 5056.

Equation 17 represents eight (8) output commutations ($N_{OC}$). As such, k will be 3 (8/2−1=3). Thus, there will be four (4) thresholds, with $\tau_0$ being −3, $\tau_1$ being −1, $\tau_2$ being 1, $\tau_3$ being 3. As such, the thresholds for Equation 17 are provided at $$-\frac{3\pi}{8}, -\frac{\pi}{8}, 0, \frac{\pi}{8}, \text{ and } \frac{3\pi}{8},$$

which results in eight output commutations at 5061, 5062, 5063, 5064, 5065, 5066, 5067, and 5068.

Equation 18 represents ten (10) output commutations ($N_{OC}$). As such, k will be 4 (10/2−1=4). Thus, there will be five thresholds, with $\tau_0$ being −4, $\tau_1$ being −2, $\tau_2$ being 0, $\tau_3$ being 2, and $\tau_4$ being 4, As such, the thresholds for Equation 18 are provided at $$-\frac{2\pi}{5}, -\frac{\pi}{5}, 0, \frac{\pi}{5}, \text{ and } \frac{2\pi}{5},$$

which results in ten output commutations at 5071, 5072, 5031, 5074, 5075, 5076, 5077, 5032, 5079, and 5080.

Note that in each case the output equidistance is accurate to the order of hundredths of a percent of the input frequency period.

Standard CORDIC processing can be used to generate the angle signal from the magnetic field signals, or a unique arctangent calculator, for example as disclosed in FIGS. 6-9, according to the present disclosure. Note that although the arctangent calculation system disclosed herein is primarily in relation to magnetic field signals, however it will be appreciated that the arctangent calculation system and method can be applicable to any time-varying input signal to determine the arctangent thereof.

It is often desirable to calculate the arctangent of some real, time varying function, f(t):

$$y = \arctan(f(t)) \quad \text{Equation 19}$$

While this function is well defined trigonometrically, calculating it accurately over an arbitrary input range can be challenging. Its origin counterpart, tangent, ranges from negative to positive infinity for finite inputs. Calculating the arctangent can be slow and computationally intensive when approached as a series approximation. However, an alternative approach is available, outlined in equations 20-26. The following substitution enables working outside of the time domain, briefly:

$$x = f(t) \quad \text{Equation 20}$$

Substituting equation 20 into equation 19 and expanding it as an integral-derivative pair in x yields Equation 21:

$$y = \arctan(x) = \int \left(\frac{d}{dx}\arctan(x)\right)dx \quad \text{Equation 21}$$

The derivative portion of Equation 21 is well defined in Equation 22:

$$\frac{d}{dx}\arctan(x) = \frac{1}{1+x^2} \quad \text{Equation 22}$$

Substituting Equation 22 into Equation 21 yields Equation 23:

$$y = \arctan(x) = \int \left(\frac{1}{1+x^2}\right)dx \quad \text{Equation 23}$$

In order to move Equation 23 back into the time domain, it is necessary first to define dx in this domain. This can be readily accomplished by taking the time derivative of Equation 23 and rearranging terms as illustrated in Equations 24 and 25.

$$\frac{dx}{dt} = \frac{d}{dt}f(t) = f'(t) \quad \text{Equation 24}$$

$$dx = f'(t)dt \quad \text{Equation 25}$$

Thus, an ultimately tractable form of the arctangent function is derived in Equation 26, and the angle signal can be calculated according to a mathematical function that integrates a time derivative of the angle signal, for example as shown:

$$y = \arctan(f(t)) = \int \frac{f'(t)}{1+f^2(t)} dt \quad \text{Equation 26}$$

Figure 6:
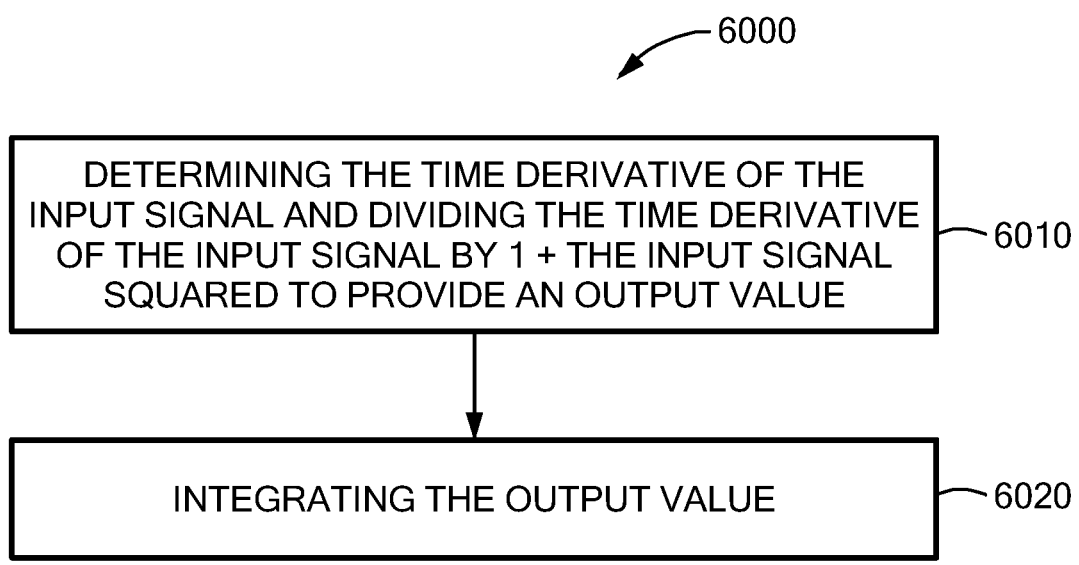
FIG. 6 is a flow diagram illustrating a method of implementing an arctangent calculator according to the present disclosure.

Reference is made to FIG. 6 showing a method of implementing an arctangent calculator according to the present disclosure, according to Equation 26. At block 610, the time derivative of the input signal is divided by one plus the input signal squared to provide an output value $$\left(\frac{f'(t)}{1+f^2(t)}\right).$$

At block 612, the output value is integrated as shown in Equation 26.

Thus, Equation 26 utilizes both time differentiation and integration. Differentiation in time and its real time discrete implementation are described in Equations 27 and 28, respectively:

$$y = \frac{dx}{dt} \quad \text{Equation 27}$$

$$Y[n] = \frac{X[n] - X[n-1]}{t_s} \quad \text{Equation 28}$$

where $t_s$ is the system sample time. Further, integration in time and its real time discrete implementation by forward Euler (see FIG. 7), backward Euler (see FIG. 8), or trapezoidal (see FIG. 9) methods are described in Equations 29 through 32, respectively:

$$y = \int x \, dt \quad \text{Equation 29}$$

$$Y[n] = Y[n-1] + t_s X[n-1] \quad \text{Equation 30}$$

$$Y[n] = Y[n-1] + t_s X[n] \quad \text{Equation 31}$$

$$Y[n] = Y[n-1] + \frac{t_s}{2}(X[n] + X[n-1]) \quad \text{Equation 32}$$

Figure 7:
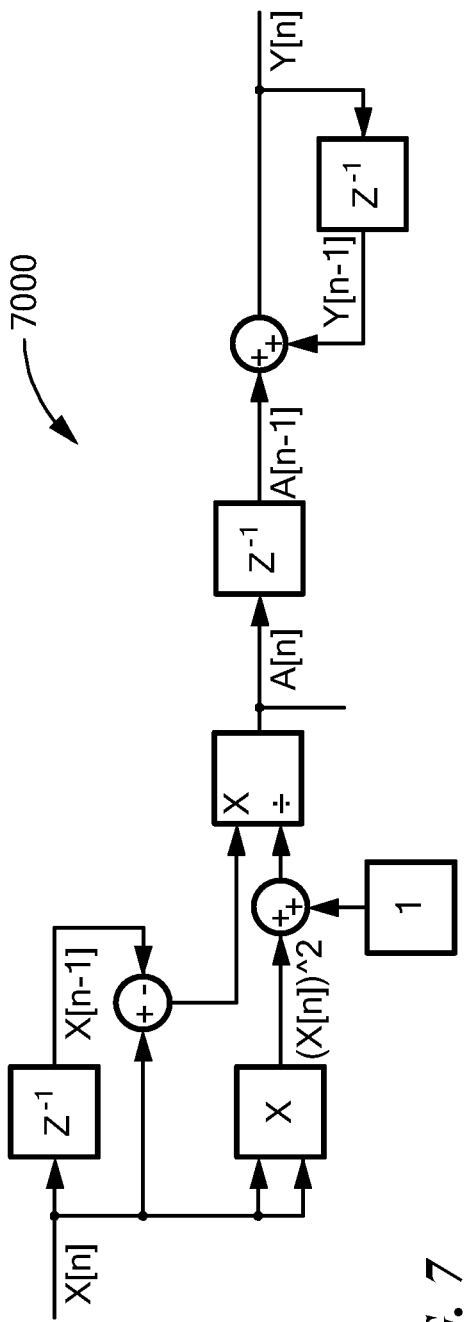
FIG. 7 is a block diagram illustrating an arctangent calculation system implementing a forward Euler integrator, according to the present disclosure.

FIG. 7 is a block diagram illustrating an arctangent calculation system implementing a forward Euler integrator, according to the present disclosure, corresponding to Equation 30.

Figure 8:
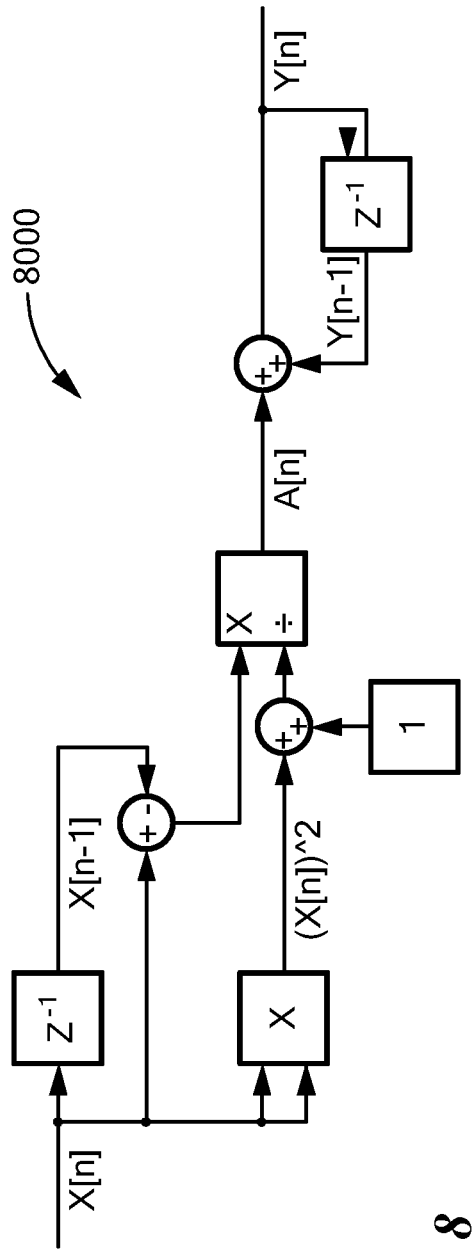
FIG. 8 is a block diagram illustrating an arctangent calculation system implementing a backward Euler integrator, according to the present disclosure.

FIG. 8 is a block diagram illustrating an arctangent calculation system implementing a backward Euler integrator, according to the present disclosure, corresponding to Equation 31.

Figure 9:
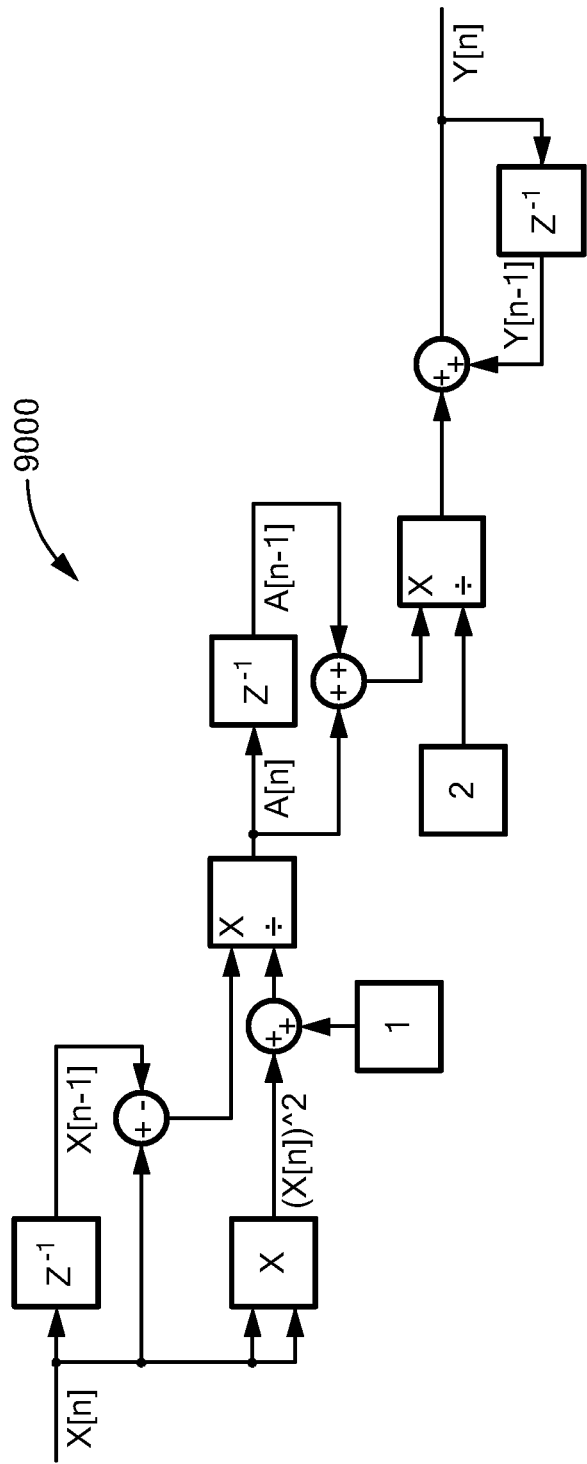
FIG. 9 is a block diagram illustrating an arctangent calculation system implementing a trapezoidal integrator, according to the present disclosure.

FIG. 9 is a block diagram illustrating an arctangent calculation system implementing a trapezoidal integrator, according to the present disclosure, corresponding to Equation 32.

Selecting the most complicated case as an example, the trapezoidal case as shown in FIG. 9, Equation 26 (duplicated below) can be implemented in discrete time as follows in Equations 33 and 34:

$$y = \arctan(f(t)) = \int \frac{f'(t)}{1+f^2(t)} dt \quad \text{Equation 26}$$

$$Y[n] = Y[n-1] + \frac{t_s}{2}\left(\frac{F[n]-F[n-1]}{t_s \cdot (1+F[n]^2)} + \frac{F[n-1]-F[n-2]}{t_s \cdot (1+F[n-1]^2)}\right) \quad \text{Equation 33}$$

$$Y[n] = Y[n-1] + \frac{1}{2}\left(\frac{F[n]-F[n-1]}{1+F[n]^2} + \frac{F[n-1]-F[n-2]}{1+F[n-1]^2}\right) \quad \text{Equation 34}$$

Notice that the requirement of including system sample time ($t_s$) cancels itself out by simultaneously handling the discrete time differentiation and integration. Equation 35 below is a convenient substitution which simplifies the actual final implementation of this method for all integrator methods:

$$A[n] = \frac{F[n] - F[n-1]}{1 + F[n]^2} \quad \text{Equation 35}$$

Thus, the final implementation for forward Euler, backward Euler, and trapezoidal methods are described in Equations 36 through 38, respectively:

$$Y[n] = Y[n-1] + A[n-1] \quad \text{Equation 36}$$

$$Y[n] = Y[n-1] + A[n] \quad \text{Equation 37}$$

$$Y[n] = Y[n-1] + \tfrac{1}{2}(A[n] + A[n-1]) \quad \text{Equation 38}$$

Where Equation 36 shows the forward Euler implementation as shown in FIG. 7, Equation 37 shows the backward Euler implementation as shown in FIG. 8, and Equation 38 shows the trapezoidal implementation as shown in FIG. 9.

The arctangent calculation system described herein can be implemented by calculating real (measured) magnetic field signals, using one magnetic field signal and one or more virtual channel signals, or two or more virtual channel signals. The virtual channel signals may be generated according to any of the various virtual channel signal generation techniques disclosed herein.

Although the dynamic output behavior of the arctangent calculator is correct, there may be some absolute error unless the integrator is initialized to the correct value. This error could be minimized by initializing to an approximation (some of which are relatively simple to compute assuming the input meets certain conditions) or initializing to zero (the exact midrange value of arctangent function which exists on the $$\left[-\frac{\pi}{2}, \frac{\pi}{2}\right]$$

interval).

Furthermore, during run time, any initial or accumulated error can be reset to zero by enforcing known state values as follows, as is necessary to enforce the wrapping behavior of arctangent over the $$\left[-\frac{\pi}{2}, \frac{\pi}{2}\right]$$

interval:

$$Y[n] = -\frac{\pi}{2} \text{ for } F[n] \text{ at negative limit}$$

$$Y[n] = 0 \text{ for } F[n] = 0 \text{ (or zero crossing)}$$

$$Y[n] = \frac{\pi}{2} \text{ for } F[n] \text{ at positive limit}$$

Figure 20:
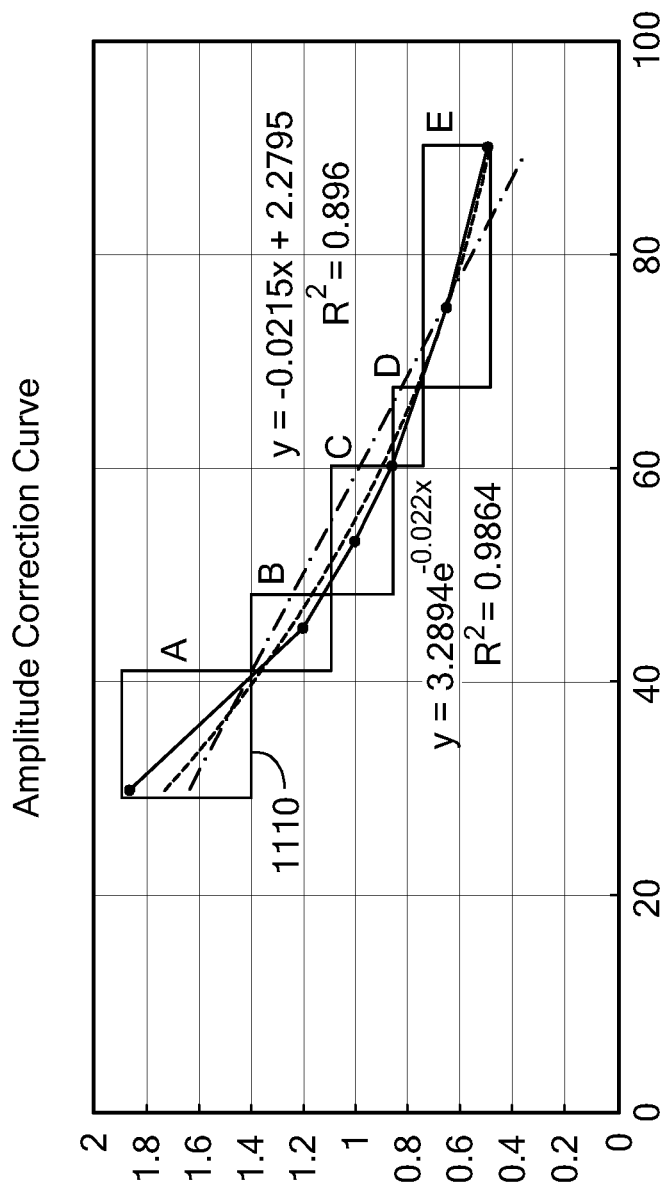
FIG. 20 shows an example waveform for an amplitude correction curve used in generating virtual quadrature magnetic field signals, according to the disclosure.
Figure 21:
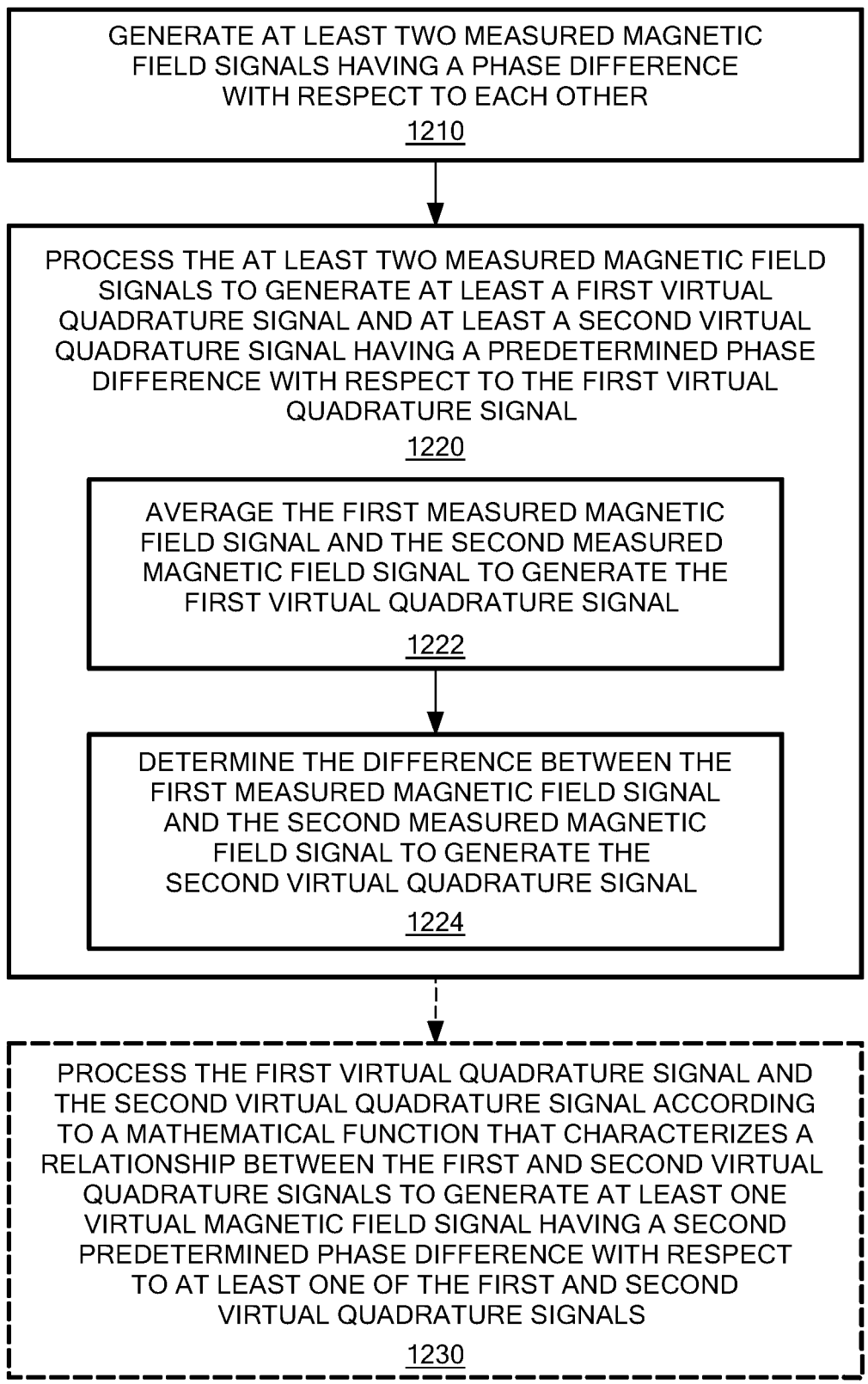
FIG. 21 is a flow diagram illustrating a method of generating one or more virtual quadrature magnetic field signals.
Figure 22:
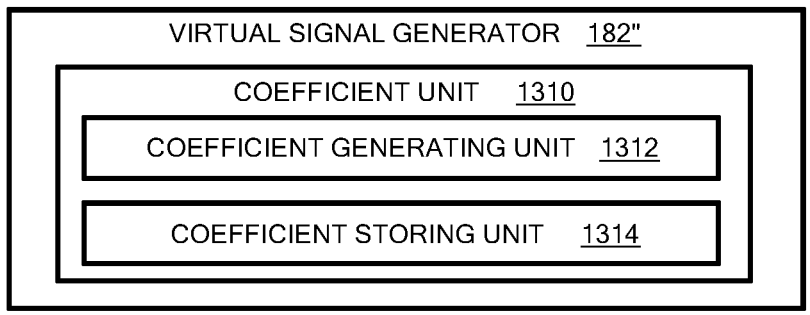
FIG. 22 is a diagram of an example virtual signal generator for generating virtual arbitrary magnetic field signals, according to the disclosure.
Figure 23:
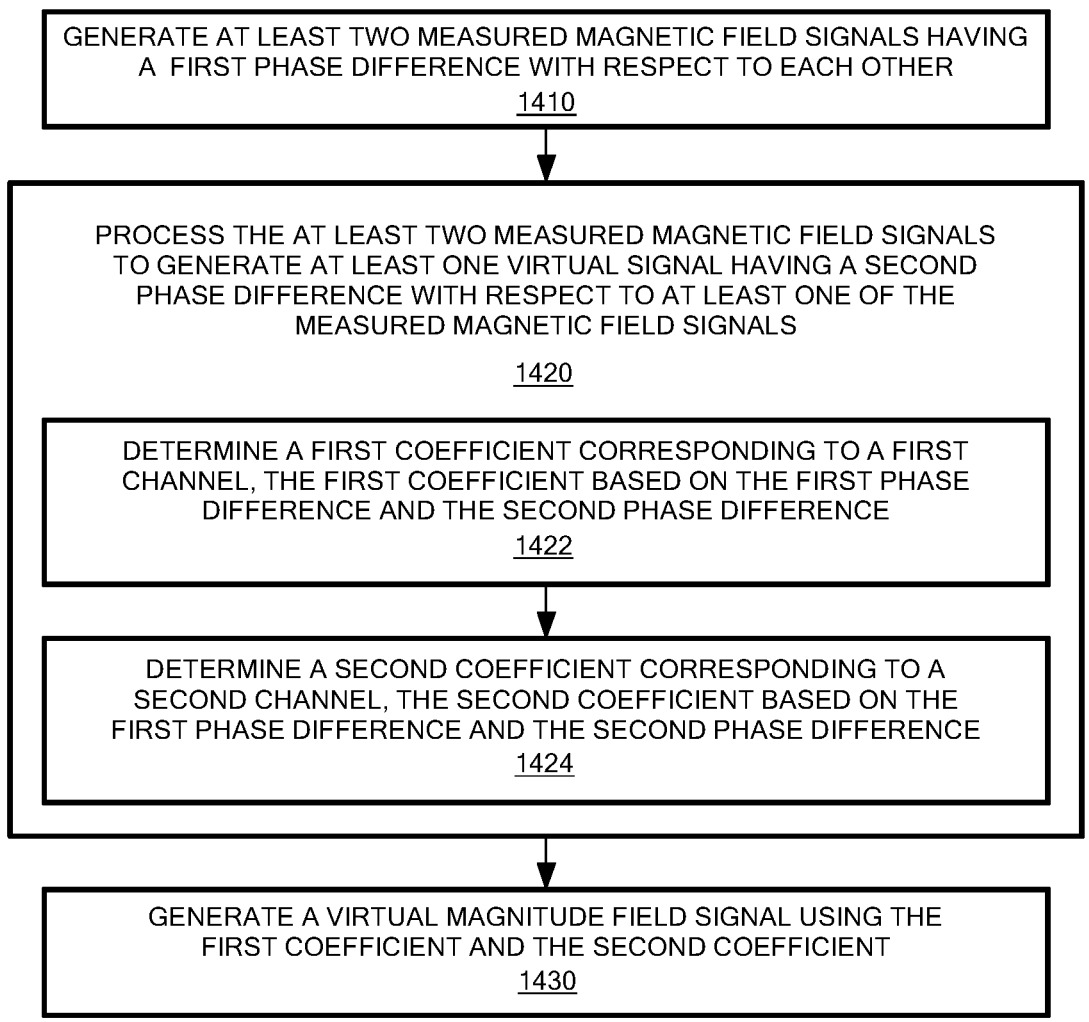
FIG. 23 is a flow diagram illustrating a method of generating one or more virtual arbitrary magnetic field signals, according to the disclosure.

The following description in FIGS. 10-23 provides various systems and method for generating virtual magnetic field signals, which may include the virtual magnetic field signals in FIGS. 10-12A and the corresponding description, virtual quadrature signals in FIGS. 13-21 and virtual arbitrary signals in FIGS. 22-23. These virtual signal generation techniques can be used to generate virtual signals that are used in generating an angle signal, which can then be processed according to the multiple angle signal thresholding techniques of FIGS. 1-9.

Figure 10:
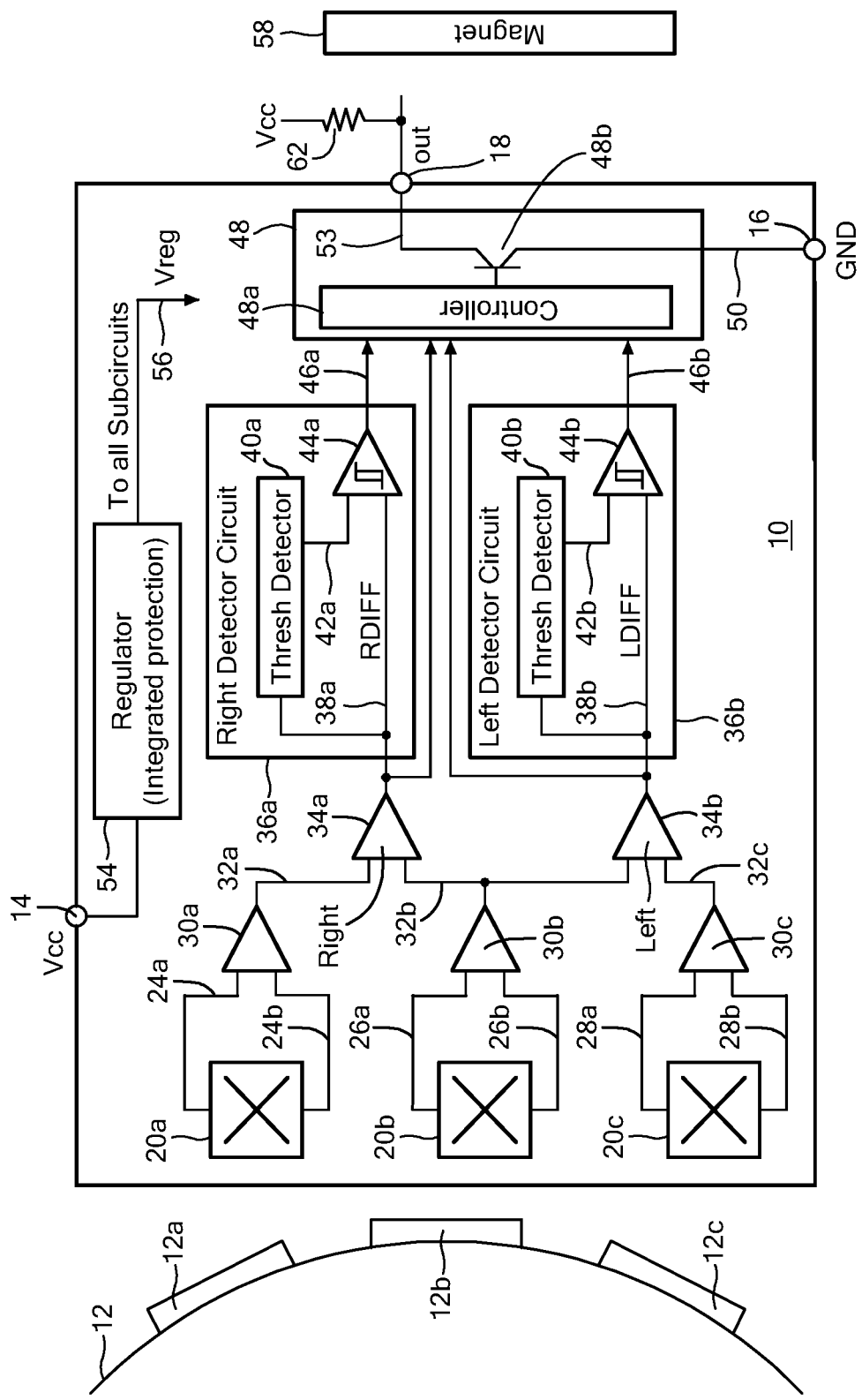
FIG. 10 shows a voltage-level output magnetic field sensor according to the disclosure.

Referring to FIG. 10, a magnetic field sensor 10 as may take the form of a rotation detector can be used, for example, to detect passing gear teeth, for example, gear teeth 12a-12c of a ferromagnetic gear or, more generally target object 12. A permanent magnet 58 can be placed at a variety of positions proximate to the gear 12, resulting in fluctuations of a magnetic field proximate to the gear as the gear rotates. Use of the magnet 58 results in a so-called "back-bias" arrangement.

The sensor 10 can have a first terminal 14 coupled to a power supply denoted as Vcc and a second terminal 16 coupled to a fixed voltage, for example, a ground voltage, denoted as GND. A third terminal 18 of the sensor 10 permits communication of a sensor output signal 53 to circuits and systems external to the sensor. The sensor output signal 53 can be provided in the form of a voltage signal (as shown in FIG. 10) or a current signal. The illustrated sensor 10 can be considered a three-terminal device (i.e., a three-wire device) since it has third terminal 18 at which output signal 53 is provided. Sensor 10 can be provided in the form of an integrated circuit (IC), with terminals 14, 16, 18 provided by pins or leads of the IC.

The sensor 10 can include first, second, and third magnetic field sensing elements 20a, 20b, 20c, respectively, here shown to be Hall effect elements. The first Hall effect element 20a generates a first differential voltage signal 24a, 24b, the second Hall effect element 20b generates a second differential voltage signal 26a, 26b, and the third Hall effect element 20c generates a third differential voltage signal 28a, 28b, each having respective AC signal components in response to the rotating target 12.

While each one of the Hall effect elements 20a, 20b, 20c is shown to be a two terminal device, one of ordinary skill in the art will understand that each of the Hall effect elements 20a, 20b, 20c is actually a four terminal device and the other two terminals of the Hall effect elements can be coupled to receive and pass respective currents as might be provided, for example, by a current source or by a voltage source (not shown).

First differential voltage signal 24a, 24b can be received by a first differential preamplifier 30a, the second differential voltage signal 26a, 26b can be received by a second differential preamplifier 30b, and the third differential voltage signal 28a, 28b can be received by a third differential preamplifier 30c. First and second amplified signals 32a, 32b generated by the first and second differential preamplifiers 30a, 30b, respectively, are received by a "right" channel amplifier 34a and the second amplified signal 32b and a third amplified signal 32c generated by the second and third differential preamplifiers 30b, 30c, respectively, are received by a "left" channel amplifier 34b. Designations of "right" and "left" are arbitrary.

A signal 38a generated by the right channel amplifier 34a is received by a right channel detector circuit 36a and a signal 38b generated by the left channel amplifier 34b is received by a left channel detector circuit 36b. The signals 38a, 38b can be analog signals, generally sinusoidal in nature and further coupled to a controller 48a. Signals 38a, 38b are referred to herein generally as measured magnetic field signals, which signals are indicative of a magnetic field affected by the target object 12, such as by movement (e.g., rotation) of the target 12. Thus, the sensor 10 can be considered to include a right processing channel (or simply right channel) including amplifier 34a and right detector circuit 36a and a left processing channel (or simply left channel) including amplifier 34b and detector circuit 36b.

It will be appreciated that a "channel" refers generally to processing circuitry associated with one or more magnetic field sensing elements and configured to generate a respective channel signal. While the particular processing circuitry shown in FIG. 10 to provide the right channel circuitry includes right channel amplifier 34a and right channel detector circuit 36a (and similarly the processing circuitry shown in FIG. 10 to provide the left channel circuitry includes left channel amplifier 34b and left channel detector circuit 36b), such channels can include less, more, or different processing circuitry.

Since the magnetic field sensing elements 20a, 20b that contribute to the magnetic field signal 38a are physically spaced from the magnetic field sensing elements 20b, 20c that contribute to the magnetic field signal 38b, it should be appreciated that the measured magnetic field signals 38a, 38b are separated in phase. The phase difference, or separation between magnetic field signals 38a, 38b can be based on the target feature size and the spacing between the magnetic field sensing elements 20a-20c. In embodiments, the phase separation between signals 38a, 38b can be approximately ninety degrees (i.e., the signals can be approximately in a quadrature relationship). However, it will be appreciated that other phase relationships between the magnetic field signals are possible.

Furthermore, as will be explained below, while the physical separation of sensing elements 20a-20c and their differential coupling to generate the measured magnetic field signals 38a, 38b illustrates one way to generate phase separated measured magnetic field signals, other configurations and techniques are also possible as shown for example in FIG. 10A and FIG. 10B. By way of non-limiting examples, channels can be based on (i.e., can process) signals from independent (i.e., not differentially combined) magnetic field sensing elements and the phase separation of the resulting measured magnetic field signals can be achieved by the angular difference of the element positions and/or by the use of different sensing element types having axes of maximum sensitivity in different planes (e.g., see FIG. 10A). In some embodiments, some channels can be based on signals from independent magnetic field sensing elements and other channels can be based on differentially combined signals from a plurality of magnetic field sensing elements (e.g., FIG. 10B). Additional magnetic field sensing element configurations can be found in a co-pending U.S. patent application Ser. No. 15/596,514 entitled "Magnetic Field Sensors and Output Signal Formats for a Magnetic Field Sensor" filed on May 6, 2017 assigned to the Assignee of the subject application and incorporated by reference herein in its entirety.

According to the disclosure, one or more virtual magnetic field signals are generated in response to the measured magnetic field signals 38a, 38b. Virtual magnetic field signal is used herein to describe a signal that is indicative of a magnetic field affected by a target object, but which signal is computationally generated based on plurality of phase separated measured magnetic field signals which phase separated measured magnetic field signals are generated by one or more respective magnetic field sensing elements.

Taking the right channel detector circuit 36a as representative of both of the detector circuits 36a, 36b, the right channel detector circuit 36a includes a threshold detector circuit 40a coupled to receive the signal 38a. The threshold detector circuit 40a is configured to detect positive and negative peaks of the signal 38a, to identify a peak-to-peak value of the signal 38a, and to generate a threshold signal 42a that, for example, takes on a first threshold value at forty percent of the peak-to-peak value of the signal 38a and a second threshold value at sixty percent of the peak-to-peak value of the signal 38a. A comparator 44a is coupled to receive the threshold signal 42a and is also coupled to receive the signal 38a. As a result, the comparator 44a generates a binary, two-state, signal 46a that has transitions when the signal 38a crosses the first and second thresholds (e.g., "poscomp" thresholds as referred to herein).

A signal 46b generated by the left channel detector circuit 36b is generated in the same way as the signal 46a. However, since the magnetic field sensing elements 20a, 20b contribute to the signal 46a, while the magnetic field sensing elements 20b, 20c contribute to the signal 46b, it should be appreciated that the signals 46a, 46b have edges that differ in time (which is equivalent to phase for a particular signal frequency, i.e., particular rotation speed). Thus, the detector circuits 36a, 36b are configured to generate respective phase separated channel output, or speed signals 46a, 46b.

As will be explained, sensor 10 can generate additional channel output signals based on the one or more virtual magnetic field signals, as may be referred to herein as virtual channel output signals (see FIGS. 11 and 13 for example). These additional, virtual channel output signals can be generated in a similar fashion to channel output signals 46a, 46b, generally by comparison of virtual magnetic field signals to one or more thresholds.

Movement speed of the target 12 can be detected in accordance with the frequency of either of the phase separated channel signals 46a, 46b. In this way channel signals 46a, 46b can be considered to contain redundant target speed information. It should be appreciated that a direction of rotation of the gear 12 may be determined from a relative phase or relative time difference (e.g., lag or lead) of a particular edge transition in the signal 46a compared with a particular corresponding edge transition in the signal 46b. Therefore, a relative lag or a lead of edges of the signals 46a, 46b can be used to identify a direction of rotation of the gear 12.

While the sensor 10 is shown to include the detector circuits 36a, 36b, each having a particular topology, described above as peak-to-peak percentage detectors (threshold detectors), it should be understood that any form of detectors may be used, such as peak-referenced detectors (peak detectors).

An output module 48 can include controller 48a to receive and process the phase separated measured magnetic field signals 38a, 38b and generate one or more virtual magnetic field signals based on the measured magnetic field signals, as will be explained. Additionally, controller 48a can generate one or more virtual channel output signals based on respective virtual magnetic field signals. The controller 48a is further configured to generate sensor output signal 53 in a desired format, which output signal 53 may represent more than one signal. For example, output signal 53 may include one or more of channel output signals as two-state binary signals having a frequency indicative of the speed of rotation of the target object, a direction signal indicative of a direction of rotation of a target object and/or an exclusive OR (XOR) speed signal that provides a signal resulting from an XOR logic operation based on the channel output signals. The channel output signals provided at the output of the sensor may include channel output signals 46a, 46b and additional channel output signals generated based on respective virtual magnetic field signals as will be explained.

In the illustrated three wire sensor 10, the output driver 48b may take the form of an open-drain output. In this configuration, the driver 48b may include a bipolar transistor having a drain terminal coupled to Vcc through a pull up resistor 62, as shown.

Figure 10A:
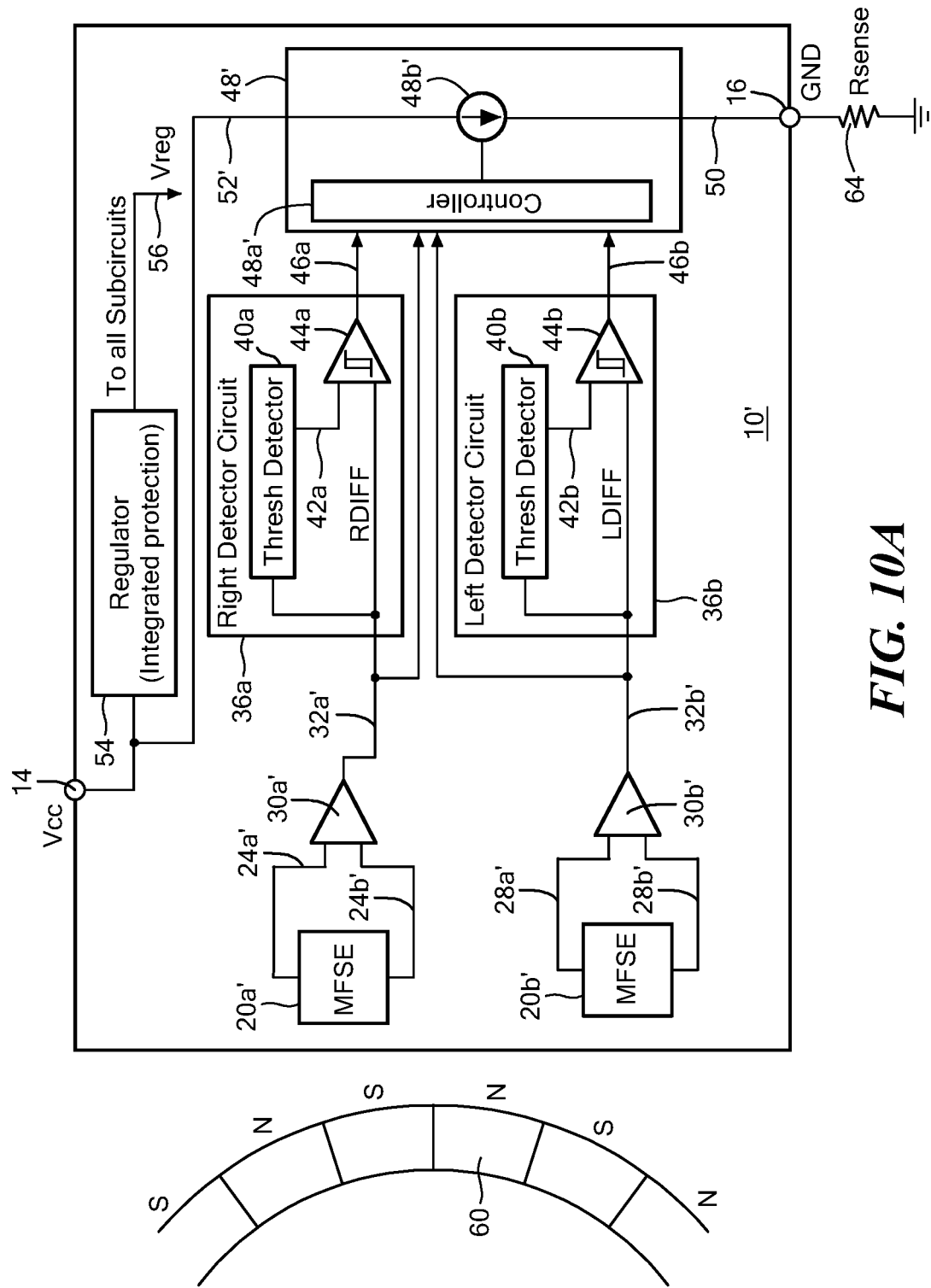
FIG. 10A shows a current-level output magnetic field sensor according to the disclosure.

Referring also to FIG. 10A, an alternative magnetic field sensor 10' as may take the form of a rotation detector can be used to detect rotation of a ring magnet 60 having at least one north pole and at least one south pole. Thus, the sensor 10' differs from the sensor 10 of FIG. 10 in that the magnet 58 is omitted and gear 12 is replaced by ring magnet 60.

The sensor 10' further differs from the sensor 10 of FIG. 10 in that sensor 10' is a so-called two terminal device (or two-wire device), for which an output signal 52' is provided in the form of a current at the two terminal power connection, superimposed upon the power supply voltage, Vcc, which current may be detected across a sense resistor 64. To this end, an output module 48' can include a controller 48a' and an output driver 48b', as may take the form of voltage-controlled current source. Various circuitry is possible to implement the voltage controlled current source 48b' such as an operational amplifier controlling current through a pass element such as bipolar transistor. While the sense resistor 64 is shown coupled to the GND terminal 16, the sense resistor may alternatively be coupled to the Vcc terminal 14. In embodiments in which the sensor 10' is provided in the form of an integrated circuit (IC), terminals 14, 16, are provided by pins or leads of the IC.

The sensor 10' further differs from the sensor 10 of FIG. 10 in that sensor 10' illustrates the use of independent, physically spaced apart magnetic field sensing elements 20a', 20b'. In embodiments, magnetic field sensing elements 20a', 20b' may take the form of magnetoresistance elements or other types of magnetic field sensing elements including Hall effect elements. For example, sensing elements 20a', 20b' may each take the form of a bridge configuration containing a plurality of magnetoresistance elements, with each such bridge physically spaced from the other. Alternatively, sensing elements 20a', 20b' may each take the form of a different sensing element type, each having an axis of maximum sensitivity in a plane that is orthogonal with respect to the plane in which the axis of maximum sensitivity of the other element lies as illustrated in FIG. 10B. With this type of arrangement, the phase separation of the resulting measured magnetic field signals can be achieved by the angular difference of the element positions and need not rely on the physical separation between the elements.

Each element 20a', 20b' can provide a respective differential signal 24a', 24b', 28a', 28b' to a respective amplifier 30a', 30b' as shown. Amplifiers 30a', 30b' in turn can provide respective measured magnetic field signals 32a', 32b' to right and left detector circuits 36a, 36b and to controller 48a', as shown. Measured magnetic field signals 32a', 32b' may thus, be similar to phase separated measured magnetic field signals 38a, 38b of FIG. 10 and thus, may be used by controller 48a' to generate one or more virtual magnetic field signals.

Figure 10B:
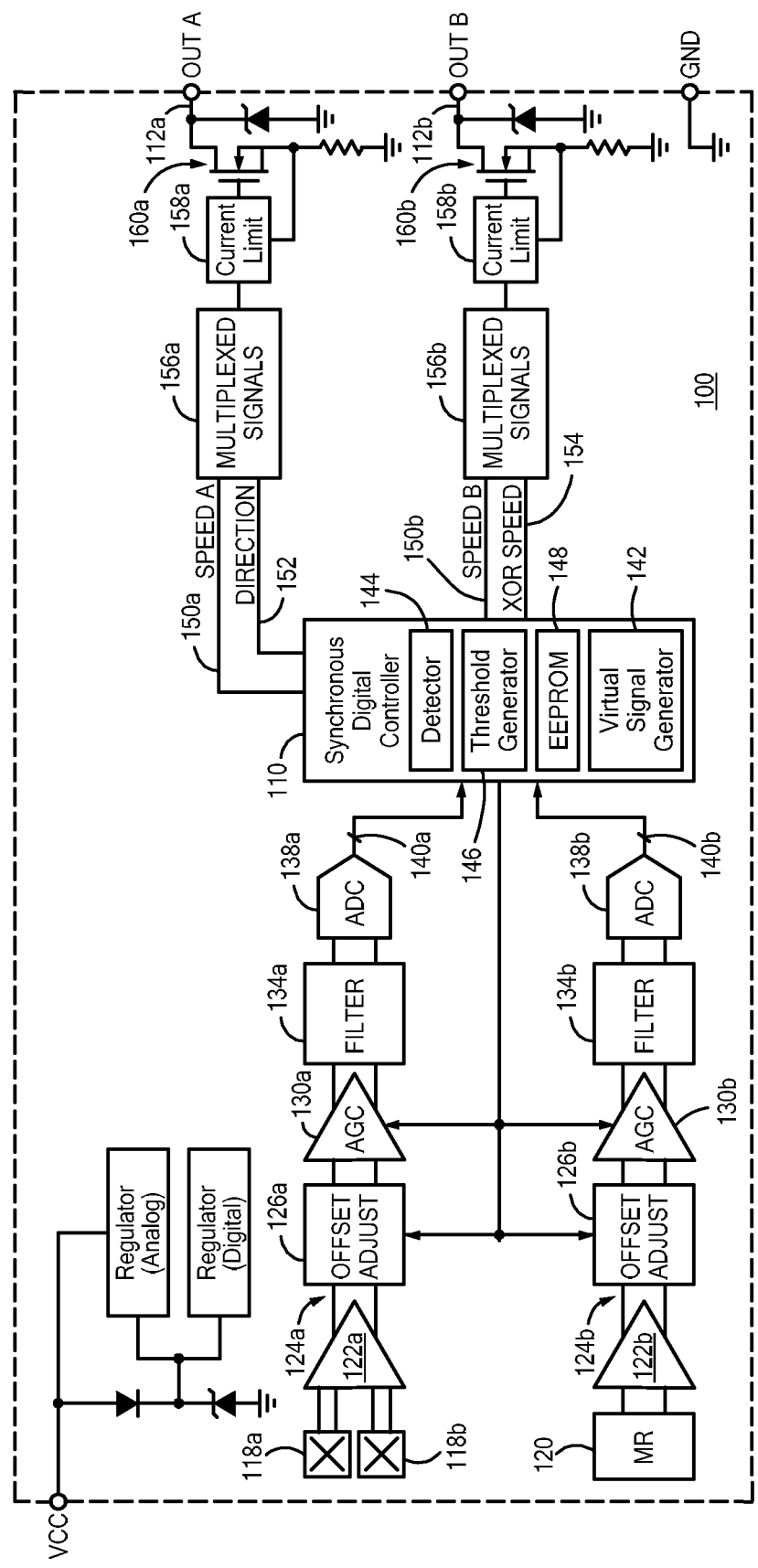
FIG. 10B shows an alternative voltage-level output magnetic field sensor according to the disclosure.

Referring also to FIG. 10B, an alternative magnetic field sensor 100 includes a digital controller 110. Sensor 100 can take the form of a rotation detector to detect rotation of a target (e.g., gear 12 of FIG. 10 or ring magnet 60 of FIG. 10A) and provide one or more output signals 112a, 112b containing speed, direction, vibration, or other target information.

Sensor 100 illustrates a magnetic field sensing element configuration including one or more first sensing elements 118a, 118b each having an axis of maximum sensitivity in a first plane and one or more second sensing elements 120 having an axis of maximum sensitivity in a second plane generally orthogonal with respect to the first plane. As one example, as illustrated, the first sensing elements 118a, 118b may be planar Hall effect elements and the second sensing element 120 may take the form of one or more magnetoresistance elements. Outputs of sensing elements 118a, 118b can be differentially combined by amplifier 122a and outputs of sensing element 120 can be provided to amplifier 122b to generate respective measured magnetic field signals 124a, 124b. With this type of arrangement, the phase separation of the resulting measured magnetic field signals 124a, 124b can be achieved by use of the different types of sensing elements having axes of maximum sensitivity in different planes and need not rely on the physical separation between the elements.

Processing of the measured magnetic field signals 124a, 124b can include offset adjustment by modules 126a, 126b, automatic gain control by elements 130a, 130b, filtering by filters 134a, 134b, and analog-to-digital conversion by ADCs 138a, 138b. The resulting measured magnetic field signals 140a, 140b thus processed are coupled to digital controller 110 as shown.

Digital controller 110 is configured to generate one or more virtual magnetic field signals based on the measured magnetic field signals 140a, 140b. To this end, controller 110 can include a virtual signal generator 142, the operation of which will be described further below. Controller 110 can be further configured to generate one or more channel output signals 150a, 150b that may be the same as or similar to channel output signals 46a, 46b of FIG. 10. To this end, controller 110 can include a detector 144 that may provide functionality similar to or the same as detectors 36a, 36b of FIG. 10 and a threshold generator 146 that may provide functionality similar to or the same as threshold detectors 40a, 40b of FIG. 10. Memory 148, such as EEPROM, can be used to store values for use by the virtual signal generator 142 and the detector 144 for example.

One or more output signals of controller 110 can include channel output signals 150a, 150b that may be the same as or similar to channel output signals 46a, 46b (FIG. 10), a direction signal 152 indicative of a direction of rotation of a target, and an XOR speed signal 154 indicative of an exclusive-OR combination of channel output signals 150a, 150b for example. Additional output signals can be provided on the illustrated or additional signal lines and can include additional channel output signals based on the one more virtual measured magnetic field signals. These new additional output switching locations can also be incorporated into the existing output signals through the use of logic gates to provide higher resolution position information without the need for additional output pins on the IC. In general, the number of output signal switching events can be referred to as "output commutations" and with generation of virtual magnetic field signals, any desired number of output commutations per pole-pair of the target object can be achieved.

Figure 10C:
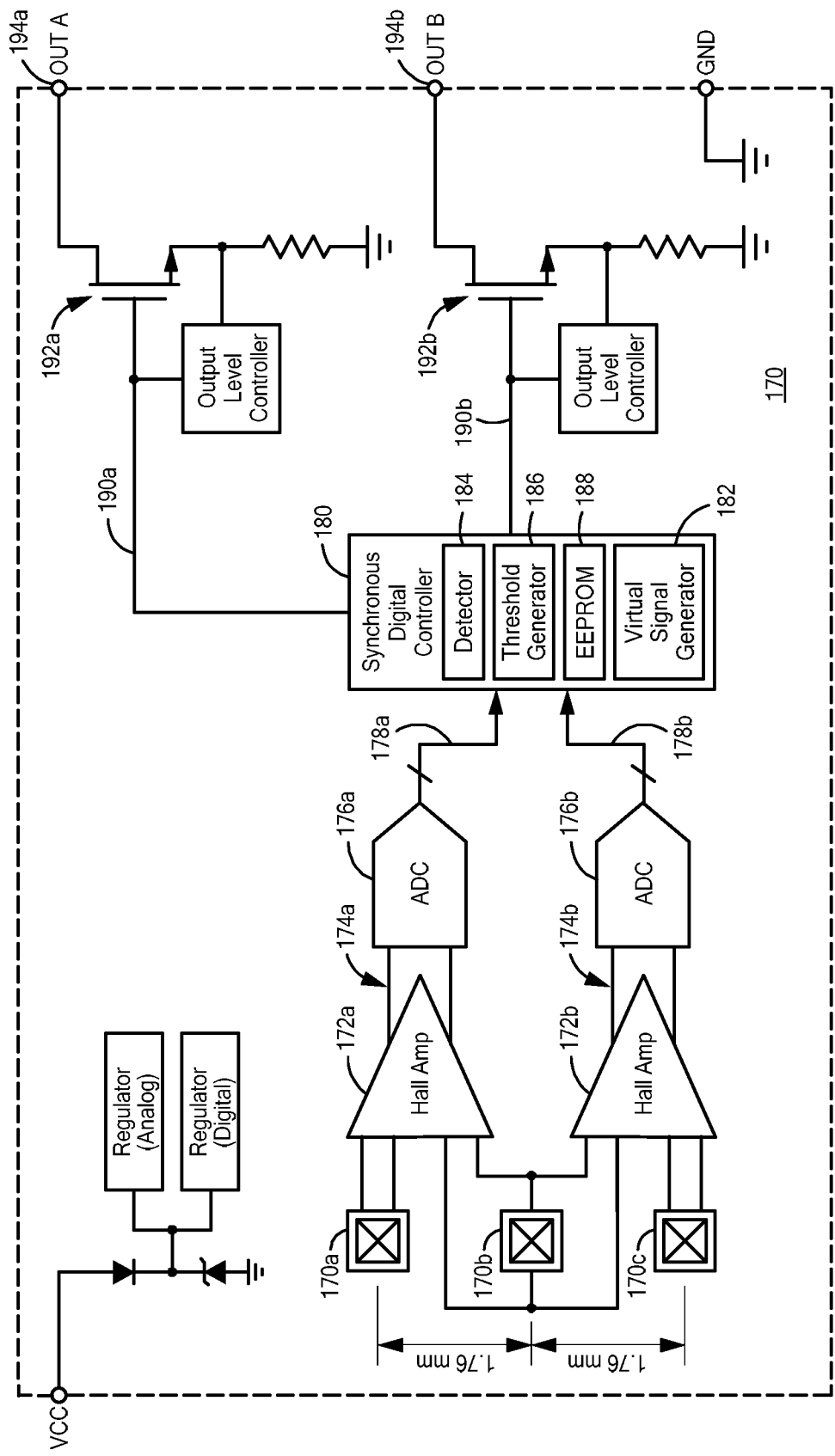
FIG. 10C shows another alternative voltage-level output magnetic field sensor according to the disclosure.

Referring also to FIG. 10C, another alternative magnetic field sensor 170 includes a digital controller 180. Sensor 170 includes a magnetic field sensing element configuration like FIG. 5 and thus includes Hall effect elements 170a, 170b, 170c, each providing an output signal to a respective differential amplifier 172a, 172b to generate respective measured magnetic field signals 174a, 174b, as shown. The phase difference, or separation between measured magnetic field signals 174a, 174b can be approximately ninety degrees (i.e., the signals can be approximately in a quadrature relationship).

Processing of the measured magnetic field signals 174a, 174b can be performed more in the digital domain than in the embodiment of FIG. 10B. Accordingly, measured magnetic field signals 174a, 174b can be converted to respective digital signals by ADCs 176a, 176b, as shown. Offset adjustment, gain control, filtering and other types of signal processing functionality can be implemented by controller 180.

Digital controller 180 is configured to generate one or more virtual magnetic field signals based on the measured magnetic field signals 178a, 178b. To this end, controller 180 can include a virtual signal generator 182, the operation of which will be described further below. Controller 180 can be further configured to generate one or more channel output signals that may be the same as or similar to channel output signals 46a, 46b of FIG. 10. To this end, controller 180 can include a detector 184 that may provide functionality similar to or the same as detectors 36a, 36b of FIG. 1 and a threshold generator 186 that may provide functionality similar to or the same as threshold detectors 40a, 40b. Memory 188, such as EEPROM, can be used to store values for use by the virtual signal generator 182 and the detector 184 for example.

One or more output signals 190a, 190b of controller 180 can include channel output signals that may be the same as or similar to channel output signals 46a, 46b (FIG. 10), a direction signal indicative of a direction of rotation of a target, and an XOR speed signal indicative of an exclusive-OR combination of channel output signals for example. Additional output signals can be provided on the illustrated or additional signal lines and can include additional channel output signals based on the one more virtual measured magnetic field signals. These new additional output switching locations can also be incorporated into the existing output signals through the use of logic gates to provide higher resolution position information without the need for additional output pins on the IC. Controller output signals 190a, 190b can be coupled to respective output drivers 192a, 192b to provide sensor output signals 194a, 194b containing desired information in a desired format.

Figure 11:
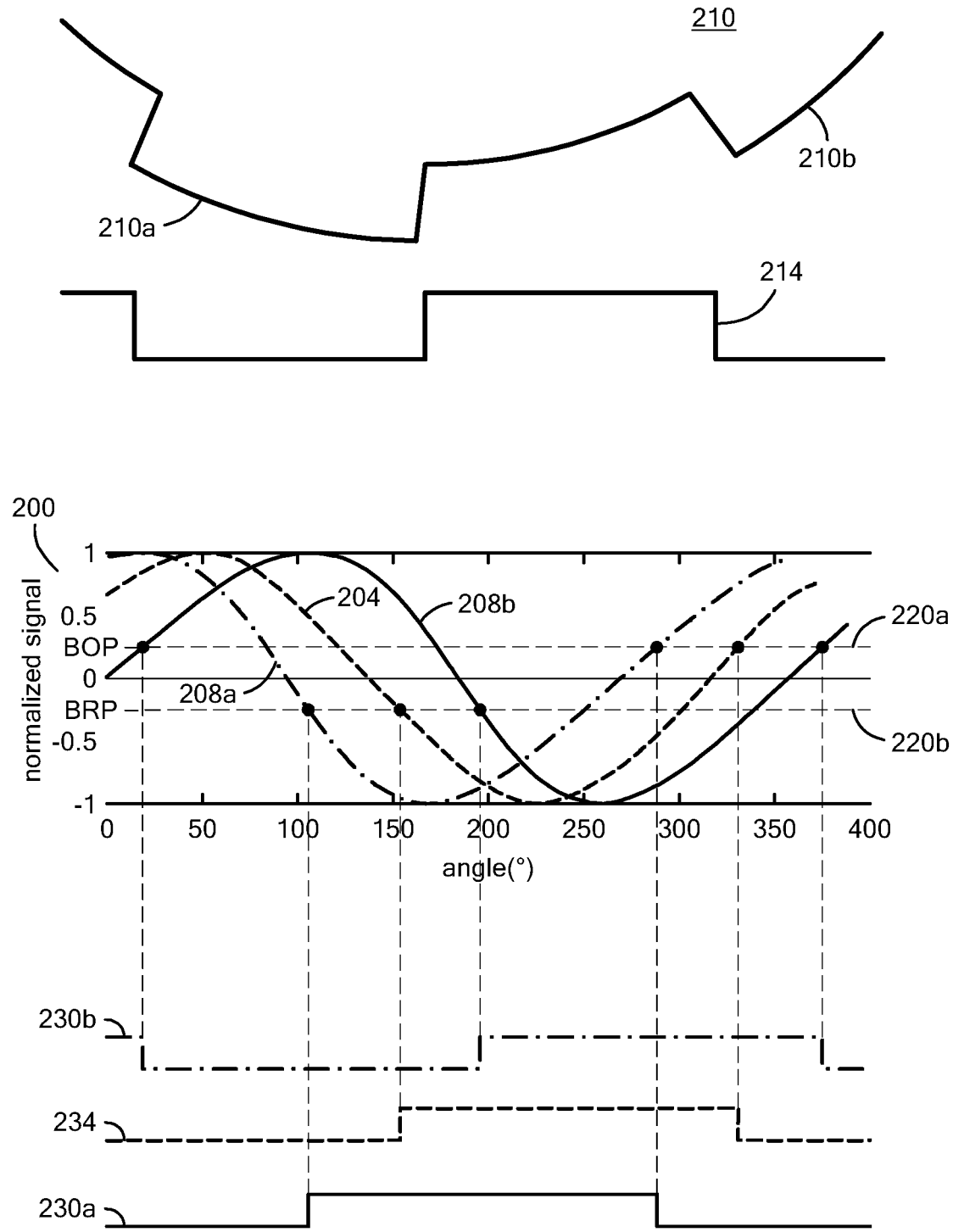
FIG. 11 shows example waveforms, including measured magnetic field signals, a virtual magnetic field signal, and associated channel output signals according to the disclosure as may be generated by any of the sensors of FIGS. 10-10C.

Referring to FIG. 11, generation of a virtual magnetic field signal 204 as may be achieved by any of the above-described sensors 10, 10', 100, 170 (see FIGS. 10-10C, respectively) is illustrated. Virtual magnetic field signal 204 is shown along with measured magnetic field signals 208a, 208b in waveforms 200 against a horizontal axis representing angle in units of degrees and a vertical axis in normalized units of volts.

A target 210 as may be similar to the gear 12 of FIG. 10 includes features 210a, 210b such as may represent gear teeth for example. The mechanical profile of target 210 that reflects the target geometry is represented by waveform 214 having a horizontal axis representing angle in the same units of degrees as waveforms 200.

As the target 210 rotates and features 210a, 210b pass the plurality of sensing elements of the sensor, measured magnetic field signals 208a, 208b are generated. For example, measured magnetic field signals 208a, 208b can correspond to signals 38a, 38b of FIG. 10. Thus, it can be seen that the phase separation of measured magnetic field signals 208a, 208b (referred to herein as a first predetermined phase difference) can be on the order of ninety degrees.

Operate and release threshold levels 220a, 220b (i.e., BOP, BRP, respectively) are shown in relation to the measured magnetic field signals 208a, 208b. As an example, the BOP threshold level 220a can represent a first percentage (e.g., 60%) of the peak-to-peak value of magnetic field signal 208a and the BRP threshold level 220b can represent a second, different percentage (e.g., 40%) of the peak-to-peak value of magnetic field signal 208a. Other threshold levels are possible including but not limited to other percentages of the peak-to-peak magnetic field signal, thresholds that are a predetermined percentage or a predetermined absolute difference with respect to positive and negative peaks of the magnetic field signal, etc.

By operation of detector circuitry (e.g., by detector circuits 36a, 36b of FIG. 10 or controller 110 of FIG. 10B for example), channel output signals 230a, 230b based on respective measured magnetic field signals 208a, 208b are generated. When measured magnetic field signal 208a crosses the BRP threshold level 220b, the respective channel output signal 230a transitions, here to a logic high level, and when measured magnetic field signal 208a crosses the BOP threshold level 220a, the respective channel output signal 230a transitions, here to a logic low level. Channel output signal 230b is generated in a similar manner based on crossings of the measured magnetic field signal 208b with the BOP threshold level 220a and the BRP threshold level 220b, as shown. The result is channel output signals 230a, 230b based on respective measured magnetic field signals 208a, 208b, which channel output signals which have a phase separation relative to one another that is established by the phase separation between the measured magnetic field signals 208a, 208b. Thus, the channel output signals 230a, 230b have the same predetermined phase separation with respect to each other as the measured magnetic field signals 208a, 208b have with respect to each other.

By operation of a controller (e.g., 48a, 48a', 110, 180), virtual magnetic field signal 204 is generated based on the measured magnetic field signals 208a, 208b with a second predetermined phase difference with respect to at least one of the signals 208a, 208b. In embodiments, the second predetermined phase difference can be with respect to each of the measured magnetic field signals 208a, 208b resulting in the virtual signal 204 being evenly spaced with respect to both signals 208a, 208b. In other embodiments, the virtual signal 204 can be unevenly spaced with respect to signals 208a, 208b (i.e., virtual signal 204 can be closer to signal 208a than it is to signal 208b).

The sensor may be user programmable to select a desired number of virtual magnetic field signals to be generated and also to select the desired phase difference between the virtual magnetic field signal(s) and the measured magnetic field signals. For example, the sensor may permit a user to select a desired resolution and, on that basis, the controller can determine how many virtual magnetic field signals will be generated and their respective phases, as will be illustrated in connection with FIG. 13.

Detector circuitry and techniques can be used to process the virtual magnetic field signal 204 to generate a respective virtual channel output signal 234 based on crossings of the virtual magnetic field signal 204 with the threshold levels 220a, 220b. When virtual magnetic field signal 204 crosses the BRP threshold level 220b, the respective virtual channel output signal 234 transitions, here to a logic high level, and when virtual magnetic field signal 204 crosses the BOP threshold level 220a, the respective virtual channel output signal 234 transitions, here to a logic low level, as shown.

Figure 12:
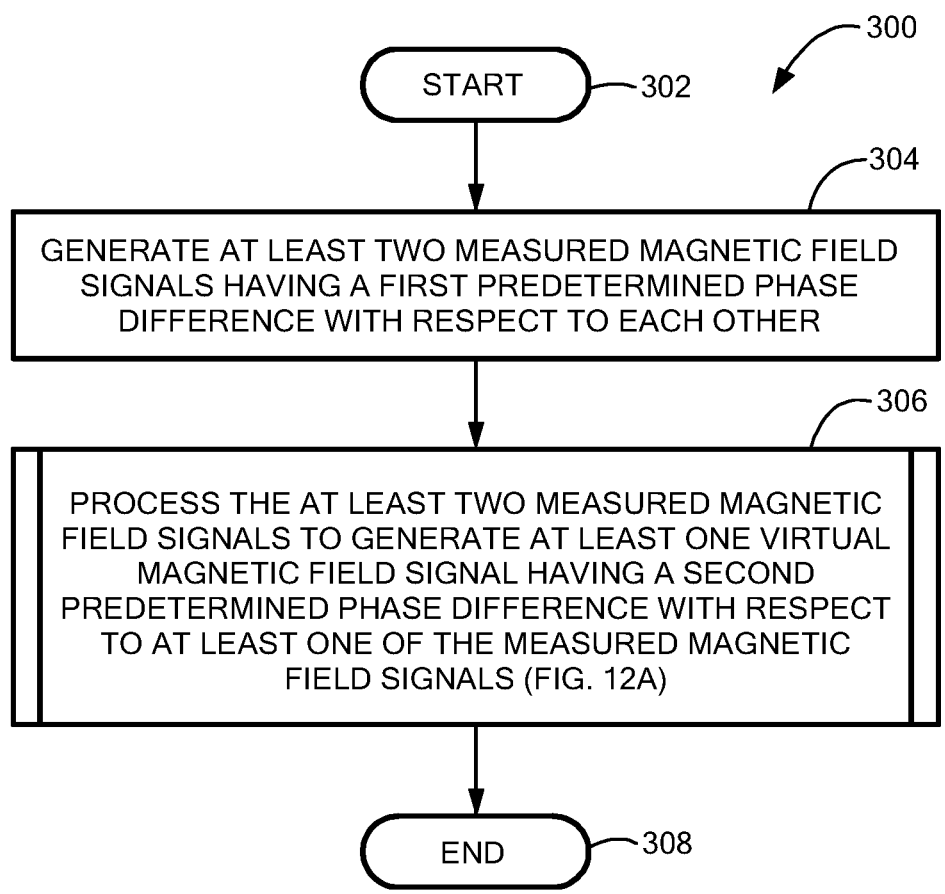
FIG. 12 is a simplified flow diagram illustrating a method of generating one or more virtual magnetic field signals according to the disclosure.

Referring also to the flow diagram of FIG. 12, a method 300 of generating a virtual magnetic field signal begins at block 302, following which at least two measured magnetic field signals having a first predetermined phase difference with respect to each other are generated in block 304. Generating the magnetic field signals may be accomplished with magnetic field sensing elements, such as the Hall effect elements 20a, 20b, 20c of FIGS. 10 and 10A or the magnetoresistance elements 20a', 20b' in FIG. 10B, for example.

In block 306 (as shown in more detail in FIG. 12A), the phase separated measured magnetic field signals are used to generate at least one virtual magnetic field signal having a second predetermined phase difference with respect to at least one of the magnetic field signals, as may be accomplished with sensor controller circuitry and techniques. The measured and virtual magnetic field signals can be processed by detector circuitry and techniques to generate respective channel output signals for communicating high resolution information (referred to generally as output commutations) about the target angle for example.

An example subprocess for generating the virtual magnetic field signal is illustrated by the flow diagram of FIG.

12A and can include the use of a mathematical function that characterizes a relationship between the second predetermined phase difference and the measured magnetic field signals. For example, values of the virtual magnetic field signal can be computed according to the following mathematical function, Equation 39:

$$\cos(\text{phase})*Ch1+\sin(\text{phase})*Ch2 \quad \text{Equation 39}$$

where "phase" represents the second predetermined phase separation between the virtual magnetic field signal and the measured magnetic field signals relative to a single period of the measured magnetic field signal (e.g., a target rotation from an edge of one feature to a like edge of the next feature). Thus, in the example of FIG. 11, where it is desired to generate a single virtual magnetic field signal 204 evenly spaced between signals 208a, 208b, "phase" is given by 45°. In the above function, "Ch1" represents the magnitude of one of the measured magnetic field signals (e.g., 208a) and "Ch2" represents the magnitude of the other one of the measured magnetic field signals (e.g., 208b).

Figure 12A:
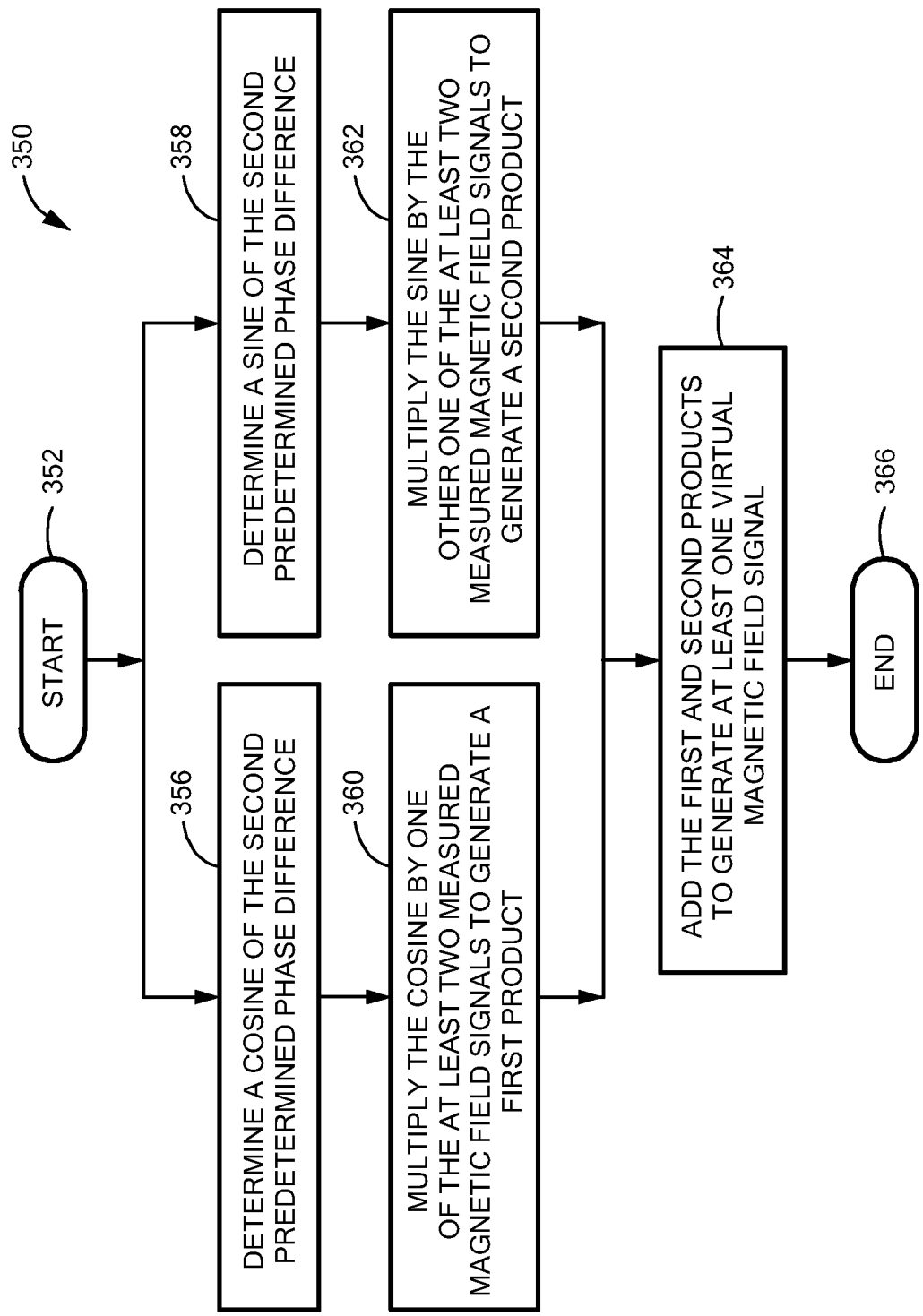
FIG. 12A is a flow diagram illustrating a method of generating one or more virtual magnetic field signals according to the disclosure.

The subprocess 350 of FIG. 12A begins at block 352. In block 356, the cosine of the second predetermined phase is determined and in block 358, the sine of the second predetermined phase is determined. Various components and techniques can be used to determine the desired sine and cosine values. In an example embodiment, a look-up table (as may be stored in EEPROM for example) is used to determine the cosine and sine values. This type of configuration can be desirable in sensors containing binary digital logic since sine and cosine function computations can be difficult to implement. In other embodiments, such as those containing a microprocessor, the sine and cosine values can be computed directly.

Considering embodiments using a look-up table (Table 1) to determine the desired sine and cosine values, contents of an example look-up table can be given by the following:

Having thus determined the cosine and sine values for the desired phase for the virtual signal being generated, the binary equivalent value can provide a fixed coefficient for use in subsequent process blocks 360, 362. In block 360, the cosine value thus determined is multiplied by the value of one of the measured magnetic field signals (e.g., Ch1 as may correspond to signal 208a) and in block 362, the sine value thus determined is multiplied by the value of the other one of the measured magnetic field signals (e.g., Ch2 as may correspond to signal 208b). In block 364, the products determined in blocks 360 and 362 are added to thereby determine the corresponding value of the virtual magnetic field signal (e.g., signal 204) and the subprocess ends at block 366.

Figure 13:
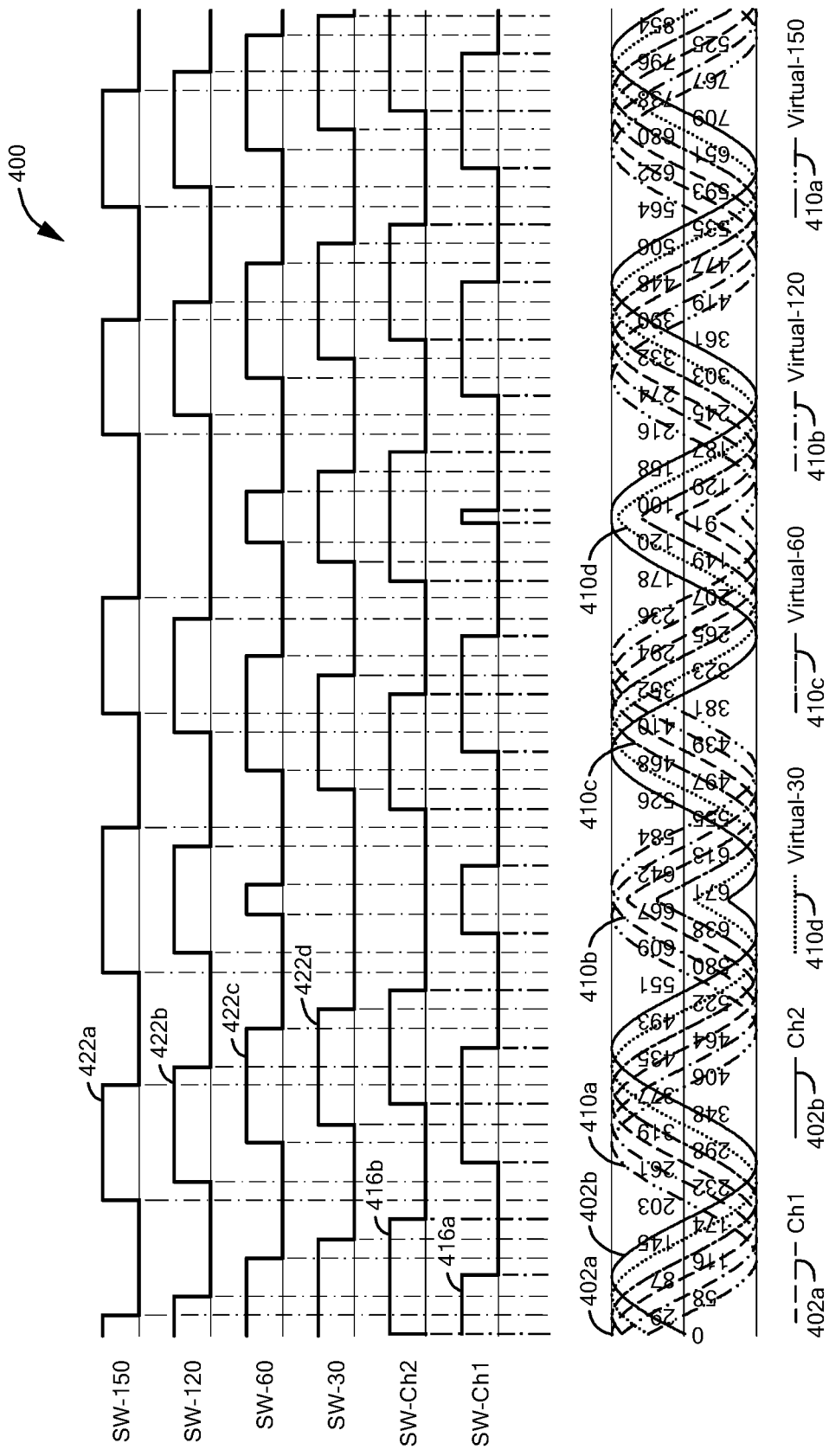
FIG. 13 shows example waveforms, including measured magnetic field signals, a plurality of virtual magnetic field signals, and associated channel output signals according to the disclosure as may be generated by any of the sensors of FIGS. 10-10C.

Referring also to FIG. 13, example waveforms 400 are shown in connection with a sensor generating more than one virtual magnetic field signal, and here four virtual magnetic field signals 410a, 410b, 410c, 410d. Also shown are measured magnetic field signals 402a, 402b against a horizontal axis representing angle in units of degrees and a vertical axis in normalized units of volts.

In the example of FIG. 13, each of the virtual magnetic field signals 410a-410d is evenly spaced between the measured magnetic field signals 402a, 402b. Thus, the phase separation between each consecutive signal 402a, 402b, 410a, 410b, 410c, and 410d is 30°.

The number of virtual signals and the phase separation between the virtual signals can be determined by the sensor controller in response to a user selection of a programming option. In the illustrated example, the user may have selected to receive twelve edges for each period, or gear tooth for example. With such resolution selected and based on knowledge of the target (i.e., how many periods the target represents), the sensor controller can determine that four virtual magnetic field signals with a phase separation of 30°

TABLE 1

| Virtual Phase | Cos(virtual phase) | Approximate decimal value of cos(virtual phase) | Binary equivalent of approximate decimal value of cos(virtual phase) | Sin(virtual phase) | Approximate decimal value of sin(virtual phase) | Binary equivalent of approximate decimal value of sin(virtual phase) |
|---|---|---|---|---|---|---|
| 30 | 0.866 | 0.8125 | 0.1101 | 0.5 | 0.5 | 0.1000 |
| 45 | 0.707 | 0.6875 | 0.1011 | 0.707 | 0.6875 | 0.1011 |
| 60 | 0.5 | 0.5 | 0.1000 | 0.866 | 0.8125 | 0.1101 |
| 120 | −0.5 | −0.5 | −0.1000 | 0.866 | 0.8125 | 0.1101 |
| 135 | −0.707 | −0.6875 | −0.1011 | 0.707 | 0.6875 | 0.1011 |
| 150 | −0.866 | −0.8125 | −0.1101 | 0.5 | 0.5 | 0.1000 |

In an implementation containing a look-up table, a binary equivalent of a decimal approximation of the desired sine and cosine values can be used. For example, considering generation of the virtual magnetic field signal 204 (FIG. 11) in which the desired virtual phase is 45°, in block 356 binary equivalent value 0.1011 of the cosine of 45° can be determined. In block 358, binary equivalent value of 0.1011 of the sine of 45° can be determined.

Furthermore, because the cosine values can be negative for some desired phase separations of the virtual magnetic field signal, the ADC(s) that convert the measured magnetic field signals to digital values can be offset such that a midpoint of available codes corresponds to zero. For example, in the case of a 12-bit ADC providing 4096 codes, the midpoint code of 2048 can be used to represent zero volts.

between each other and between each of the measured magnetic field signals should be generated. Alternatively, a user can provide a "resolution improvement factor" where the standard 4 edges per period generated by the physical channels could be scaled by 2× (resulting in 8 edges) or 3× (resulting in 12 edges) by using added virtual channels.

By detector operation, each of the magnetic field signals 402a, 402b, 410a, 410b, 410c, and 410d can be processed to generate a respective channel output signal according to threshold crossings as discussed above. For example, measured magnetic field signals 402a, 402b can be used to generate respective channel output signals 416a, 416b and virtual magnetic field signals can be used to generate respective virtual channel output signals 422a, 422b, 422c, and 422d.

Consideration of the measured channel output signals 416a, 416b reveals that, for each period (i.e., from one target tooth edge to the like edge of the next tooth), four switch events (i.e., four transitions of measured channel output signals 416a, 416b) occur. By contrast, use of both the measured channel output signals 416a, 416b and the four virtual channel output signals 422a, 422b, 422c, 422d results in twelve switch events per period. Accordingly, a 3x improvement in target sensing resolution is achieved.

It will be appreciated that in applications in which the required number of virtual signals is an odd number, the measured channel output signals may not be used for target detection. In other words, if the number of virtual signals is such that their even phase separation within each 360° period would result in uneven phase separation with respect to the measured magnetic field signals, then only the virtual channel output signals may be used to control the target. For example, if the user programmed resolution and target are such as to require that five virtual magnetic field signals be generated at relative phases of 72°, 144°, 216°, 288°, and 360°, then the measured magnetic field signals at approximately 0° and 90° can be ignored for target control purposes.

Also illustrated in FIG. 13 are two direction changes which can represent a change in the direction of rotation of the target. As noted above, the relative lead or lag of edges of the channel output signals can be used to determine the direction of rotation of the target. The increased target detection resolution provided by the virtual channel output signals 422a, 422b, 422c, 422d can result in a more rapid determination of a direction change than otherwise possible.

It will be appreciated that the aforementioned virtual signal generation assumes that the measured magnetic field signals used to generate the virtual magnetic field signals have a perfect quadrature relationship (i.e., there is no "phase error" or deviation from perfect quadrature between the first and second measured magnetic field signals). Traditionally, the only way to ensure sensor outputs in quadrature was to mechanically position two sensors on difference phases (positions) of the target, or to use a single IC solution with two channels in a single IC and have the target designed to have a period exactly two times the mechanical separation of the channels in the IC. This requires a very specific sensor configuration that is not readily applicable to multiple target environments. As a result, the phase difference of the measured magnetic field signals may not be 90-degrees (i.e., there may be a phase error between the measured magnetic field signals) in which case errors can occur when determining wheel displacement or other calculations based on the virtual magnetic field signals.

Figure 14:
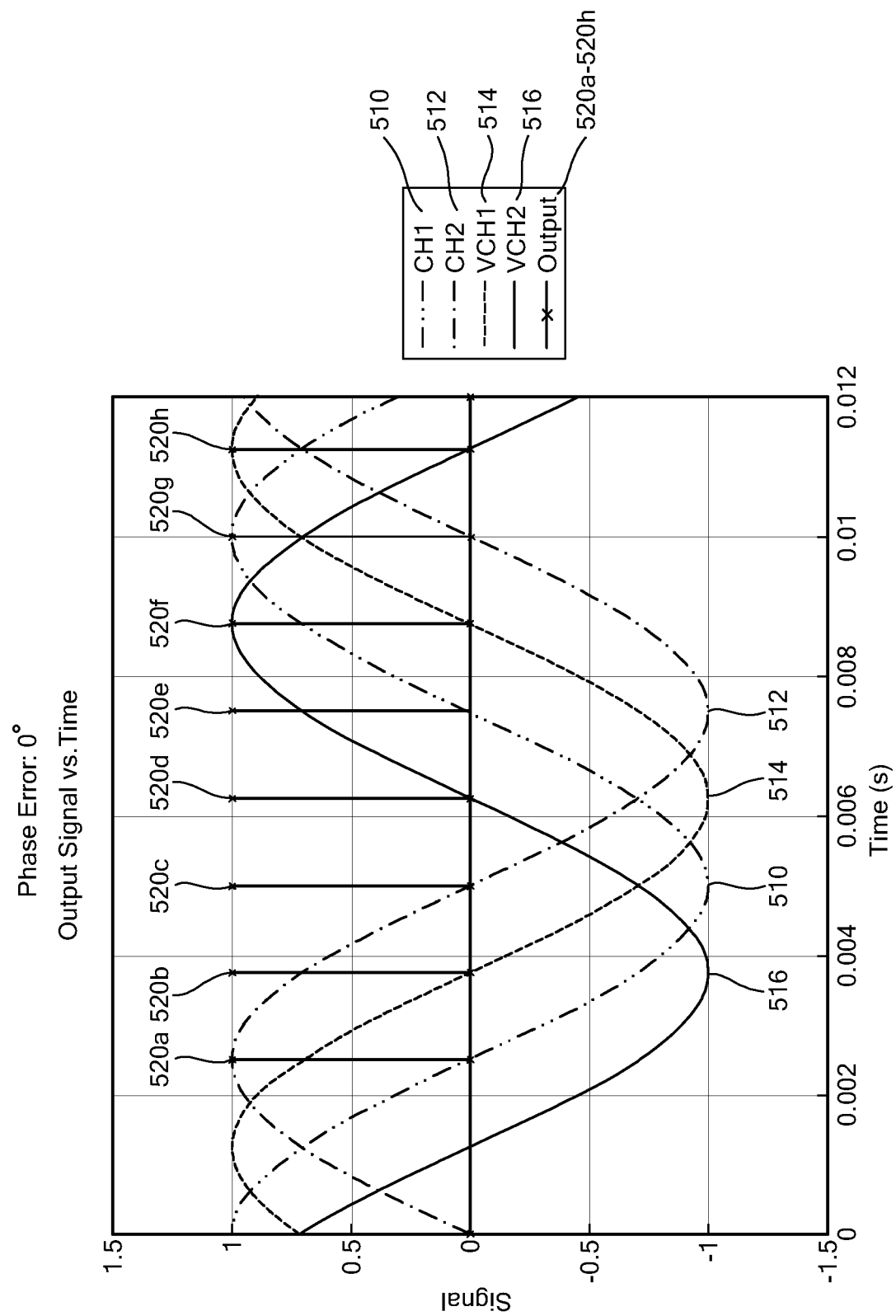
FIG. 14 shows example waveforms of two measured magnetic field signals and two virtual magnetic field signals, and the associated output pulses, where there is no phase error between the first and second channels that generate the measured magnetic field signals.

FIG. 14 shows example waveforms of two measured magnetic field signals 510, 512 and two virtual magnetic field signals 514, 516 generated from the measured magnetic field signals 510, 512 in the manner set forth above where the measured magnetic field signals 510, 512 are in quadrature. Also shown in FIG. 14 are channel output signals in the form of output pulses 520a-520h based on each of the measured and virtual magnetic field signals 510, 512, 514, 516 crossing a threshold (e.g., "poscomp" threshold as described herein). As is apparent, the output pulses 520a-520h are equally spaced apart. This equidistant output pulse spacing is achieved by virtual signals 514, 516 being precisely 90-degrees with respect to each other and precisely 30-degrees with respect to each measured magnetic field signal 510, 512. It will be appreciated that although the illustrated output pulses 520a-520h correspond to the zero crossing points of measured magnetic field signals 510, 512 and the virtual magnetic field signals 514, 516, other threshold levels could be used.

Figure 15:
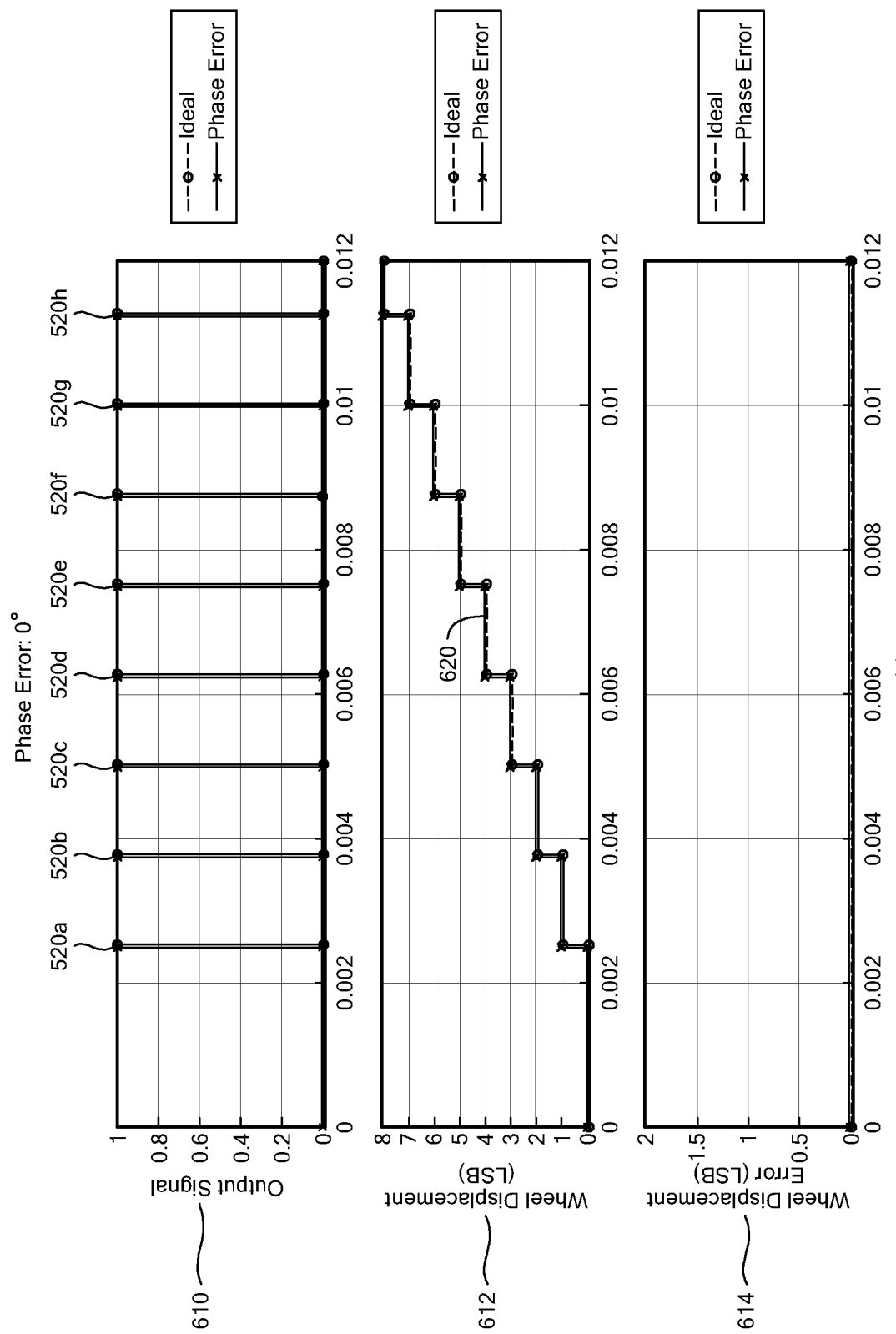
FIG. 15 shows example waveforms of the output signal, wheel displacement, and wheel displacement error, where there is no phase error between the first and second channels that generate the measured magnetic field signals.

As shown for example in FIG. 15, providing a channel output signal 610 with equidistant output pulses 520a-520h allows for processing of the magnetic field signals without error, or with minimal error, as shown for example in FIG. 15. Also shown in FIG. 15 is wheel displacement 612, and wheel displacement error 614, where there is no phase error between the first and second measured magnetic field signals. As shown in graph 610, by providing equidistant output pulses 520a-520g, the wheel displacement 620 in graph 612 is equally stepped through the positions, and the resulting graph 614 shows no wheel displacement error.

Figure 16:
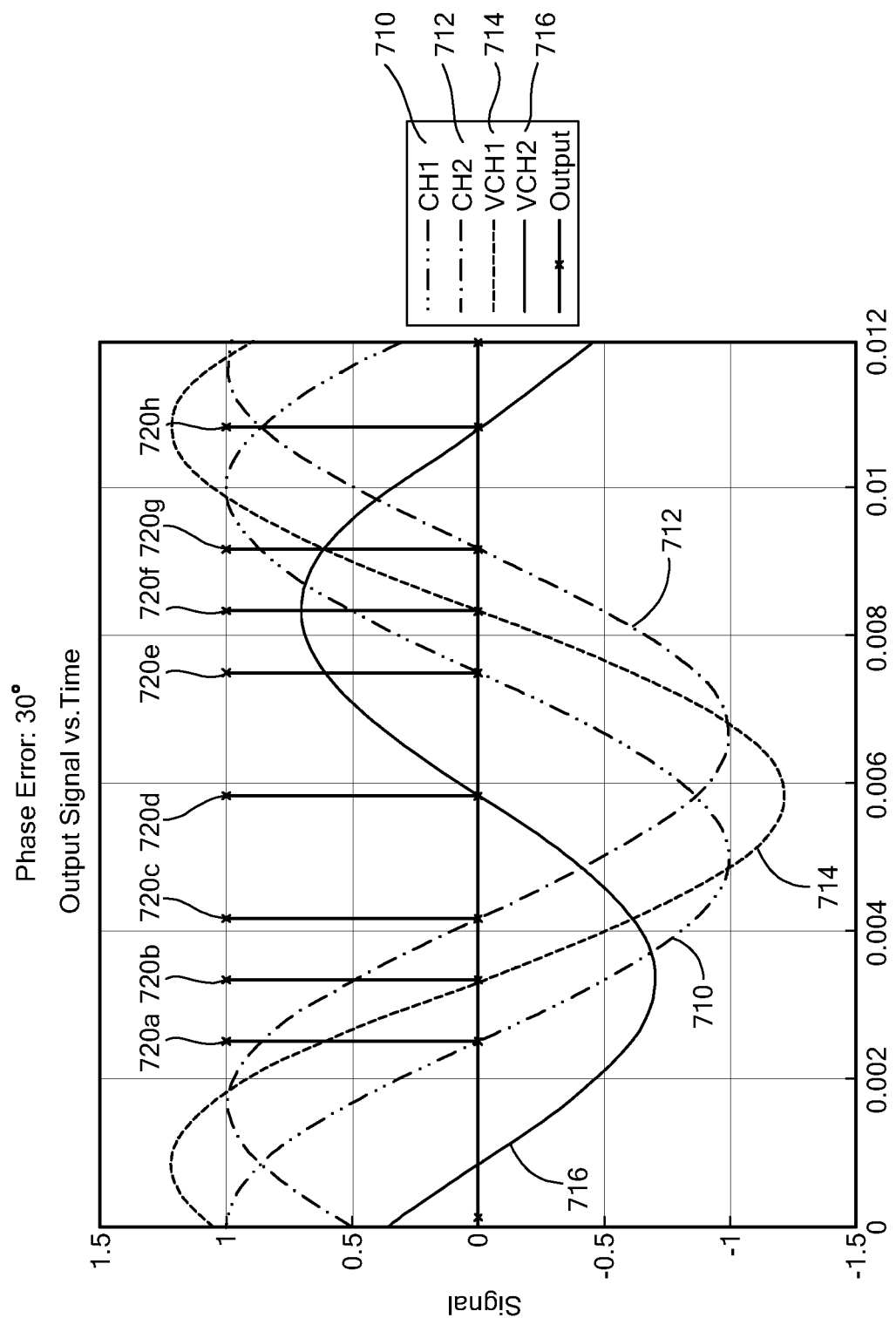
FIG. 16 shows example waveforms of two measured magnetic field signals and two virtual magnetic field signals, and the associated output pulses, where there is a 30-degree phase error between the first and second channels that generate the measured magnetic field signals.
Figure 17:
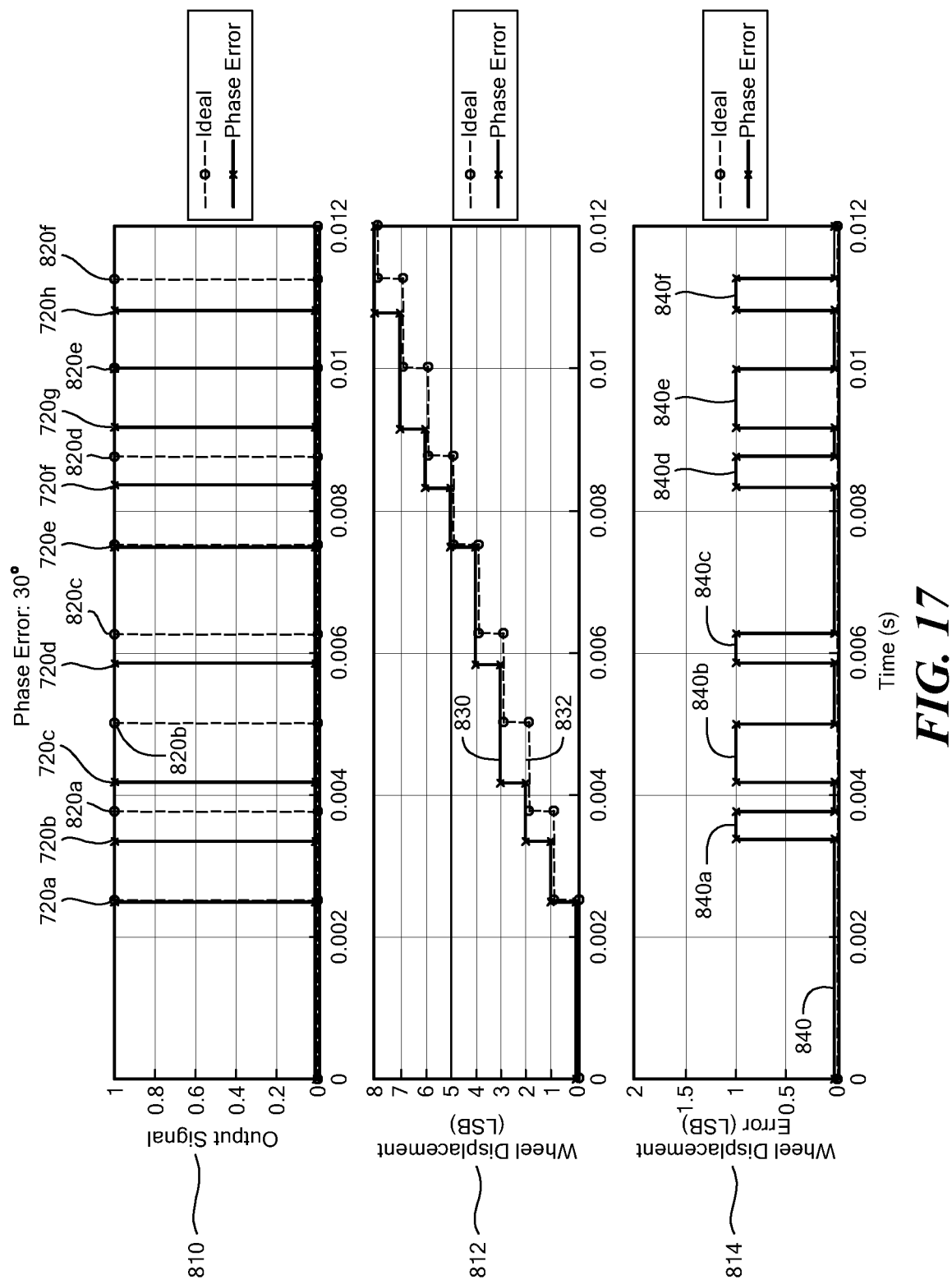
FIG. 17 shows example waveforms of the output signal, wheel displacement, and wheel displacement error, where there is a 30-degree phase error between the first and second channels that generate the measured magnetic field signals.

FIG. 16 shows example waveforms of two measured magnetic field signals 710, 712 having a 30-degree phase error between the measured magnetic field signals 710, 712, and two virtual magnetic field signals 714, 716 generated from the measured magnetic field signals 710, 712 in the manner described above. As is apparent, the resulting channel output signal pulses 720a-720g are not equidistant, which can result in wheel displacement error, as shown in FIG. 17. Furthermore, when the measured magnetic field signals 710, 712 are not in perfect quadrature, the amplitude of the resulting virtual signals 714, 716 will not match the amplitude of the measured magnetic field signals 710, 712, as shown.

FIG. 17 shows example waveforms of the output signal 810 including non-equidistant pulses 720a-720h, wheel displacement 812, and wheel displacement error 814, where there is a 30-degree phase error between the measured magnetic field signals 710, 712. Also shown in graph 810 are ideal output pulses 820a-820e (pulses 820a, 820b, 820c, 820d, and 820e at the ideal locations). The actual wheel displacement 830 and ideal wheel displacement 832 are shown in graph 812. This discrepancy results in a wheel displacement error shown in graph 814. The wheel displacement error signal 840 has several locations 840a, 840b, 840c, 840d, 840e, and 840f, where there is an error due to the output pulses 720a-720h not being equidistant in spacing.

Thus, in order to minimize processing errors, it is important for the measured and/or virtual magnetic field signals to have a predetermined phase separation with respect to each other. In some instances, the measured magnetic field signals will have a quadrature relationship and thus, the virtual magnetic field signals based on such quadrature signals will have the desired, predetermined phase separation with respect to the measured magnetic field signals and to each other.

Rather than relying on the measured magnetic field signals to have the desired quadrature relationship, according to a further aspect, virtual quadrature magnetic field signals (or simply referred to herein as "virtual quadrature signals") can be computationally generated to have a quadrature relationship with respect to at least one of the measured magnetic field signals, which measured magnetic field signals need not be in perfect quadrature. FIGS. 18-21 are associated with generating virtual quadrature magnetic field signals.

As another alternative to relying on the measured magnetic fields signals to have the desired quadrature relationship, according to a further aspect, generating virtual magnetic field signals can be based on the use of generalized coefficients. The resulting virtual magnetic field signals can be referred to as virtual arbitrary magnetic field signals or simply referred to herein as "virtual arbitrary signals" since these generated virtual signals need not have a quadrature relationship as will result from the process of FIG. 21 for example. Generation of such virtual arbitrary signals is described below in connection with FIGS. 22-23.

Figure 18:
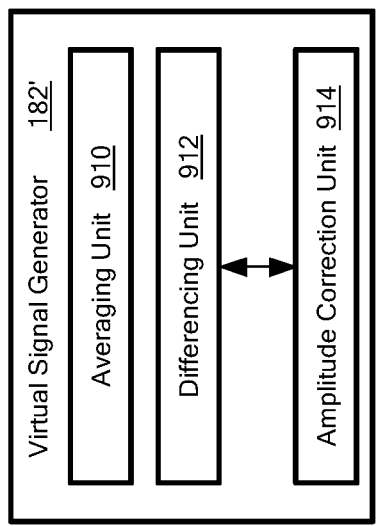
FIG. 18 is a diagram of an example virtual signal generator for generating virtual quadrature magnetic field signals, according to the disclosure.
Figure 19:
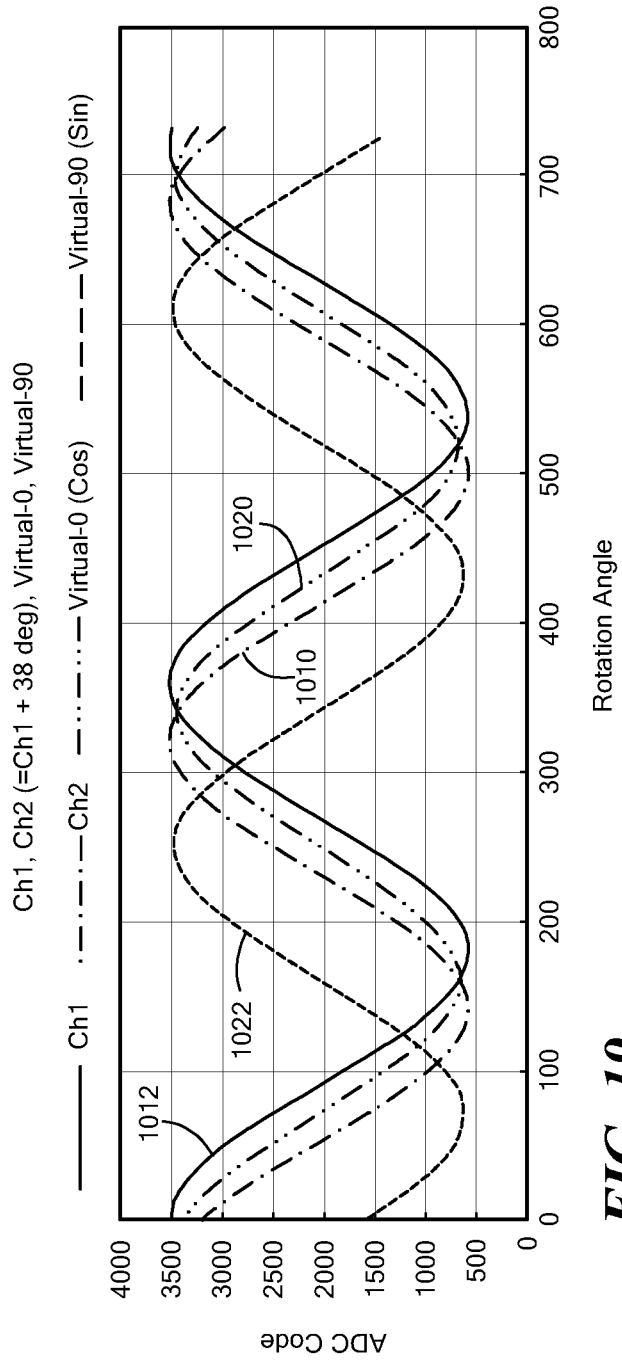
FIG. 19 shows example waveforms of measured magnetic field signals and two virtual quadrature magnetic field signals, according to the disclosure.

It may be desirable to generate virtual signals that are at a predetermined 90-degree phase difference with respect to each other, referred to herein as virtual quadrature signals. These virtual quadrature signals can be used in further processing of FIGS. 10-13. FIG. 18 is a diagram of an example virtual signal generator 182' for generating virtual quadrature signals, according to the disclosure. The virtual signal generator 182' can be the same as, or similar to, the virtual signal generator 182 shown in FIG. 10C, or the virtual signal generator 142 shown in FIG. 10B and can be configured to generate both virtual magnetic field signals (e.g., FIGS. 10-13) and the virtual quadrature signals (e.g., FIGS. 18-21). The virtual signal generator 182' is configured to use an averaging unit 910, a differencing unit 912, and an optional amplitude correction unit 914 to generate the virtual quadrature signals (refer, for example, to FIG. 19 showing example virtual quadrature signals 1020, 1022).

Virtual quadrature signals 1020, 1022 can be generated by calculating the average of two input signals (e.g., measured magnetic field signals 1010, 1012 of FIG. 19) to generate a 0-degree reference basis signal (the first virtual quadrature signal) and then calculating the difference of the two input signals to generate a 90-degree out-of-phase signal (the second virtual quadrature signal). The 90-degree out-of-phase signal can be amplitude-adjusted to match the 0-degree reference to provide consistent amplitudes between signals as will be explained. These virtual quadrature signals can further provide the starting point for generating other virtual signals in accordance with, for example, FIGS. 10-13.

When signals are generated by a sensor that has been implemented as an integrated circuit (IC), the position of the sensing elements is critical in performing processing of signals generated by the sensing elements. By mathematically generating virtual quadrature signals, the mechanical separation (and physical location) of the sensing elements in the IC does not have to be matched or otherwise tuned to the target being sensed, allowing for a single IC to be used with many different target geometries. The virtual quadrature signals provide optimal sensor outputs to be used for direction detection, accurate phase calculation, and further virtual signal generation.

The averaging unit 910 computes the average, Z, of the two measured magnetic field signals according to Equation 40:

$$Z = \frac{A+B}{2} \qquad \text{Equation 40}$$

where A is the measured magnetic field signal of the first channel and B is the measured magnetic field signal of the second channel. By adding the two measured magnetic field signals A and B together, and then dividing by two, the first virtual quadrature signal (at zero-degrees) is generated. For digital signals, dividing the signals by two essentially entails truncating the last bit of each digital signal and then adding the two signals. For analog signals, the values are added and divided by two to determine the average. This average provides the virtual 0-degree quadrature signal (the first virtual quadrature signal).

The differencing unit 912 computes the difference, V, of the two measured magnetic field signals according to Equation 41:

$$V = \{[(B-X)-(A-X)] \times K\} + X \qquad \text{Equation 41}$$

where A is the measured magnetic field signal of the first channel, B is the measured magnetic field signal of the second channel, X is the midpoint between the total number of possible codes, and K is an amplitude correction factor. The total number of possible "codes" refers to the maximum number of least significant bits (LSB) of an ADC of the sensor (e.g., ADC 176a, 176b in FIG. 10C, or 138a, 138b in FIG. 10B). When the values of the first channel A and the second channel B are digital values, calculating the difference requires elimination of the fixed offset that centers the signal inside the middle of the ADC range, and this center or "midpoint" needs to be considered. Thus, the midpoint 'X' is subtracted from each channel (B−X) for the second channel, and (A−X) for the first channel, and then the midpoint X is added back in after the value for each channel is multiplied by the amplitude correction factor K. Alternatively, if the values for each channel A and B are analog values, the values can simply be subtracted from each other and then multiplied by an amplitude correction factor K. Calculating the difference according to Equation 41 provides the virtual 90-degree out-of-phase quadrature signal (the second virtual quadrature signal).

FIG. 19 shows example waveforms of measured magnetic field signals 1010 and 1012 and two virtual quadrature magnetic field signals 1020 and 1022 that are generated according to the disclosure. The averaging unit 910 from FIG. 18 generates the first virtual 0-degree quadrature signal 1020 and the differencing unit 912 (with optional amplitude correction unit 914) generates the second virtual 90-degree quadrature signal 1022. Advantageously, the measured magnetic field signals 1010, 1012 can have any phase difference with respect to each other.

FIG. 20 shows an example waveform for an amplitude correction curve 1110 that can be used in generating virtual quadrature signals. In some instances when the measured magnetic field signals used to generate the virtual quadrature signals are not in perfect quadrature, the mathematical calculations used to generate the virtual quadrature signals may not result in signals that have the same amplitude. This can be accounted for through further processing that determines the signal amplitudes before generating switching thresholds, or it can be compensated for by applying an amplitude correction to the difference channel (the virtual 90-degree channel) for example using a curve, such as curve 1110.

The amplitude correction curve represents the ratio between the average signal and the difference signal and is used to ensure that the amplitude of both virtual quadrature signals is the same as (or substantially equal to) the amplitude of the measured magnetic field signals. In embodiments, the amplitude correction curve 1110 has a substantially exponential shape, as shown. Because of the exponential nature of the amplitude correction curve 1110, a mathematical correction can be complicated to perform with basic digital logic circuits. In embodiments, the correction curve 1110 can be approximated by linear segments A, B, C, D, and E that correspond to segments of the curve 1110. Thus, simpler binary multiplication can be performed to approximate the exponential curve, for example as shown in the Table 2 below:

TABLE 2

| Segment | A | B | C | D | E |
|---|---|---|---|---|---|
| Decimal Factor | 1.5 | 1.25 | 1 | 0.75 | 0.625 |
| Binary Equivalent | 1.100 | 1.010 | 1.000 | 0.110 | 0.101 |

Table 2 can be used as a look-up table for determining the appropriate binary equivalent for a decimal factor of the curve. The amplitude correction factor is variable K in Equation 41 above and used in calculating the 90-degree ("second") out-of-phase virtual quadrature signal.

If the amplitudes of the virtual signals start to deviate from each other, this can result in a loss in accuracy and the relationship can degrade, also increasing the amount of noise. By keeping the amplitude consistent using the amplitude correction factor, this allows for better direction determination and better accuracy in the switching locations. By generating two lines at the desired phase shift and maintaining as close to the original amplitude as possible, the virtual signals reduce errors and/or noise in the signal processing.

The amplitude correction factor can be programmed into the IC at the time of manufacture, based upon customer preferences given the known target-sensor relationship based on the known phase separation, or the sensor can detect the phase separation after manufacture and calculate the amplitude correction factor K during normal runtime operation of the magnetic field sensor. The amplitude correction factor is determined based upon an expected value of the phase difference between the at measured magnetic field signals as characterized at time of manufacture. The amplitude correction factor can be stored as a look-up table. The controller of the magnetic field sensor (e.g., controller 180 in FIG. 10C) can be configured to determine the phase difference between the two measured magnetic field signals and use the determined phase difference to select the amplitude correction factor.

FIG. 21 is a flow diagram illustrating a method of generating one or more virtual quadrature signals. At block 1210, the method starts by generating at least two measured magnetic field signals indicative of a magnetic field affected by an object. The at least two measured magnetic field signals have a phase difference with respect to each other. This phase difference may be known and/or provided by a customer or manufacturer (which may be referred to herein as predetermined) or may be unknown and determined by the magnetic field sensor (e.g., by controller 180) in accordance with the techniques of the present disclosure. The phase difference may, but need not be precisely 90-degrees.

The method continues to block 1220 by processing the at least two measured magnetic field signals to generate at least a first virtual quadrature signal and at least a second virtual quadrature signal. The first and second virtual quadrature signals have a predetermined phase difference with respect to each other, which for example can be 90-degrees to provide the quadrature virtual magnetic field signals. Processing the at least two measured magnetic field signals can include, at block 1222, averaging the first measured magnetic field signal and the second measured magnetic field signal (see, e.g., Equation 40 above) to generate the first virtual quadrature signal. Processing the at least two measured magnetic field signals can further include, at block 1224, determining the difference between the first measured magnetic field signal and the second measured magnetic field signal (see, e.g., Equation 41 above) to generate the second virtual quadrature signal. Processing the at least two measured magnetic field signals can further include (optionally) applying an amplitude correction factor to the second virtual quadrature signal, and the amplitude correction factor is based upon the phase difference between the at least two measured magnetic field signals. Refer, for example, to Equation 41 herein that utilizes the amplitude correction factor, K, in processing the two measured magnetic field signals. It will be appreciated that the amplitude correction factor processing is not always required and may be omitted in some implementations.

In accordance with the techniques described herein, at block 1230, the first virtual quadrature signal and the second virtual quadrature signal can be processed according to a mathematical function (e.g., Equation 39) that characterizes a relationship between the first and second virtual quadrature signals to generate at least one virtual magnetic field signal having a predetermined phase difference with respect to at least one of the first and second virtual quadrature signals. As such, the first and second virtual quadrature signals can be further processed to achieve any number of virtual magnetic field signals using these idealized virtual quadrature signals as a starting point, for example using the techniques from FIGS. 10-13.

In some instances, it may be desirable to generate virtual signals having any arbitrary phase difference with respect to each other (e.g., rather than having the quadrature phase difference that results from the process of FIG. 21 for example) and not being dependent on starting with measured magnetic field signals that are in perfect quadrature in order improve the accuracy of processing the virtual signals. It is desirable to have high accuracy and equidistant output signal pulse or transition spacing when performing, for example, wheel displacement calculations, or the error can be very large (refer, for example, to FIG. 17 showing a large error in wheel displacement).

FIG. 22 is a diagram of an example virtual signal generator 182" for generating virtual arbitrary signals, according to the disclosure. The virtual signal generator 182" can be the same as, or similar to, the virtual signal generator 182' shown in FIG. 18, the virtual signal generator 182 shown in FIG. 10C, or the virtual signal generator 142 shown in FIG. 5B and can be configured to generate each of the virtual magnetic field signals (e.g., FIGS. 10-13), the virtual quadrature signals (e.g., FIGS. 18-21-) and the virtual arbitrary signals (e.g., FIGS. -22-23). The virtual signal generator 182" uses a coefficient unit 1310 to generate virtual arbitrary magnetic field signals, also referred to herein more generally as virtual arbitrary signals. Any of the controllers 182, 182', or 182" can be used to generate each of the virtual signals shown and/or described herein.

The coefficient unit 1310 includes a coefficient generating unit 1312 for generating the coefficient when the coefficient is generated on-chip (i.e., within the controller of the magnetic field sensor) and a coefficient storing unit 1314 for storing the coefficient when the coefficients are generated both on-chip and off-chip (i.e., at time of manufacture). The techniques herein implement both on-chip and off-chip processing of the coefficients for the mathematical functions to calculate the virtual arbitrary signals. Meaning, the on-chip processing determines the phase difference and the coefficients on the magnetic field sensor chip (i.e., by controller 182, 182', or 182") and the off-chip processing determines the coefficients during the manufacture of the sensor and these values are stored and used later by the controller during operation of the sensor. It will be appreciated that when the phase difference between the two measured magnetic field signals is known, the coefficients can be calculated off-chip using this known phase difference (based on a shape of the object and an airgap between the magnetic field sensor and the object), and when the phase difference is not known, it can be determined on-chip and used to determine the coefficients on-chip as well. Because the air gap between the sensor and the target object is known, this provides the circumference of the target object that is presented to the magnetic field sensor, and the sensing elements have a known specific spacing, so the resulting phase shift can be calculated. Thus, by measuring the two channels, the phase difference can be calculated on-the-fly (on-chip) by the coefficient generation unit 1312.

The virtual signal generator 182" is responsive to the at least two measured magnetic field signals generated by the magnetic field sensing elements (e.g., 20a, 20b, 20c of FIG. 10, 20a', 20b' of FIG. 10A, 118a, 118b, 120 of FIG. 10B, 170a, 170b, 170c, of FIG. 10C) and is configured to generate at least one virtual magnetic field signal having a second predetermined phase difference with respect to at least one of the measured magnetic field signals. The second predetermined phase difference may be any arbitrary value. In some embodiments, the second predetermined phase difference depends upon the number of equidistant output pulses desired per cycle of the magnetic field signal. For example, Table 3 shows various embodiments where more than a single virtual channel is generated for a particular application, as well as the corresponding φi increment (the intended phase increment between each virtual channel).

TABLE 3

| Desired Number of Equidistant Output Commutations | Number of Virtual Channels Required | $\varphi_i$ Increment (°) | $\varphi_i$ Values (°) |
|---|---|---|---|
| 4 | 1 | 90 | −90 |
| 6 | 2 | 60 | −60, −120 |
| 8 | 3 | 45 | −45, −90, −135 |
| 10 | 4 | 36 | −36, −72, −108, −144 |
| 12 | 5 | 30 | −30, −60, −90, −120, −150 |

In general, each virtual channel allows for at least two additional output commutations in single threshold applications (e.g., the rising and falling portions of the sinusoidal magnetic field signal). The number of output commutations are shown as each output pulse (for example, refer to FIG. 14 showing output pulses 520a-520h, each equidistant in spacing). Accordingly, the number of output commutations ($N_{OC}$) is dependent upon the number of virtual channels ($N_{VC}$), as shown in Equation 42 below:

$$N_{OC}=2\times(N_{VC}+1) \quad \text{Equation 42}$$

Note that the virtual channel provides two output communications in a single threshold implementation ($2\times N_{VC}$), and the reference channel (the real channel) will provide two output commutations as well, thus providing $2*N_{VC}+2$ total number of channels, simplified into Equation 42 above. Note that there is a ratio between the number of virtual channels and the number of output commutations of two times the number of virtual channels plus one. Accordingly, when there are, for example, 10 equidistant output commutations desired, at least four virtual channels are required, and the increment for the phase is thus 36 degrees. More specifically, when taking 360, the total number of degrees, and dividing by 10, the number of output commutations, then one arrives at 36 which is phase increment φi per channel). Thus, each virtual channel must be separated by 36 degrees, and the resulting phase difference values for each virtual signal are 36-degrees, 72-degrees, 108-degrees, and 144-degrees. As shown in Table 3, the second predetermined phase difference of the virtual arbitrary signal generated from the first and second measured magnetic field signals can have a phase shift of (a) 90-degrees, or (b) 60-degrees and 120-degrees, or (c) 45-degrees, 90-degrees, and 135-degrees, or (d) 36-degrees, 72-degrees, 108-degrees, and 144-degrees, or (e) 30-degrees, 60-degrees, 90-degrees, 120-degrees, and 150-degrees. Other phase differences are possible as will be appreciated in light of the present disclosure.

FIG. 23 is a flow diagram illustrating a method of generating one or more virtual arbitrary signals, according to the disclosure. At block 1410, the method starts by generating at least two measured magnetic field signals indicative of a magnetic field affected by an object. The at least two measured magnetic field signals have a phase difference with respect to each other, which phase difference may, but need not be 90-degrees.

At block 1420, the measured magnetic field signals are processed to generate at least one virtual signal having a second phase shift with respect to at least one of the measured magnetic field signals. The second phase shift is predetermined to provide the virtual signal with an arbitrary phase shift relative to at least one of the measured magnetic field signals in order to achieve a desired number of output commutations (e.g., equidistant output pulses). At block 1422, a first coefficient is determined corresponding to a first channel, the first coefficient is based on the first phase difference and the second phase difference. At block 1424, a second coefficient is determined corresponding to a second channel, the second coefficient based on the first phase difference and the second phase difference. The first and second coefficient are then used at block 1430 to generate at least one virtual magnetic field signal using the first coefficient and the second coefficient. The measured magnetic field signals are processed according to the following mathematical formula(es) to achieve the desired number of arbitrary virtual channel(s) by generating the first coefficient and the second coefficient.

To generate one or more arbitrarily shifted phase signal virtual signals, the two measured magnetic field signals are processed (e.g., by controller 182, 182', or 182"). The two sinusoidal-shaped signals, or generally measured magnetic field signals, are denoted "L" and "R" in the following equations 43 and 44, and are arbitrarily shifted with respect to each other.

$$L=AL\cdot\cos(2\pi ft)+OL \quad \text{Equation 43}$$

$$R=AR\cdot\cos(2\eta ft+\phi P)+OR \quad \text{Equation 44}$$

The phase shift between L and R can be arbitrary (as long as it is non-zero) and is denoted as φP in the equations herein. In Equation 43 and Equation 44, $A_L$ and $O_L$ are the amplitude and offset of L, respectively, and likewise $A_R$ and $O_R$ are the amplitude and offset of R, respectively. An arbitrarily phase shifted virtual channel, $V_i$, could then be defined as in Equation 45:

$$Vi=Ai\cdot\cos(2\pi ft+\phi i)+Oi \quad \text{Equation 45}$$

where $A_i$, φi, and $O_i$ are the desired amplitude of the virtual signal, the desired phase shift relative to L, and the resultant offset, respectively. This virtual signal can be derived from L and R using Equation 46:

$$Vi=a_i\cdot L+b_i\cdot R \quad \text{Equation 46}$$

where $a_i$ and $b_i$ are two parameters which may be (referred to herein as "the first coefficient" and "the second coefficient" respectively), and depend upon $\phi P$, $A_i$, and $\phi i$. The first coefficient $a_i$ and the second coefficient $b_i$ and can be calculated using Equation 47 and Equation 48:

$$ai = \left(\frac{Ai}{AL}\right)\left[\cos(\phi i) - \left(\frac{\sin(\phi i)}{\tan(\phi P)}\right)\right] \quad \text{Equation 47}$$

$$bi = \left(\frac{Ai}{AR}\right)\left(\frac{\sin(\phi i)}{\sin(\phi P)}\right) \quad \text{Equation 48}$$

In the cases of L and R normalization or when the amplitudes of L, R, and the desired amplitude of $V_i$ are approximately equal, these equations simplify to Equation 49 and Equation 50:

$$ai = \cos(\phi i) - \left(\frac{\sin(\phi i)}{\tan(\phi P)}\right) \quad \text{Equation 49}$$

$$bi = \frac{\sin(\phi i)}{\sin(\phi P)} \quad \text{Equation 50}$$

Refer, for example, to FIG. 10 showing two measured magnetic field signals and two virtual signals, as well as equidistant output spacing. By calculating and solving for these coefficients, any number of arbitrary virtual signals can be generated in accordance with the present disclosure. Thus, the virtual channel V, can be derived from Equation 46 once the coefficients are solved for.

It will be appreciated that the measured magnetic field signals may or may not be used in the further processing, for example determining wheel displacement or other positional information. For example, both the measured magnetic field signals and the generated virtual signals may be used to determine position information, or position information may be determined using only the generated virtual signals. It will be appreciated that in applications in which the required number of virtual signals is an odd number, the measured channel output signals may not be used for target detection. In other words, if the number of virtual signals is such that their even phase separation within each 360° period would result in uneven phase separation with respect to the measured magnetic field signals, then only the virtual channel output signals may be used to control the target. For example, if the user programmed resolution and target are such as to require that five virtual magnetic field signals be generated at relative phases of 60° and 120°, then the measured magnetic field signals at approximately 0° and 90° can be ignored for target control purposes.

It will further be appreciated that although only a single threshold is used for the detectors (e.g., at a 50% midpoint between positive peak and negative peak values) that is applied to the magnetic field signal(s), multiple thresholds per signal may be implemented and may be selected to yield communication equidistance. Additional thresholds applied to the magnetic field signal(s) can improve accuracy of the magnetic field sensor.

In another aspect of the disclosure, real-time target speed and direction can be determined by observing the slope of an arctangent angle extraction signal and transmitting the speed and/or direction information. Arctangent angle extraction is discussed above in detail. In embodiments, speed and direction can be communicated as real values over a data link, in contrast to a rate of pulses/words as in conventional speed (and speed and direction) sensor devices.

As explained above, a normalized and zeroed reference channel can be defined as:

$$X_0 = \sin(2\pi f t) = \sin(\theta) \quad \text{Equation 51}$$

The normalized and zeroed virtual channel in quadrature can be defined (for and forward and reverse rotation) as follows:

$$X_1 = \sin(\theta \mp \pi/2) \quad \text{Equation 52}$$

where $$X_{1,FWD} = \sin(\theta - \pi/2) = -\cos(\theta) \quad \text{Equation 53}$$

$$X_{1,REV} = \sin(\theta + \pi/2) = \cos(\theta) \quad \text{Equation 54}$$

The virtual-tangent can then be defined (for forward and reverse rotation) as follows:

$$Y = \frac{X_0}{X_1} = \frac{\sin(\theta)}{\mp \cos(\theta)} = \mp \tan(\theta) \quad \text{Equation 55}$$

where $$Y_{FWD} = \frac{X_0}{X_{1,FWD}} = \frac{\sin(\theta)}{-\cos(\theta)} = -\tan(\theta) \quad \text{Equation 56}$$

$$Y_{REV} = \frac{X_0}{X_{1,REV}} = \frac{\sin(\theta)}{\cos(\theta)} = \tan(\theta) \quad \text{Equation 57}$$

In embodiments, the slope of the arctangent-virtual-tangent extraction can be defined (for forward and reverse rotation) as follows:

$$\frac{d}{dt}\text{atan}(Y_{FWD}) = -\frac{d}{dt}\theta = -2\pi f \quad \text{Equation 58}$$

$$\frac{d}{dt}\text{atan}(Y_{REV}) = -\frac{d}{dt}\theta = 2\pi f \quad \text{Equation 59}$$

Note that the frequency is related to the radial velocity of the target in RPM (revolutions per minute, as follows:

$$v_{RPM} = \frac{60 \cdot f}{N_{PP}} \quad \text{Equation 60}$$

where $N_{PP}$ refers to the number of pole pairs and f refers to frequency.

Therefore, speed and direction (+1 for forward rotation, −1 for reverse rotation) fall directly out of the slope of the arctangent-virtual-tangent extraction:

$$|v_{RPM}| = \left|\frac{d}{dt}\text{atan}(Y)\frac{60}{2\pi \cdot N_{PP}}\right| \quad \text{Equation 61}$$

and $$dir = -\text{sign}\left(\frac{d}{dt}\text{atan}(Y)\frac{60}{2\pi \cdot N_{PP}}\right) \quad \text{Equation 62}$$

These could also be provided as a single number and sign, as set forth below:

$$v_{RPM} = -\left(\frac{d}{dt}\text{atan}(Y)\frac{60}{2\pi \cdot N_{PP}}\right) \quad \text{Equation 63}$$

FIG. 24 shows example waveforms for normalized signals for a left channel 2400, a right channel 2402, and a first virtual channel 2404 over pole period number for forward target rotation. The direction, phase, and channel-to-channel are randomized for an example simulation. FIG. 25 shows an example arctan signal 2500 over pole-period number for the waveforms of FIG. 24. As defined above, the slope of the arctangent-virtual-tangent extraction 2500 corresponds to 2πf where frequency corresponds to radial velocity of the target in RPM.

Figure 26:
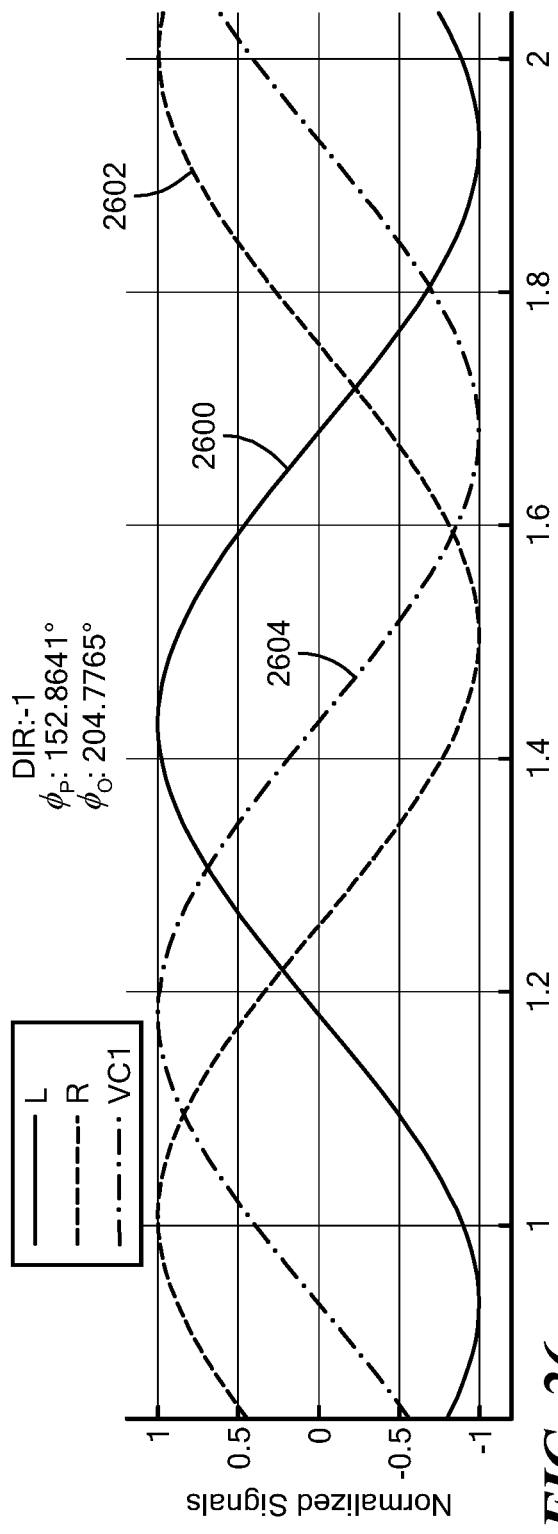
FIG. 26 shows example waveforms for a normalized signal for a left channel, a right channel, and a first virtual channel over pole period number for reverse target rotation.
Figure 27:
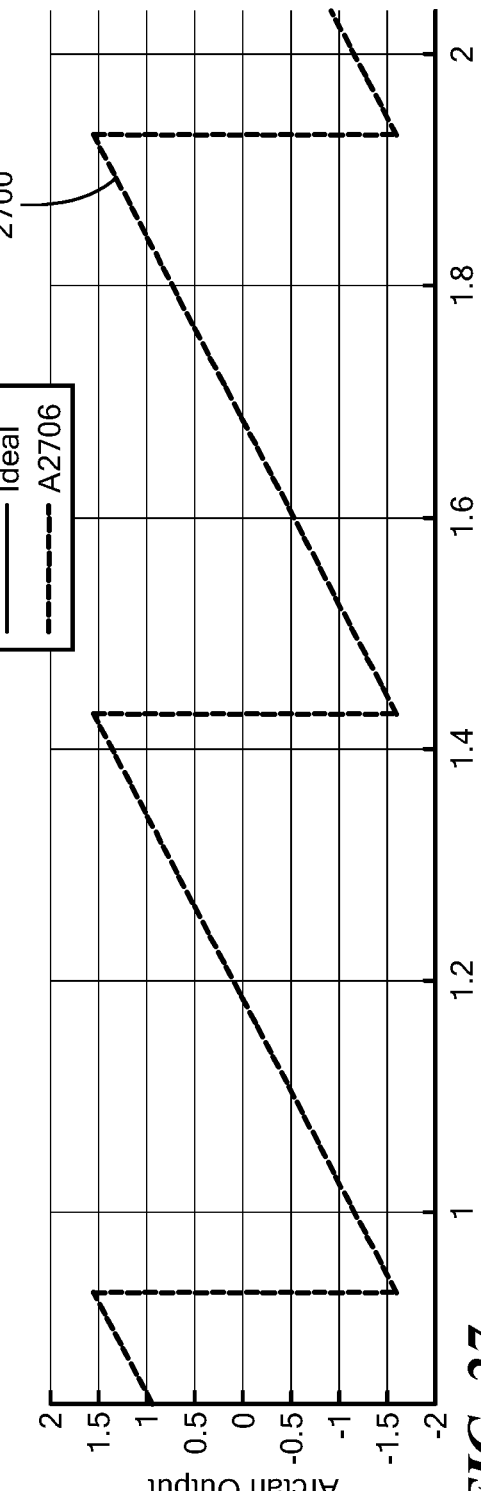
FIG. 27 shows an example arctan signal over pole-period number for the waveforms of FIG. 26.

FIG. 26 shows example waveforms for normalized signals for a left channel 2600, a right channel 2602, and a first virtual channel 2604 over pole period number for reverse target rotation. FIG. 27 shows an example arctan signal 2700 over pole-period number for the waveforms of FIG. 26.

Figure 28A:
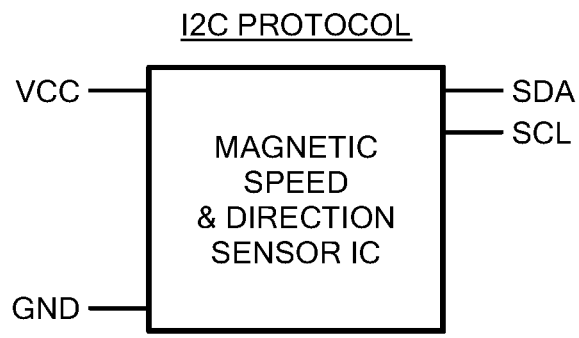
FIG. 28A shows an example sensor IC pinout having an I2C protocol.
Figure 28B:
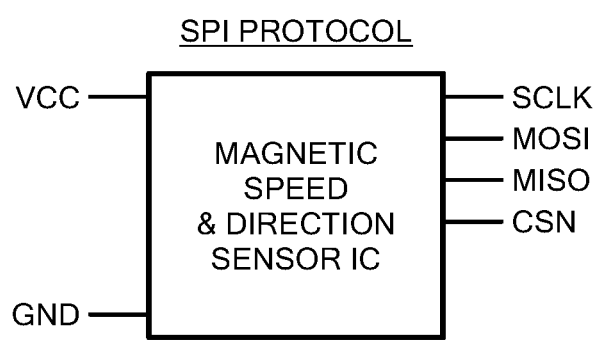
FIG. 28B shows an example sensor IC having an SPI protocol.

FIG. 28A shows an example sensor IC pinout having an I2C protocol including a serial data (SDA) line and serial clock SCL signal. FIG. 28B shows an example sensor IC having an SPI protocol including MOSI (Master Output/Slave Input) line for the master to send data to the slave, a MISO (Master Input/Slave Output) line for the slave to send data to the master, a SCLK (Clock) line for the clock signal, and a SS/CS (Slave Select/Chip Select) line for the master to select which slave to send data to.

It is understood that speed, direction and other information can be output using any suitable protocol and interconnection configuration to meet the needs of a particular application.

In addition, in embodiments, slope information can be used to identify vibration. Vibration can be considered a zero-speed phenomena. For example, when a vehicle is parked with the engine on the speed is zero. Any vehicle components that are monitored by speed sensors may be subject to vibration that may generate signals possibly seen as motion. By analyzing direction information, a sensor can discriminate between motion and vibration. In embodiments, direction information switching back and forth is indicative of vibration.

When the slope of the arctangent-virtual-tangent extraction is at zero, any crossing back and forth (e.g., positive and negative values for direction) about zero exceeding some predetermined threshold would indicate the presence of vibration. In embodiments, a counter can count the number of direction changes per unit of time. If the count for the unit of time is greater than a threshold, then a sensor determines that speed information is not valid since the signals are generated by vibration.

Figure 29:
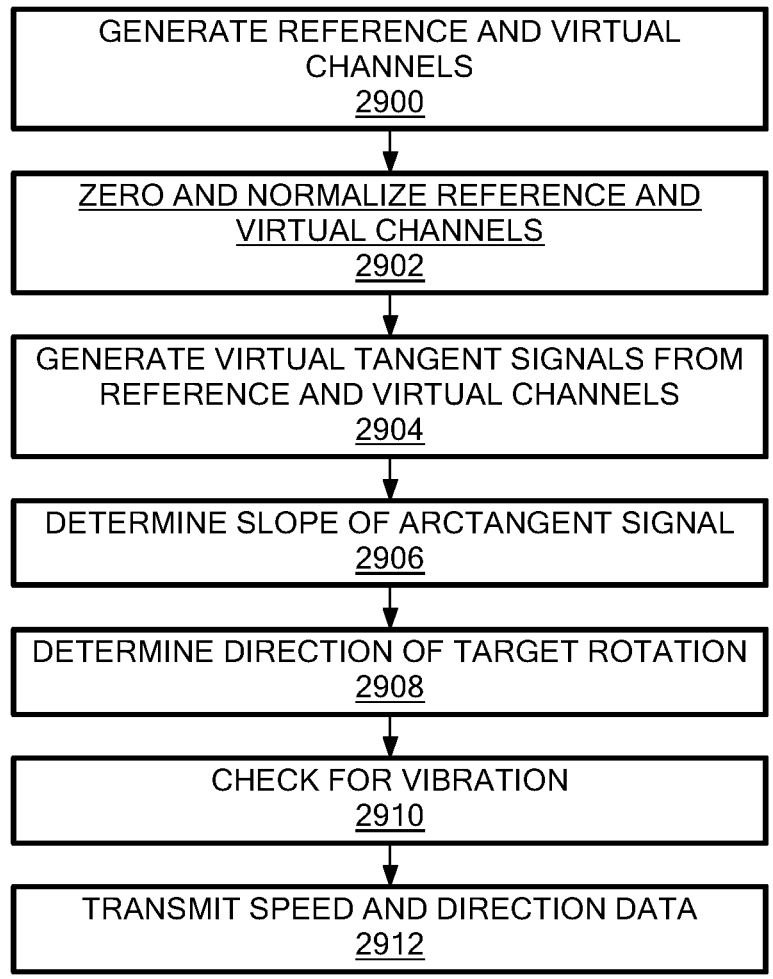
FIG. 29 shows an example sequence of steps for generating speed and/or direction information for a rotating target.

FIG. 29 shows an example sequence of steps for generating speed and direction information for a rotating target. In step 2900, a reference channel and a virtual channel are generated for a rotating target having a known diameter and pole-pair count. The reference and virtual channels are zeroed and normalized in step 2902. In step 2904, a virtual tangent signal is generated from the reference and virtual channel. In step 2906, a slope of the arctangent of the virtual tangent, which corresponds to speed in angular velocity is determined. In step 2908, a direction of rotation (forward or reverse) is determined. In step 2910, the slope information is analyzed to determination whether direction changes are indicative of vibration. In step 2912, speed and direction information is transmitted by the sensor over a data link.

It is understood that processing can be performed as described above using any practical implementation of software, hardware, firmware, and any combination thereof. Processing may be implemented in computer programs executed on programmable computers/machines that each includes a processor, a storage medium or other article of manufacture that is readable by the processor (including volatile and non-volatile memory and/or storage elements), at least one input device, and one or more output devices. Program code may be applied to data entered using an input device to perform processing and to generate output information.

The system can perform processing, at least in part, via a computer program product, (e.g., in a machine-readable storage device), for execution by, or to control the operation of, data processing apparatus (e.g., a programmable processor, a computer, or multiple computers). Each such program may be implemented in a high-level procedural or object-oriented programming language to communicate with a computer system. However, the programs may be implemented in assembly or machine language. The language may be a compiled or an interpreted language and it may be deployed in any form, including as a stand-alone program or as a module, component, subroutine, or other unit suitable for use in a computing environment. A computer program may be deployed to be executed on one computer or on multiple computers at one site or distributed across multiple sites and interconnected by a communication network. A computer program may be stored on a storage medium or device (e.g., RAM/ROM, CD-ROM, hard disk, or magnetic diskette) that is readable by a general or special purpose programmable computer for configuring and operating the computer when the storage medium or device is read by the computer.

Processing may also be implemented as a machine-readable storage medium, configured with a computer program, where upon execution, instructions in the computer program cause the computer to operate.

Processing may be performed by one or more programmable processors executing one or more computer programs to perform the functions of the system. All or part of the system may be implemented as, special purpose logic circuitry (e.g., an FPGA (field programmable gate array), a general purpose graphical processing units (GPGPU), and/or an ASIC (application-specific integrated circuit)).

All references cited herein are hereby incorporated herein by reference in their entirety. Having described preferred embodiments, it will now become apparent to one of ordinary skill in the art that other embodiments incorporating their concepts may be used. It is felt therefore that these embodiments should not be limited to disclosed embodiments, but rather should be limited only by the spirit and scope of the appended claims.

What is claimed is:
1. A method comprising:
  generating a reference channel signal for a target from at least one magnetic field sensing element;
  generating a virtual channel signal in quadrature with the reference channel signal;
  generating a tangent signal from the virtual channel signal;
  determining a slope of an arctangent of the tangent signal, wherein the slope of the arctangent of the tangent signal corresponds to rotational speed of the target; and
  transmitting the speed of the target.

2. The method according to claim 1, further including a determining whether rotation of the target is forward rotation or reverse rotation based on the slope of the arctangent of the tangent signal and transmitting the direction of target rotation information.

3. The method according to claim 1, wherein the slope of the arctangent corresponds to $2\pi f$, where f is a frequency that corresponds to a radial velocity of the target.

4. The method according to claim 1, wherein the target comprises a diameter and pole-pair count.

5. The method according to claim 1, further including a determining whether rotation of the target is forward rotation or reverse rotation based on the slope of the arctangent of the tangent signal.

6. The method according to claim 5, wherein determining the forward or reverse rotation of target comprises examining a sign of the slope of the arctangent of the tangent signal.

7. The method according to claim 1, further including determining whether vibration is present based on a number of sign changes over a selected amount of time in the slope of the arctangent of the tangent signal.

8. The method according to claim 7, further including transmitting information for the vibration.

9. A sensor, comprising:
a plurality of magnetic field sensing elements configured to generate a reference channel signal for a target from at least one magnetic field sensing element; and
a controller configured to:
generate a virtual channel signal in quadrature with the reference channel signal;
generate a tangent signal from the virtual channel signal;
determine a slope of an arctangent of the tangent signal, wherein the slope of the arctangent of the tangent signal corresponds to rotational speed of the target; and
transmit the speed of the target.

10. The sensor according to claim 9, wherein the controller is further configured to determining whether rotation of the target is forward rotation or reverse rotation based on the slope of the arctangent of the tangent signal and transmitting the direction of target rotation information.

11. The sensor according to claim 9, wherein the slope of the arctangent corresponds to $2\pi f$, where f is a frequency that corresponds to a radial velocity of the target.

12. The sensor according to claim 9, wherein the target comprises a diameter and pole-pair count.

13. The sensor according to claim 9, wherein the controller is further configured to determine whether rotation of the target is forward rotation or reverse rotation based on the slope of the arctangent of the tangent signal.

14. The sensor according to claim 13, wherein determining the forward or reverse rotation of target comprises examining a sign of the slope of the arctangent of the tangent signal.

15. The sensor according to claim 9, wherein the controller is further configured to determine whether vibration is present based on a number of sign changes over a selected amount of time in the slope of the arctangent of the tangent signal.

16. The sensor according to claim 15, wherein the sensor is configured to transmit information for the vibration.

* * * * *

UNITED STATES PATENT AND TRADEMARK OFFICE
CERTIFICATE OF CORRECTION

| | | |
|---|---|---|
| PATENT NO. | : 11,762,043 B2 | |
| APPLICATION NO. | : 17/653240 | |
| DATED | : September 19, 2023 | |
| INVENTOR(S) | : Zachary Richards | |

It is certified that error appears in the above-identified patent and that said Letters Patent is hereby corrected as shown below:

In the Specification

Column 34, Equation 44, delete the equation "$R = AR \cdot \cos(2\eta ft + \phi P) + OR$" and replace with the equation --$R = AR \cdot \cos(2\pi ft + \phi P) + OR$--.

Signed and Sealed this
Twentieth Day of August, 2024

Katherine Kelly Vidal
*Director of the United States Patent and Trademark Office*